(12) United States Patent
Abe et al.

(10) Patent No.: US 10,636,982 B2
(45) Date of Patent: Apr. 28, 2020

(54) IRIDIUM COMPLEX AND ORGANIC LIGHT-EMITTING DEVICE INCLUDING THE SAME

(71) Applicant: CANON KABUSHIKI KAISHA, Tokyo (JP)

(72) Inventors: Shigemoto Abe, Yokohama (JP); Jun Kamatani, Tokyo (JP); Kengo Kishino, Tokyo (JP); Akihito Saitoh, Gotemba (JP); Naoki Yamada, Inagi (JP); Tetsuya Kosuge, Yokohama (JP); Takayuki Horiuchi, Tokyo (JP); Yosuke Nishide, Kawasaki (JP); Hirokazu Miyashita, Tokyo (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 405 days.

(21) Appl. No.: 14/761,597

(22) PCT Filed: Jan. 20, 2014

(86) PCT No.: PCT/JP2014/000239
§ 371 (c)(1),
(2) Date: Jul. 16, 2015

(87) PCT Pub. No.: WO2014/115528
PCT Pub. Date: Jul. 31, 2014

(65) Prior Publication Data
US 2015/0364702 A1    Dec. 17, 2015

(30) Foreign Application Priority Data
Jan. 22, 2013   (JP) .................................. 2013-009524

(51) Int. Cl.
*H01L 51/00* (2006.01)
*C09K 11/06* (2006.01)
(Continued)

(52) U.S. Cl.
CPC ...... *H01L 51/0085* (2013.01); *C07F 15/0033* (2013.01); *C09K 11/06* (2013.01);
(Continued)

(58) Field of Classification Search
CPC combination set(s) only.
See application file for complete search history.

(56) References Cited

U.S. PATENT DOCUMENTS

2006/0280965 A1* 12/2006 Kwong .................. C07C 13/62
                                                         428/690
2009/0009065 A1*  1/2009 Nishimura ............. C09K 11/06
                                                         313/504
(Continued)

FOREIGN PATENT DOCUMENTS

JP     2006-128632 A      5/2006
JP     2007314512 A  * 12/2007
(Continued)

*Primary Examiner* — Jennifer A Chriss
*Assistant Examiner* — Sean M DeGuire
(74) *Attorney, Agent, or Firm* — Canon USA, Inc., IP Division

(57) ABSTRACT

The present invention provides a novel iridium complex and an organic light-emitting device including the novel iridium complex. The novel iridium complex includes three ligands, and two of them have a phenyl-naphtho[2,1-f]isoquinoline skeleton. The present invention also provides a display apparatus including the organic light-emitting device and an electrophotographic image-forming apparatus including a light source including the organic light-emitting device and including a photosensitive member.

14 Claims, 1 Drawing Sheet

(51) Int. Cl.
*H01L 51/50* (2006.01)
*C07F 15/00* (2006.01)
*H05B 33/14* (2006.01)
*G03G 15/04* (2006.01)
*H01L 27/32* (2006.01)

(52) U.S. Cl.
CPC ..... *G03G 15/04054* (2013.01); *H01L 27/322* (2013.01); *H01L 27/3244* (2013.01); *H01L 51/0052* (2013.01); *H01L 51/0054* (2013.01); *H01L 51/0055* (2013.01); *H01L 51/0058* (2013.01); *H01L 51/5004* (2013.01); *H05B 33/14* (2013.01); *C09K 2211/1007* (2013.01); *C09K 2211/1029* (2013.01); *C09K 2211/185* (2013.01); *H01L 51/006* (2013.01); *H01L 51/0056* (2013.01); *H01L 51/0057* (2013.01); *H01L 51/0059* (2013.01); *H01L 51/0061* (2013.01); *H01L 51/0072* (2013.01); *H01L 51/0073* (2013.01); *H01L 51/0074* (2013.01); *H01L 51/0081* (2013.01); *H01L 51/5016* (2013.01)

(56) References Cited

U.S. PATENT DOCUMENTS

2010/0219407 A1* 9/2010 Kamatani ............... C07C 17/14
257/40
2011/0175072 A1 7/2011 Ooishi

FOREIGN PATENT DOCUMENTS

| JP | 2009-114137 A | | 5/2009 |
| JP | 2011-151116 A | | 8/2011 |
| JP | 2011-249754 A | | 12/2011 |
| TW | 200911731 A | * | 3/2009 |
| WO | 2010/074181 A1 | | 7/2010 |
| WO | 2011/070990 A1 | | 6/2011 |

* cited by examiner

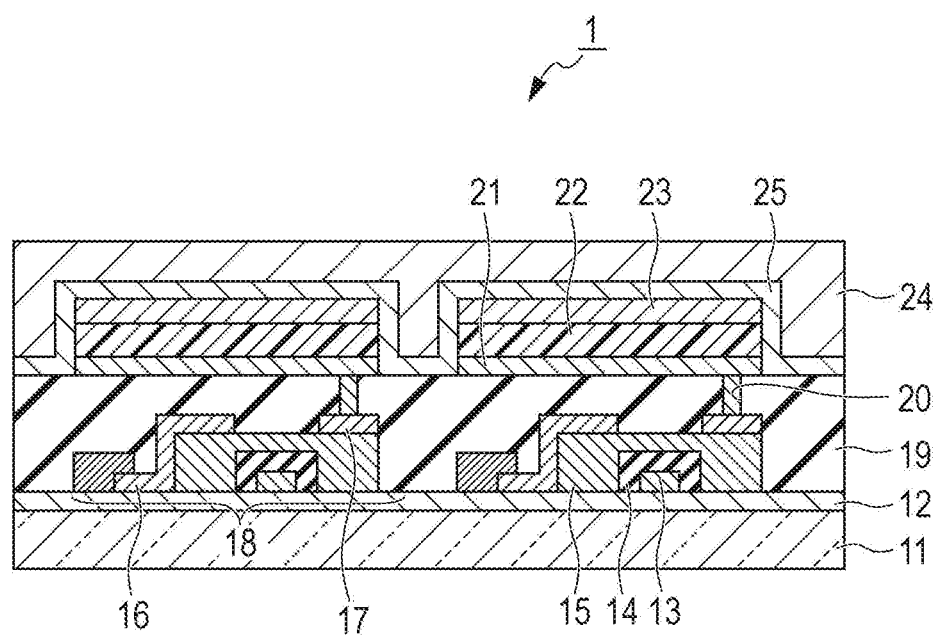

IRIDIUM COMPLEX AND ORGANIC LIGHT-EMITTING DEVICE INCLUDING THE SAME

TECHNICAL FIELD

The present invention relates to a novel iridium complex and an organic light-emitting device including the novel iridium complex. Specifically, the present invention relates to a novel iridium complex including a ligand having a naphtho[2,1-f]isoquinoline skeleton and another ligand having a different skeleton, that is, a novel iridium complex including heteroligand species and to an organic light-emitting device including the novel iridium complex.

BACKGROUND ART

An organic light-emitting device includes an anode, a cathode, and an organic-compound layer interposed between the two electrodes. An organic light-emitting device is also referred to as organic electroluminescent (EL) device. In an organic light-emitting device, excitons are generated by the recombination of positive holes (holes) and electrons injected from the respective electrodes in the organic-compound layer, and the excitons emit light upon transition to the ground state. There have recently been remarkable advances in organic light-emitting devices. Thus, thin, light-weight light-emitting devices having a low drive voltage, various emission wavelengths, and fast responsibility are available.

Among the organic light-emitting devices, a phosphorescent light-emitting device includes a phosphorescent light-emitting material in the organic-compound layer and emits light caused by triplet excitons. There is still room for improvements of the luminous efficiency and the operating life of phosphorescent light-emitting devices. Thus, improvement of the emission quantum yield of phosphorescent light-emitting materials and suppression of degradation of the structure of the molecule of a host material of the light-emitting layer have been anticipated.

An example of an iridium complex used as a light-emitting material of a phosphorescent light-emitting device, which includes a luminescent ligand having a naphtho[2,1-f]isoquinoline skeleton, is Compound E2 below disclosed in PTL 1. An example of another iridium complex including a luminescent ligand, which has a skeleton having one ring less than a naphtho[2,1-f]isoquinoline skeleton, and an auxiliary ligand is Compound A30 below disclosed in PTL 1.

[Chem. 1]

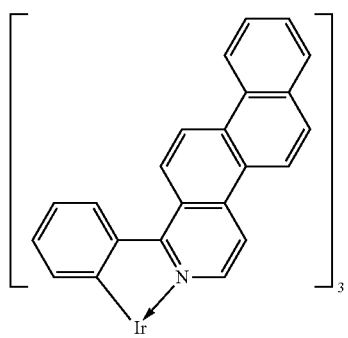

E2

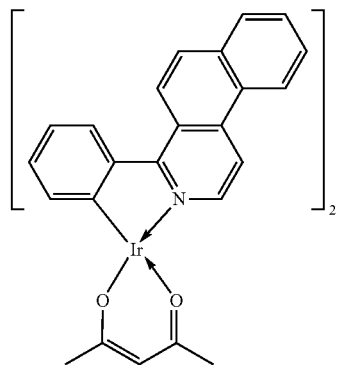

A30

CITATION LIST

Patent Literature

PTL 1: Japanese Patent Laid-Open No. 2009-114137

SUMMARY OF INVENTION

The present invention provides an iridium complex represented by Formula [1] below.
[Chem.2]

$$IrL_mL'_n \qquad [1]$$

In Formula [1], Ir represents iridium, L and L' each represent a different bidentate ligand, at least one of L and L' including an alkyl group, m is 2, and n is 1.

$IrL_m$ is represented by Formula [2] below.

[Chem. 3]

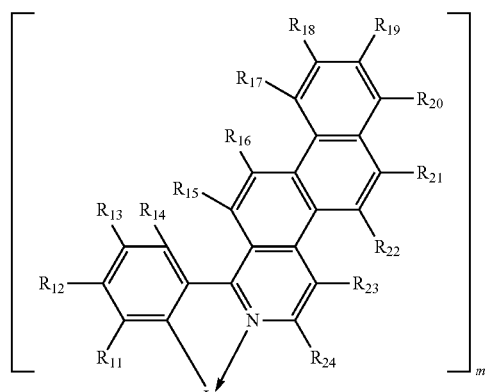

In Formula [2], $R_{11}$ to $R_{14}$ are each independently selected from a hydrogen atom, a fluorine atom, a substituted or unsubstituted alkyl group, an alkoxy group, a substituted amino group, a substituted or unsubstituted aryl group, and a substituted or unsubstituted heterocyclic group and $R_{15}$ to $R_{24}$ are each independently selected from a hydrogen atom, a fluorine atom, a substituted or unsubstituted alkyl group, an alkoxy group, and a substituted amino group. In Formula [1], $L'_n$ is a monovalent bidentate ligand.

Further features of the present invention will become apparent from the following description of exemplary embodiments with reference to the attached drawing.

BRIEF DESCRIPTION OF DRAWINGS

The FIGURE is a schematic cross-sectional view illustrating an organic light-emitting device and a switching device connected to the organic light-emitting device.

DESCRIPTION OF EMBODIMENT

The present invention provides a novel iridium complex that has an emission wavelength suitable for an organic light-emitting device and a high luminous efficiency and that is easy to handle. The present invention also provides an organic light-emitting device including the novel iridium complex which has a high efficiency and improved drive durability.

The iridium complex according to the present invention will be described in detail.

The iridium complex according to the present invention includes a ligand having a naphtho[2,1-f]isoquinoline skeleton. Specifically, the iridium complex according to the present invention may be represented by Formula [1] below.

[Chem.4]

$$IrL_mL'_n \qquad [1]$$

In Formula [1], Ir represents iridium, L and L' each represent a different bidentate ligand, at least one of L and L' including an alkyl group, m is 2, and n is 1.

$IrL_m$ is represented by Formula [2] below.

[Chem. 5]

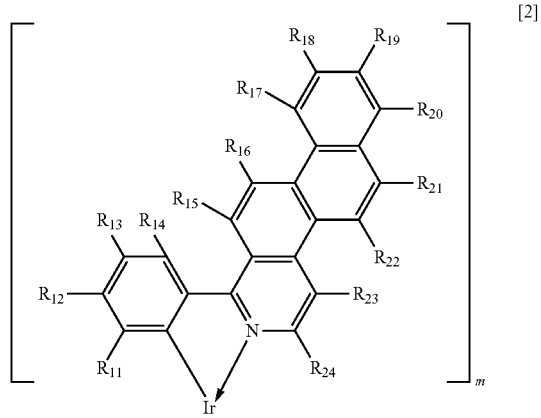

In Formula [2], $R_{11}$ to $R_{14}$ are each independently selected from a hydrogen atom, a fluorine atom, a substituted or unsubstituted alkyl group, an alkoxy group, a substituted amino group, a substituted or unsubstituted aryl group, and a substituted or unsubstituted heterocyclic group and $R_{15}$ to $R_{24}$ are each independently selected from a hydrogen atom, a fluorine atom, a substituted or unsubstituted alkyl group, an alkoxy group, and a substituted amino group. In Formula [1], $L'_n$ is a monovalent bidentate ligand.

Thus, the iridium complex includes a ligand having a skeleton that is 1-phenylnaphtho[2,1-f]isoquinoline (hereafter, abbreviated as "niq") as shown in Formula [2]. The niq-based iridium complex (Ir complex) includes an alkyl group as a substituent.

This iridium complex emits red light.

The iridium complex according to the present invention includes bidentate ligands L and L' that are different from each other. Hereinafter, such ligands are referred to as "heteroligand species".

$R_{11}$ to $R_{24}$ in Formula [2] are described below.

When at least one of $R_{11}$ to $R_{24}$ is an alkyl group, the alkyl group is preferably an alkyl group having a carbon number of 1 to 10 and more preferably an alkyl group having a carbon number of 1 to 6. Specific examples of the alkyl group having a carbon number of 1 to 6 include a methyl group, an ethyl group, an n-propyl group, an i-propyl group, an n-butyl group, an i-butyl group, a sec-butyl group, a tert-butyl group, an n-pentyl group, an i-pentyl group, a tert-pentyl group, a neopentyl group, an n-hexyl group, and a cyclohexyl group. In particular, a methyl group and a tert-butyl group are further preferable.

When at least one of $R_{11}$ to $R_{24}$ is an alkoxy group, specific examples of the alkoxy group include a methoxy group, an ethoxy group, an i-propoxy group, an n-butoxy group, and a tert-butoxy group. In particular, a methoxy group is preferable.

When at least one of $R_{11}$ to $R_{24}$ is a substituted amino group, specific examples of the substituted amino group include an N-methylamino group, an N-ethylamino group, an N,N-dimethylamino group, an N,N-diethylamino group, an N-methyl-N-ethylamino group, an N-benzylamino group, an N-methyl-N-benzylamino group, an N,N-dibenzylamino group, an anilino group, an N,N-diphenylamino group, an N,N-dinaphthylamino group, an N,N-difluorenylamino group, an N-phenyl-N-tolylamino group, an N,N-ditolylamino group, an N-methyl-N-phenylamino group, an N,N-dianisolylamino group, an N-mesityl-N-phenylamino group, an N,N-dimesitylamino group, an N-phenyl-N-(4-tertiary-butylphenyl)amino group, and an N-phenyl-N-(4-trifluoromethylphenyl)amino group. In particular, an N,N-dimethylamino group and an N,N-diphenylamino group are preferable.

When at least one of $R_{11}$ to $R_{14}$ is an aryl group, specific examples of the aryl group include a phenyl group, a naphthyl group, a phenanthryl group, an anthryl group, a fluorenyl group, a biphenylenyl group, an acenaphthylenyl group, a chrysenyl group, a pyrenyl group, a triphenylenyl group, a picenyl group, a fluoranthenyl group, a perylenyl group, a naphthacenyl group, a biphenyl group, and a terphenyl group. In particular, a phenyl group, a naphthyl group, a fluorenyl group, and a biphenyl group are preferable, and a phenyl group is more preferable.

When at least one of $R_{11}$ to $R_{14}$ is a heterocyclic group, specific examples of the heterocyclic group include a thienyl group, a pyrrolyl group, a pyrazinyl group, a pyridyl group, an indolyl group, a quinolyl group, an isoquinolyl group, a naphthyridinyl group, an acridinyl group, a phenanthrolinyl group, a carbazolyl group, a benzo[a]carbazolyl group, a benzo[b]carbazolyl group, a benzo[c]carbazolyl group, a phenazinyl group, a phenoxadinyl group, a phenothiazinyl group, a benzothiophenyl group, a dibenzothiophenyl group, a benzofuranyl group, a dibenzofuranyl group, an oxazolyl group, and an oxadiazolyl group.

An aryl group or a heterocyclic group that is at least one of $R_{11}$ to $R_{14}$ may optionally have a substituent. Examples of the substituent include, but are not limited to, an alkyl group, an alkoxy group, a substituted amino group, a cyano group, a trifluoromethyl group, an aryl group, and a heterocyclic group.

When the optional substituent is an alkyl group, specific examples of the alkyl group are the same as the specific examples of the alkyl group that may be used as $R_{11}$ to $R_{24}$ described above. An alkyl group having a carbon number of 1 to 10 is preferable. An alkyl group having a carbon number of 1 to 6 is more preferable. A methyl group and a tert-butyl group are further preferable. When the optional substituent is an alkoxy group, specific examples of the alkoxy group are the same as the specific examples of the alkoxy group that may be used as $R_{11}$ to $R_{24}$ described above. A methoxy group is preferable. When the optional substituent is a substituted amino group, specific examples of the substituted amino group are the same as the specific examples of the substituted amino group that may be used as $R_{11}$ to $R_{24}$ described above. An N,N-dimethylamino group and an N,N-diphenylamino group are preferable. When the optional substituent is an aryl group, specific examples of the aryl group are the same as the specific examples of the aryl group that may be used as $R_{11}$ to $R_{14}$ described above. A phenyl group, a naphthyl group, a fluorenyl group, and a biphenyl group are preferable, and a phenyl group is more preferable. When the optional substituent is a heterocyclic group, specific examples of the heterocyclic group are the same as the specific examples of the heterocyclic group that may be used as $R_{11}$ to $R_{14}$ described above.

Next, L' is described. The partial structure $IrL'_n$ includes a monovalent bidentate ligand (L'). Examples of L' include acetylacetone, phenylpyridine, picolinic acid, an oxalate, and salen.

Specifically, $IrL'_n$ is represented by any one of Formulae [3] to [5] and more preferably by Formula [3].

[Chem. 6]

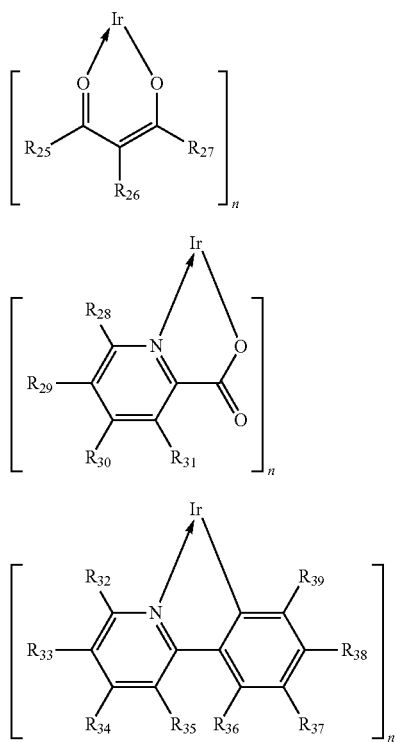

[3]

[4]

[5]

In Formulae [3] to [5], $R_{25}$ to $R_{39}$ are each independently selected from a hydrogen atom, an alkyl group, an alkoxy group, a substituted amino group, a substituted or unsubstituted aryl group, and a substituted or unsubstituted heterocyclic group.

When at least one of $R_{25}$ to $R_{39}$ is an alkyl group, specific examples of the alkyl group are the same as the specific examples of the alkyl group that may be used as $R_{11}$ to $R_{24}$ described above. An alkyl group having a carbon number of 1 to 10 is preferable. An alkyl group having a carbon number of 1 to 6 is more preferable. A methyl group or a tert-butyl group are further preferable.

When at least one of $R_{25}$ to $R_{39}$ is an alkoxy group, specific examples of the alkoxy group are the same as the specific examples of the alkoxy group that may be used as $R_{11}$ to $R_{24}$ described above. A methoxy group is preferable.

When at least one of $R_{25}$ to $R_{39}$ is a substituted amino group, specific examples of the substituted amino group are the same as the specific examples of the substituted amino group that may be used as $R_{11}$ to $R_{24}$ described above. In particular, an N,N-dimethylamino group and an N,N-diphenylamino group are preferable.

When at least one of $R_{25}$ to $R_{39}$ is an aryl group, specific examples of the aryl group are the same as the specific examples of the aryl group that may be used as $R_{11}$ to $R_{14}$ described above. A phenyl group, a naphthyl group, a fluorenyl group, and a biphenyl group are preferable, and a phenyl group is more preferable.

When at least one of $R_{25}$ to $R_{39}$ is a heterocyclic group, specific examples of the heterocyclic group are the same as the specific examples of the heterocyclic group that may be used as $R_{11}$ to $R_{14}$ described above.

An aryl group or a heterocyclic group that is at least one of $R_{25}$ to $R_{39}$ may optionally have a substituent. Examples of the substituent include, but are not limited to, an alkyl group, an alkoxy group, a substituted amino group, a cyano group, a trifluoromethyl group, an aryl group, and a heterocyclic group.

When the optional substituent is an alkyl group, specific examples of the alkyl group are the same as the specific examples of the alkyl group that may be used as $R_{11}$ to $R_{39}$ described above. An alkyl group having a carbon number of 1 to 10 is preferable, an alkyl group having a carbon number of 1 to 6 is more preferable, and a methyl group and a tert-butyl group are further preferable. When the optional substituent is an alkoxy group, specific examples of the alkoxy group are the same as the specific examples of the alkoxy group that may be used as $R_{11}$ to $R_{39}$ described above. A methoxy group is preferable. When the optional substituent is a substituted amino group, specific examples of the substituted amino group are the same as the specific examples of the substituted amino group that may be used as $R_{11}$ to $R_{39}$ described above. An N,N-dimethylamino group and an N,N-diphenylamino group are preferable. When the optional substituent is an aryl group, specific examples of the aryl group are the same as the specific examples of the aryl group that may be used as $R_{11}$ to $R_{14}$ described above. A phenyl group, a naphthyl group, a fluorenyl group, and a biphenyl group are preferable, and a phenyl group is more preferable. When the optional substituent is a heterocyclic group, specific examples of the heterocyclic group are the same as the specific examples of the heterocyclic group that may be used as $R_{11}$ to $R_{14}$ described above.

Method for Synthesizing the Iridium Complex According to the Present Invention

Next, a method for synthesizing the iridium complex represented by Formula [1] according to an embodiment of the present invention is described.

(I) Synthesis of an organic compound serving as a ligand
(II) Synthesis of an organometallic complex An organic compound serving as a ligand may be synthesized by, for example, Synthetic Route 1 or 2 below.

Synthetic Route 1

[Chem.7]

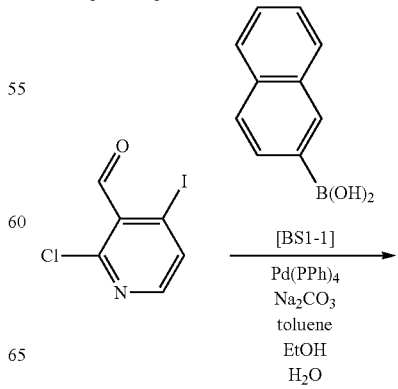

[BS1-1]
Pd(PPh$_3$)$_4$
Na$_2$CO$_3$
toluene
EtOH
H$_2$O

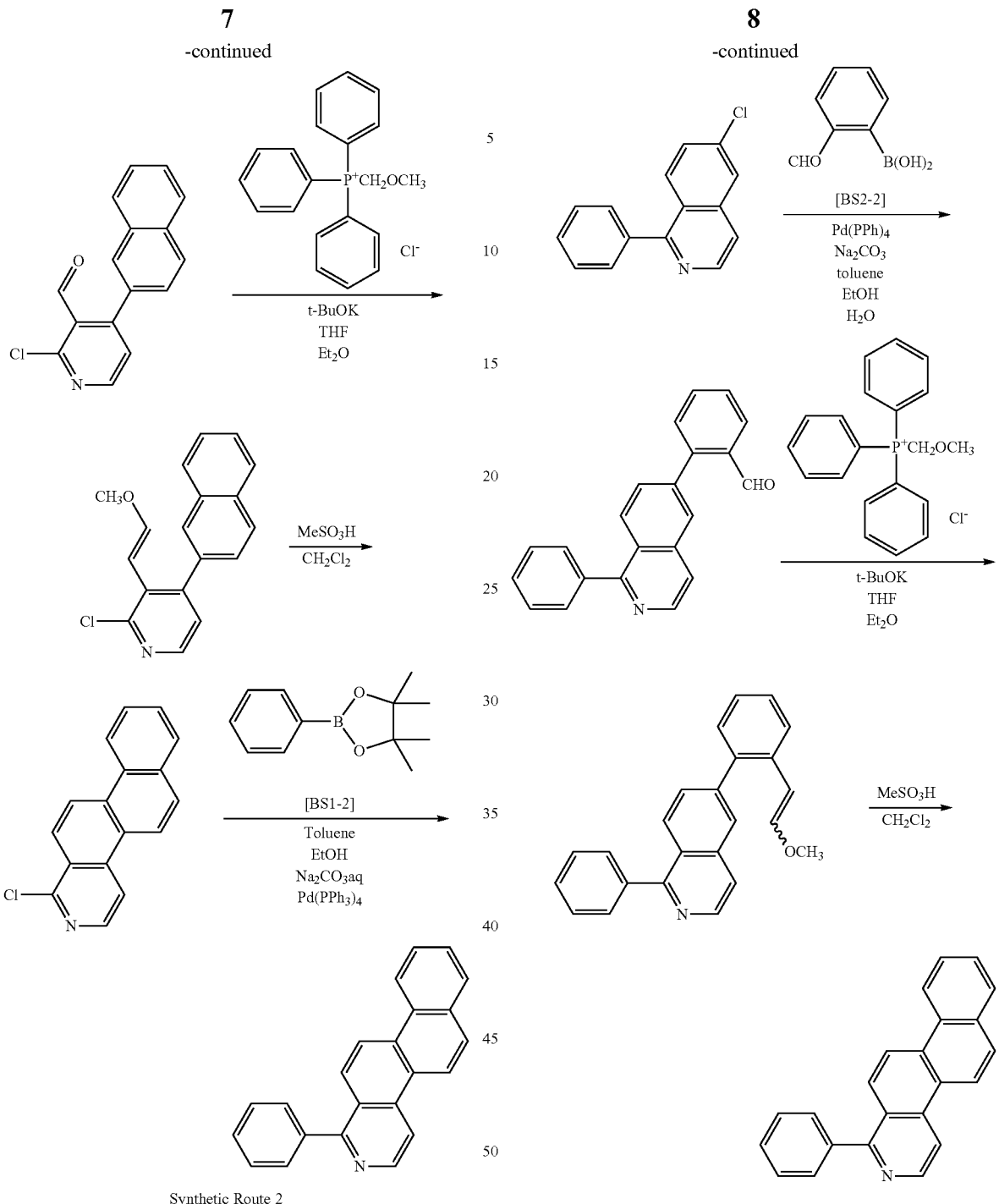

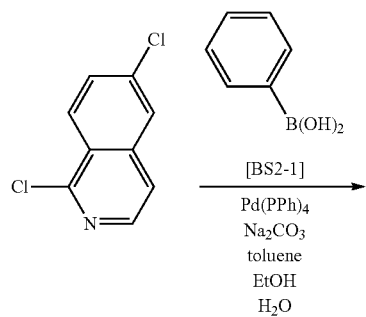

In Synthetic Routes 1 and 2, the boronic acid compound used for coupling is not limited to Compounds BS1-1, BS1-2, BS2-1, and BS2-2 shown in Synthetic Routes 1 and 2. In Synthetic Route 1, various types of ligand can be produced by changing Compound BS1-1 or BS1-2, which is a boronic acid compound.

In Synthetic Route 2, various ligands can be produced by changing Compound BS2-1 or BS2-2, which is a boronic acid compound.

An iridium complex can be produced by Synthetic Route 3.

Synthetic Route 3

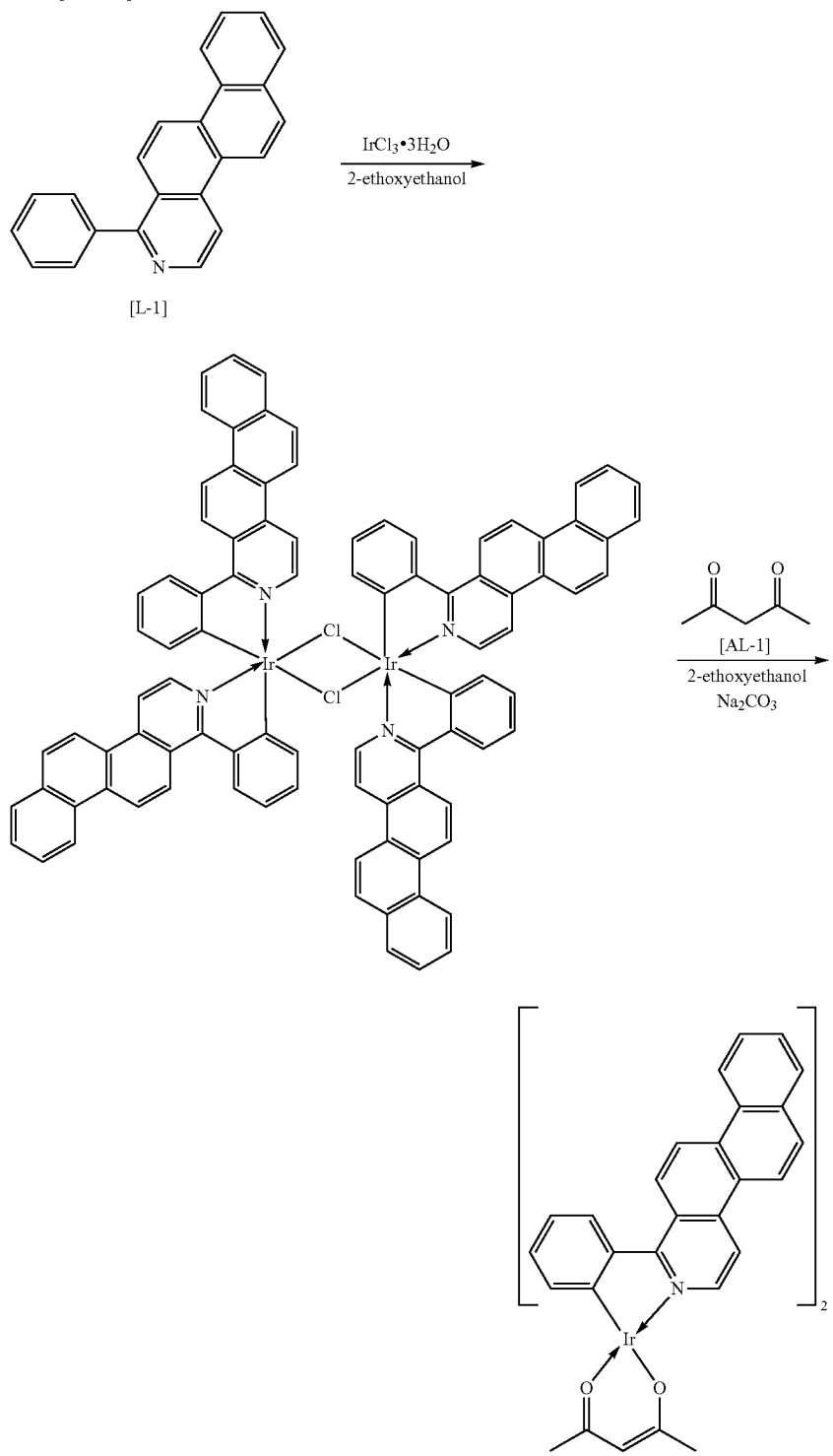

An organometallic complex including two or more types of ligand can be synthesized by Synthetic Route 3. In Synthetic Route 3, various types of complex can be synthesized by changing Compound L-1, which is a luminescent ligand, or Compound AL-1, which is an auxiliary ligand. For example, when Compound AL-1 is changed to a pyridylpyridine derivative, 2-ethoxyethanol and sodium carbonate shown in Synthetic Route 3 above may be changed to ethanol and silver trifluoromethane-sulfonate.

When the organic compound according to the present invention is used for producing an organic light-emitting device, the organic compound may be purified by sublimation immediately before being used for producing the organic light-emitting device. Sublimation purification has a large purification effect and therefore the purity of the organic compound can be markedly increased by the sublimation purification. However, the larger the molecular weight of the organic compound is, the higher the temperature that sublimation purification requires. An elevated temperature may cause pyrolysis of the organic compound. Thus, the molecular weight of the organic compound used for producing an organic light-emitting device is preferably 1,200 or less and more preferably 1,100 in order to perform sublimation purification without excessive heating.

[Properties of the Iridium Complex According to the Present Invention Including a Ligand Having a Naphtho[2,1-f]Isoquinoline Skeleton]

The purity of the iridium complex according to the present invention including a ligand having a naphtho[2,1-f]isoquinoline skeleton can be increased because the iridium complex according to the present invention is a heteroleptic complex and has one or more alkyl groups serving as steric-hindrance groups. The iridium complex according to the present invention is soluble in an organic solvent since having an alkyl group, which allows the iridium compound to be highly purified by column chromatography, recrystallization, or the like. The iridium complex according to the present invention sublimes without decomposition since it is a compound having low symmetry and includes a steric-hindrance group, which allows the iridium complex to be even more highly purified. Therefore, the resulting organic light-emitting device does not contain an impurity.

Examples of an alkyl group that causes steric hindrance include a methyl group and a tertiary-butyl group. These alkyl groups thereby have an effect of preventing luminescent ligands from coming close to one another. Introduction of a substituent having such an effect allows light emission without a reduction in luminous efficiency even when high-concentration doping, e.g., 5% by weight or more of a matrix, is performed.

The term "red light" herein refers to light having a peak emission wavelength of 580 to 650 nm. Light having a peak emission wavelength of 610 to 630 nm is more preferable as red light. The iridium complex according to the present invention includes a luminescent ligand having a naphtho[2,1-f]isoquinoline skeleton, which increases the dipole moment of the iridium complex in the excited state and accordingly increases oscillator strength. Thus, the iridium complex according to the present invention has a high photoluminescence (PL) quantum yield comparable to that of Compound A30 disclosed in PTL 1, which is an iridium complex including a luminescent ligand that is 4-phenyl-benzo[f]isoquinoline. The iridium complex according to the present invention has a peak emission wavelength of 610 to 630 nm, which is a good red region, because it includes a luminescent ligand having a naphtho[2,1-f]isoquinoline skeleton. Thus, the iridium complex according to the present invention may be suitably used as a light-emitting material of an RGB organic EL display.

<Examples of the Iridium Complex According to the Present Invention>

Specific structural formulae of the iridium complex according to the present invention are shown below.

[Chem.10]

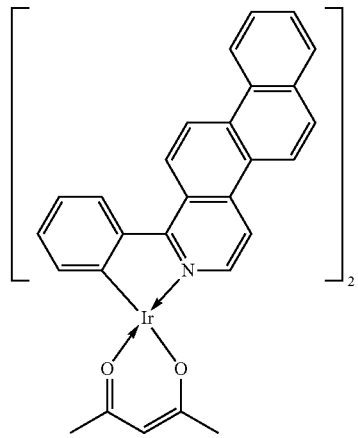

KK-01

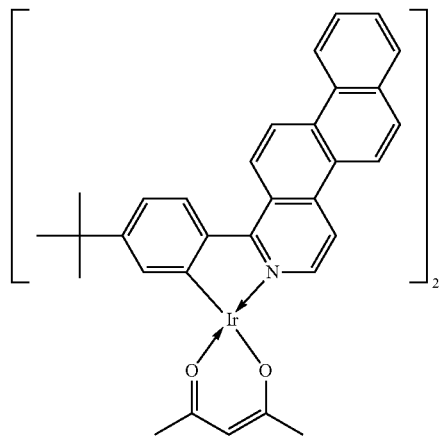

KK-02

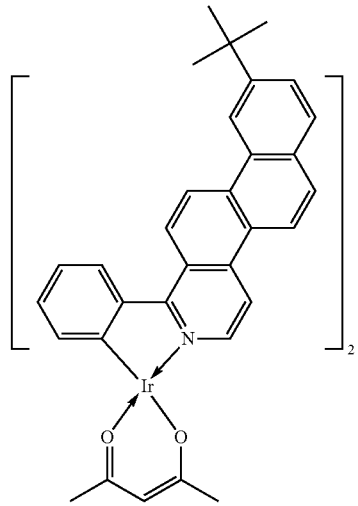

KK-03

KK-04
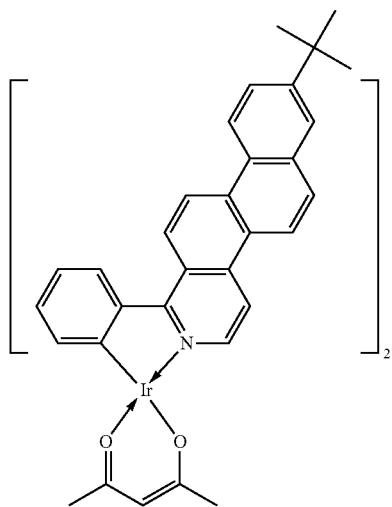
KK-05
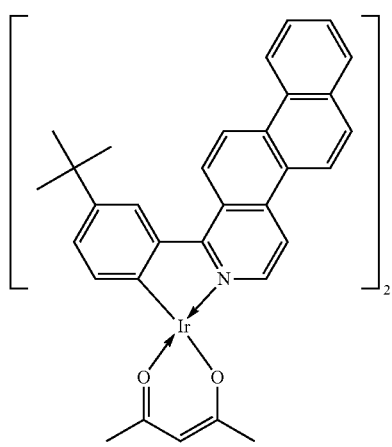
KK-06
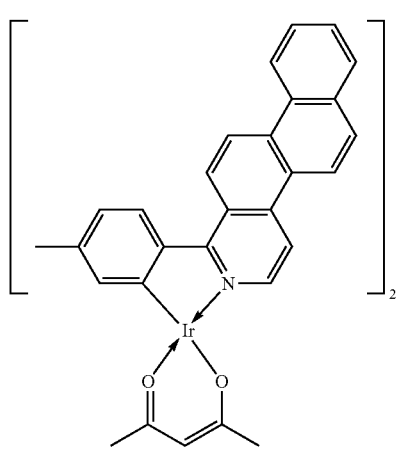
KK-07
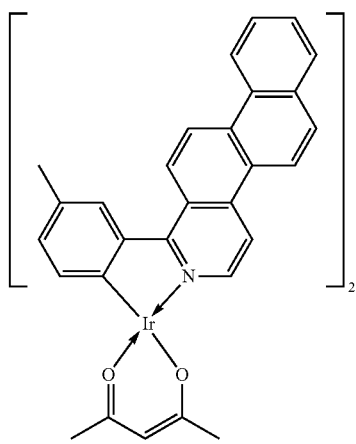
KK-08
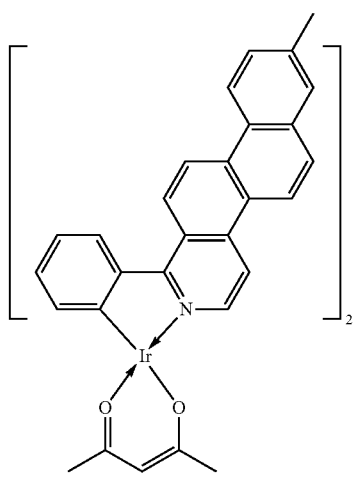
KK-09
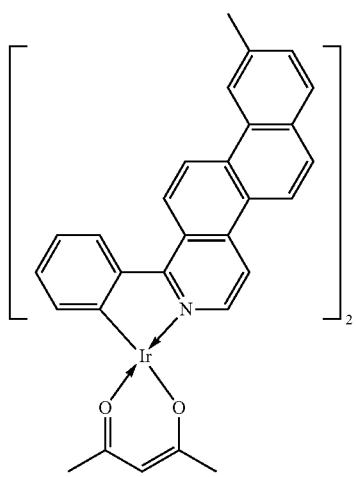

[Chem.11]
KK-10
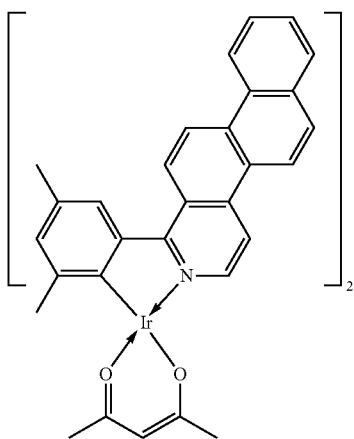
KK-13
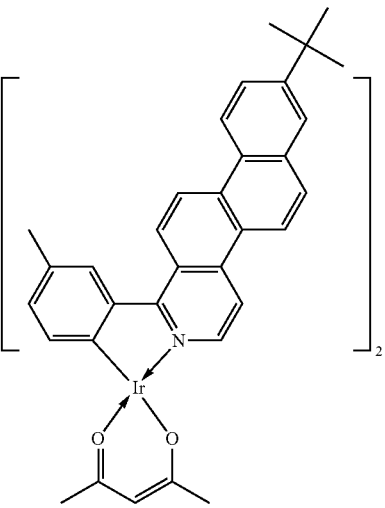
KK-11
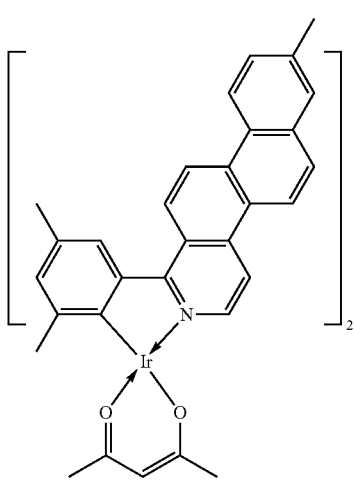
KK-14
KK-12
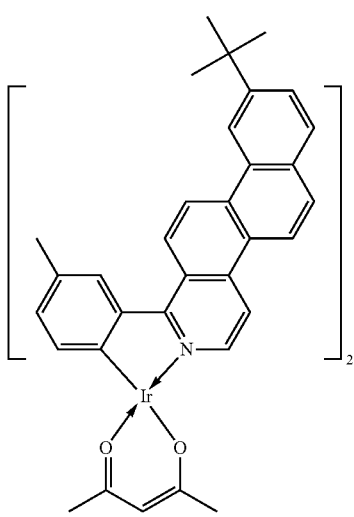
KK-15
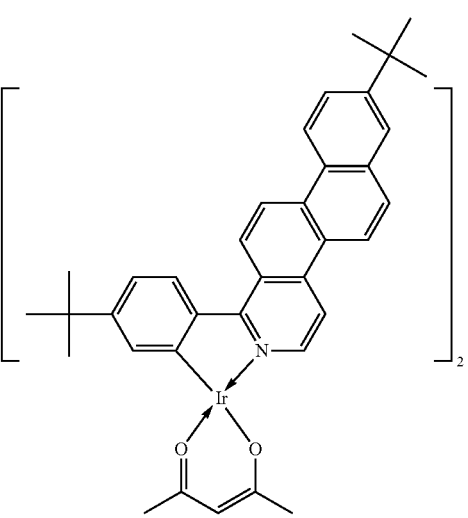

KK-16
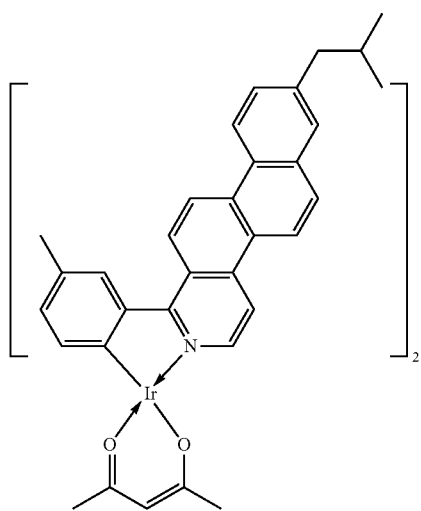
KK-17
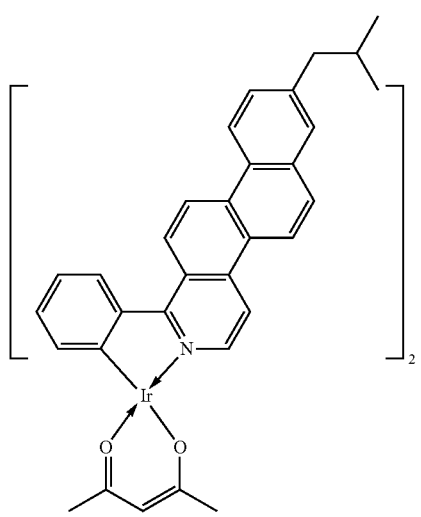
KK-18
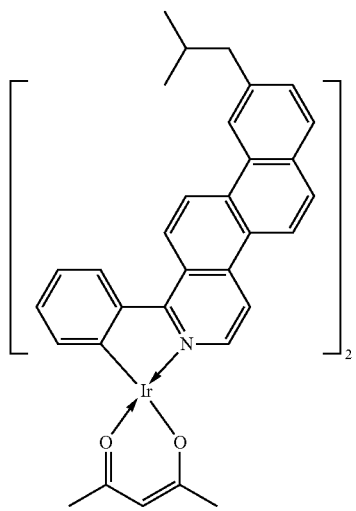
[Chem.12]
KK-19
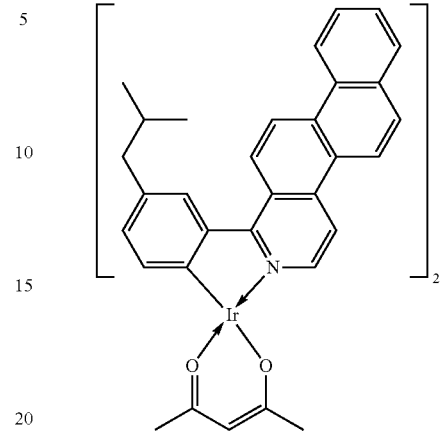
KK-20
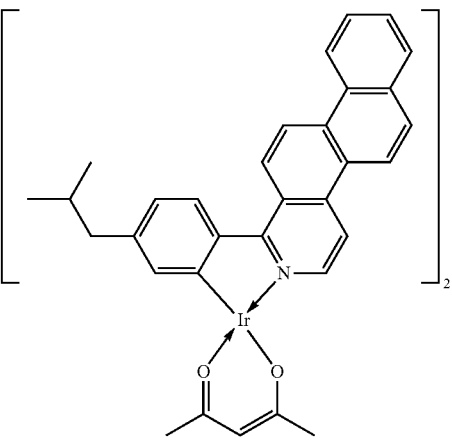
KK-21
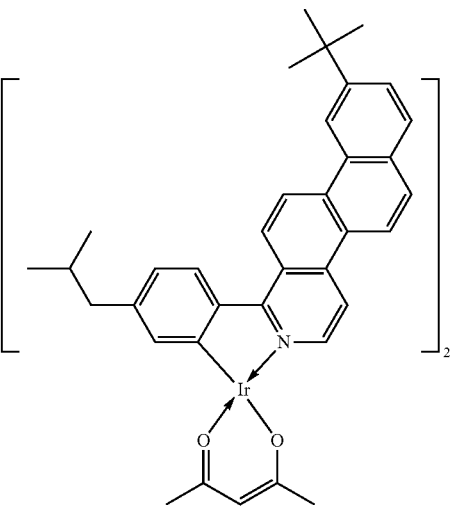

KK-22
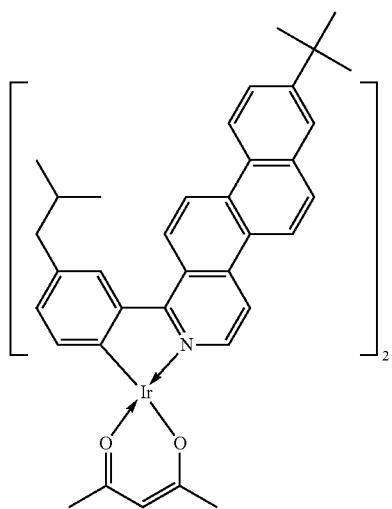
KK-23
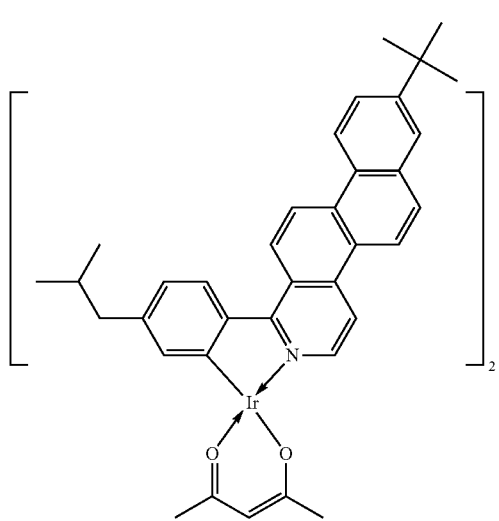
KK-24
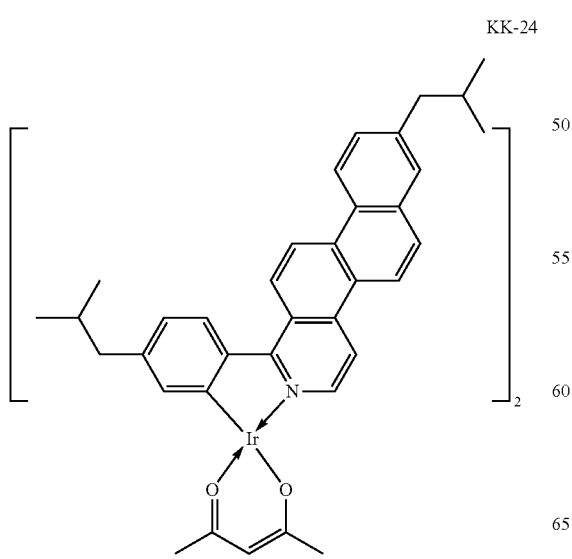
KK-25
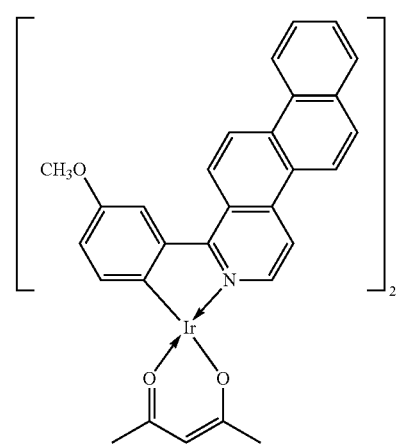
KK-26
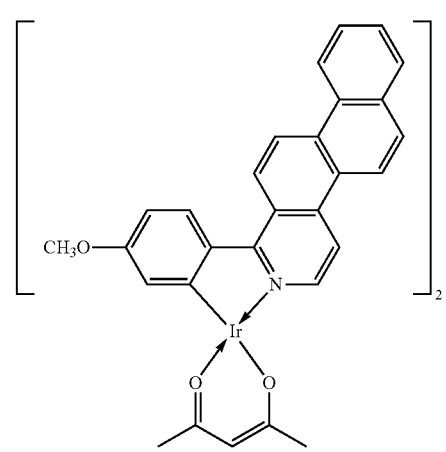
KK-27
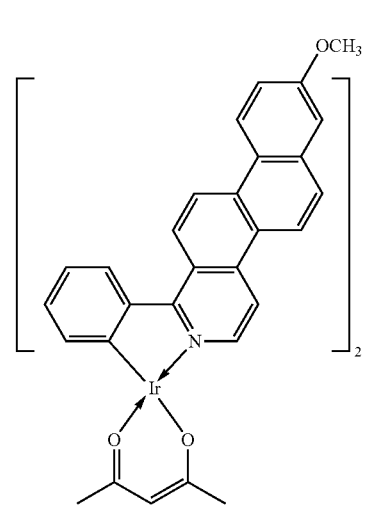

[Chem.13]
KK-28
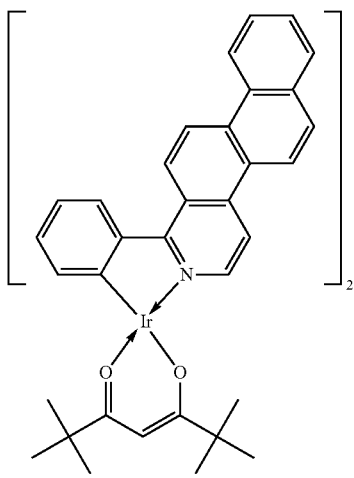
KK-31
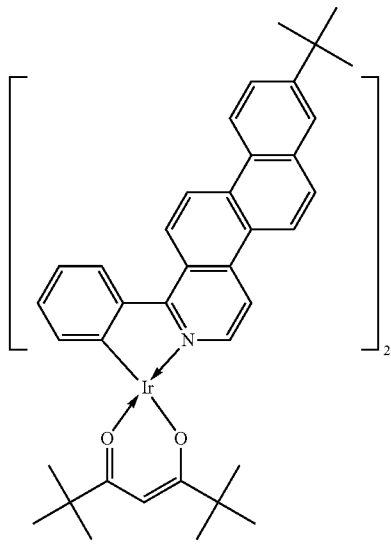
KK-29
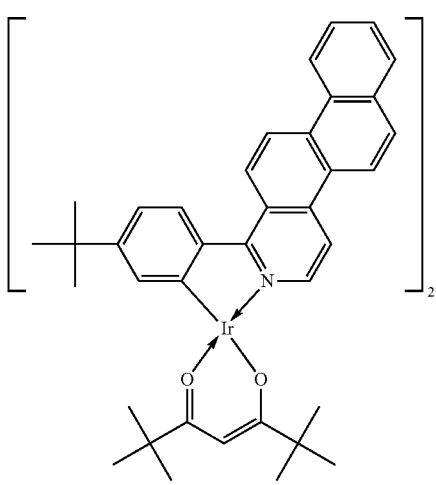
KK-32
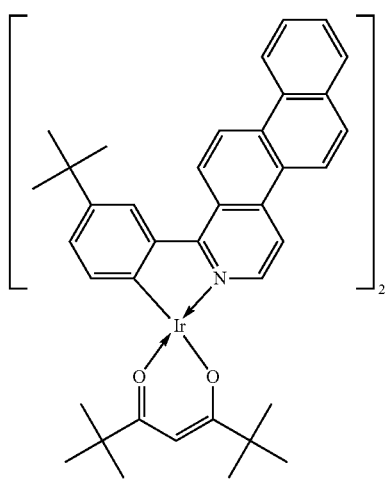
KK-30
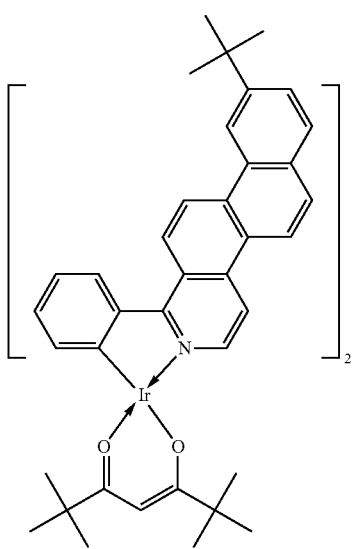
KK-33
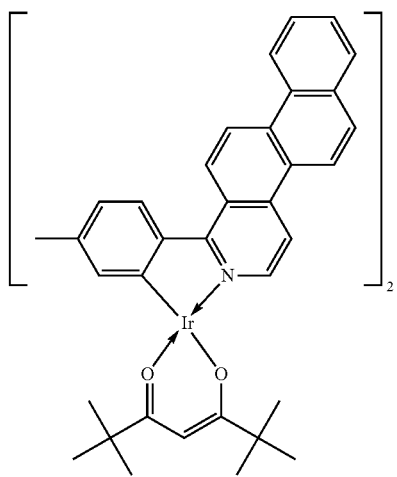

KK-34
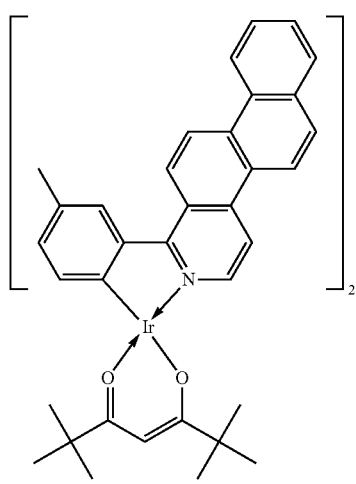
KK-37
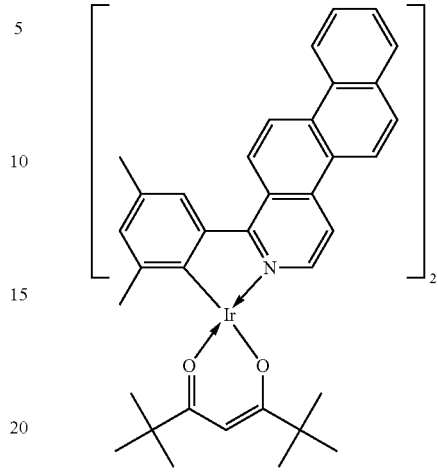
KK-35
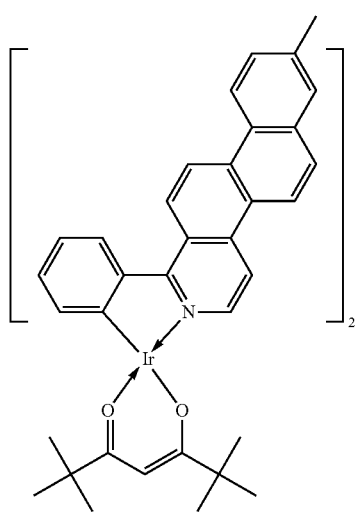
KK-38
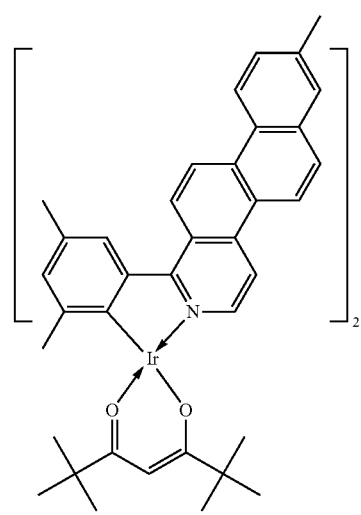
KK-36
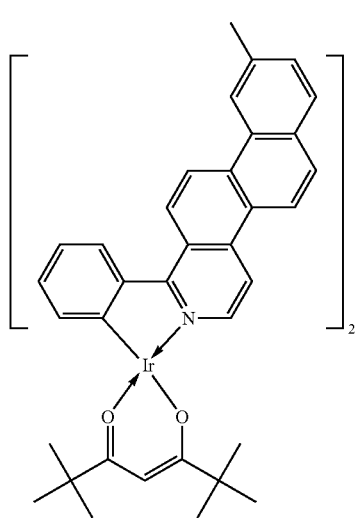
KK-39
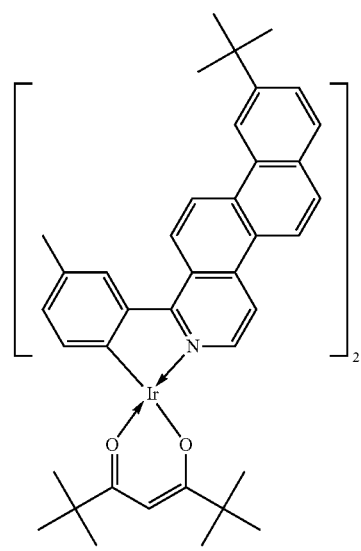

KK-40
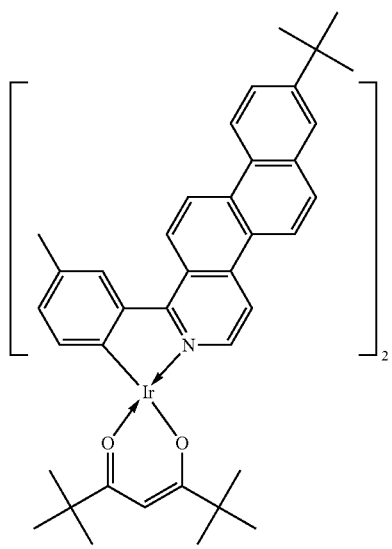
KK-43
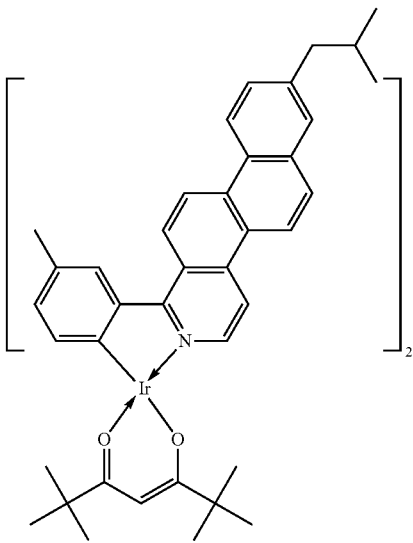
KK-41
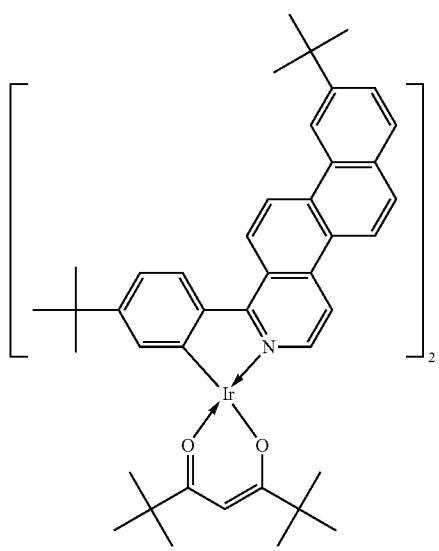
KK-44
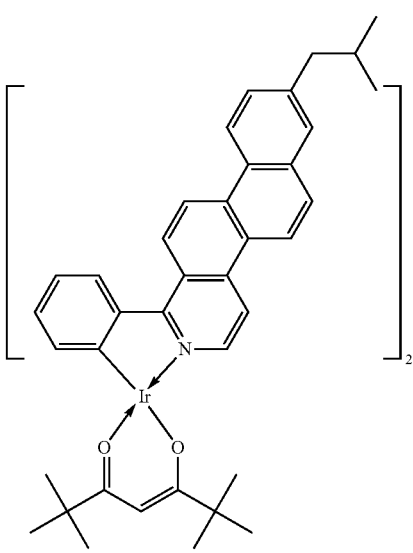
KK-42
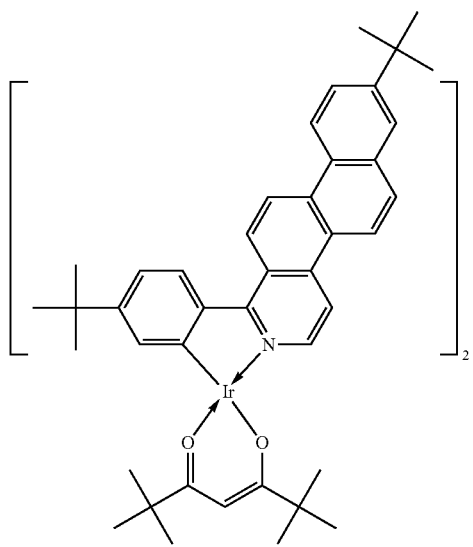
KK-45
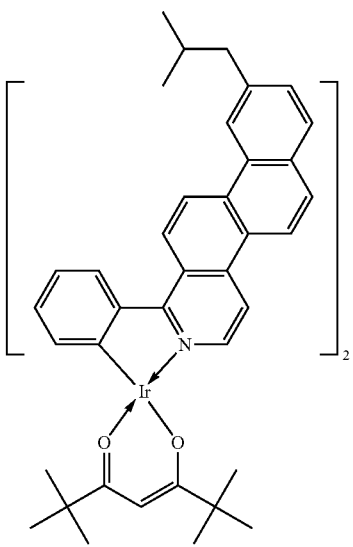

-continued
KK-46
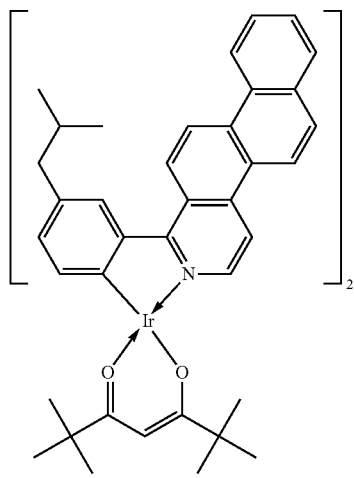
KK-47
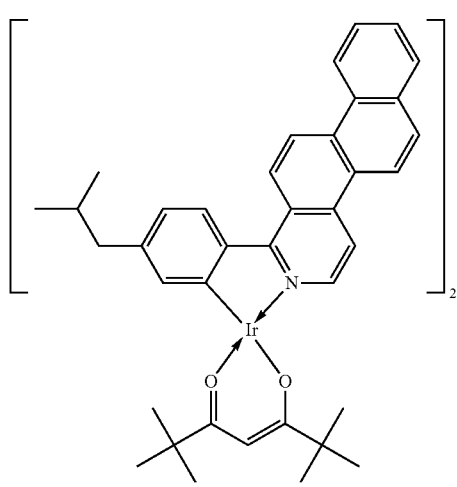
KK-48
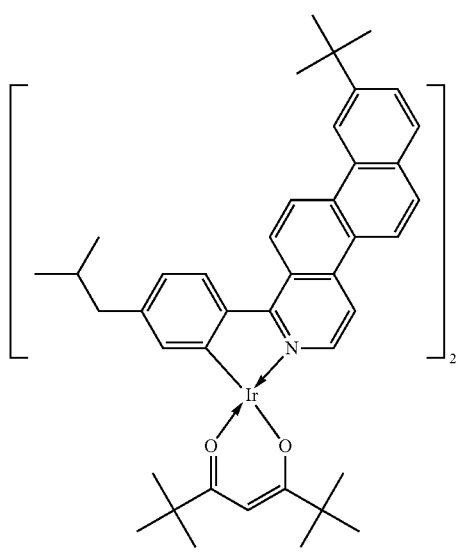
-continued
KK-49
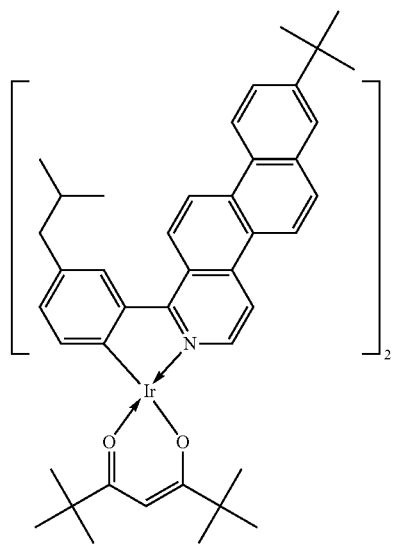
KK-50
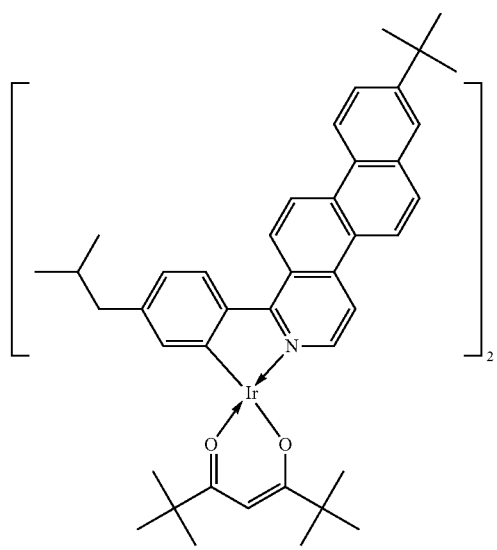
KK-51
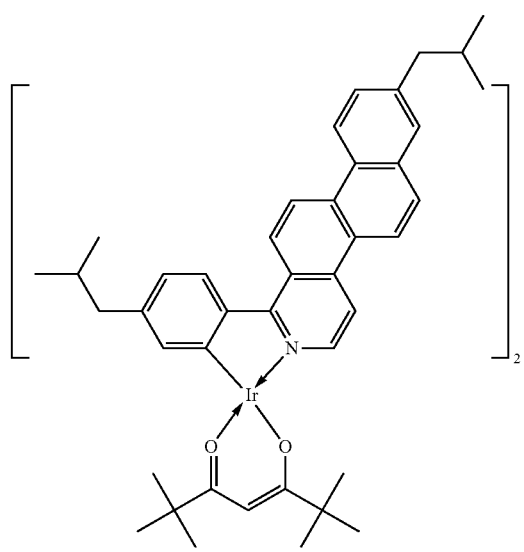

KK-52
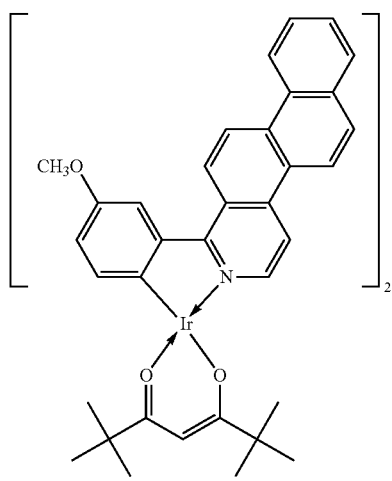
KK-55
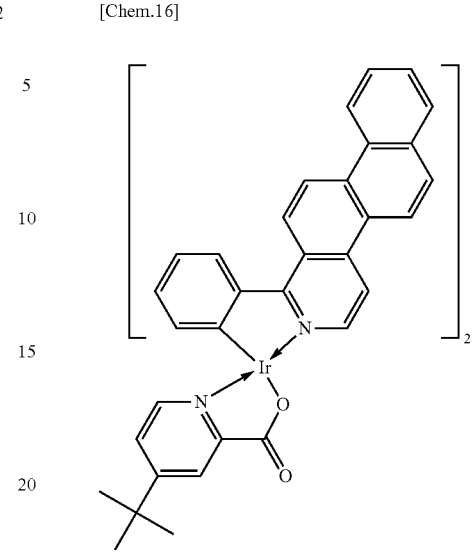
KK-53
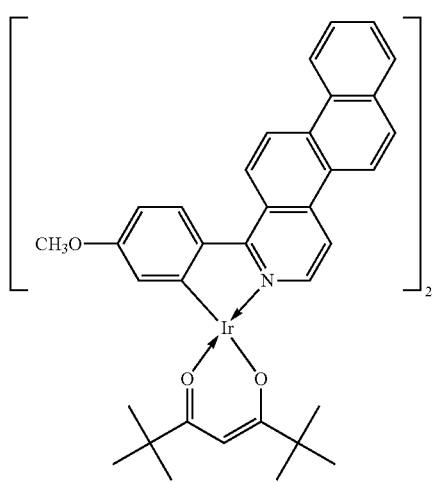
KK-56
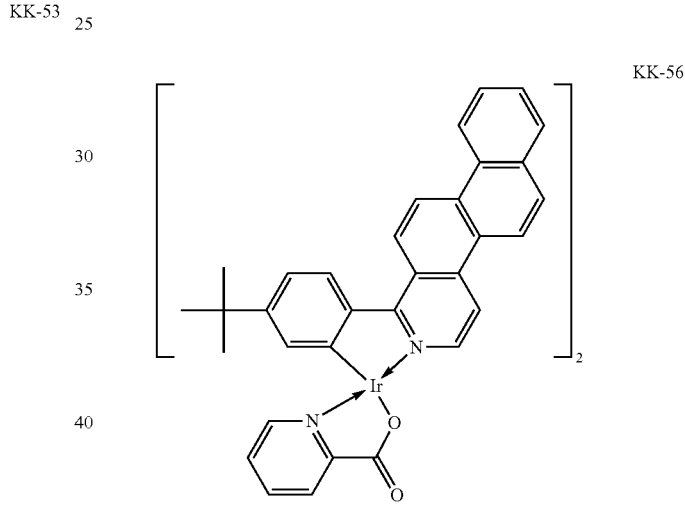
KK-54
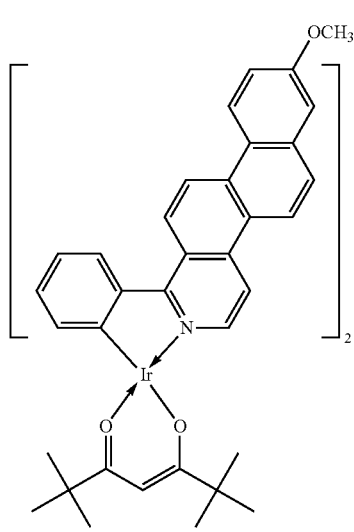
KK-57

KK-58
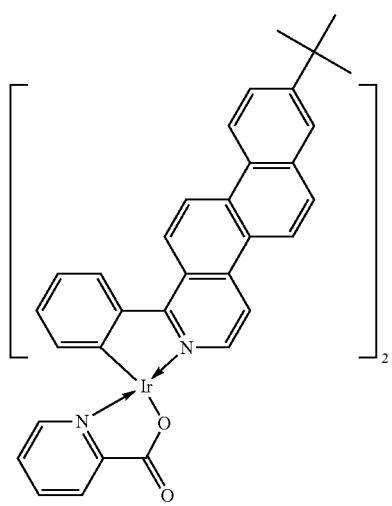
KK-59
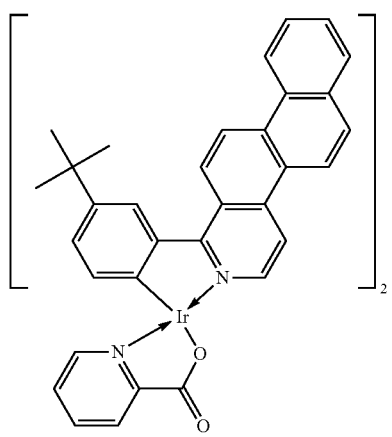
KK-60
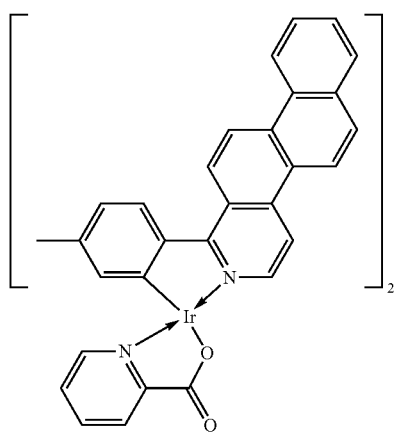
KK-61
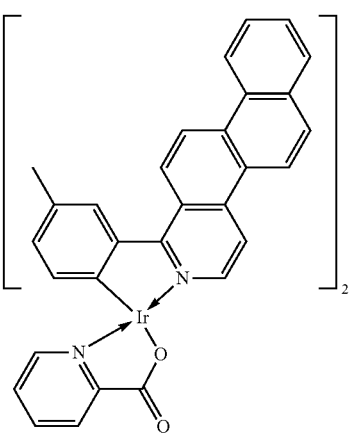
KK-62
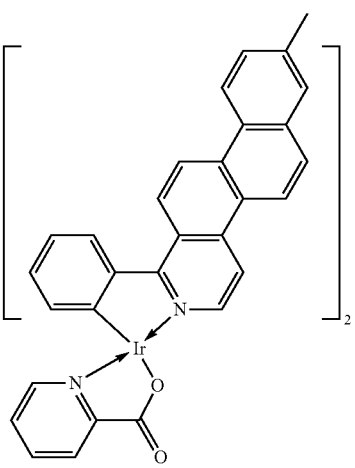
KK-63
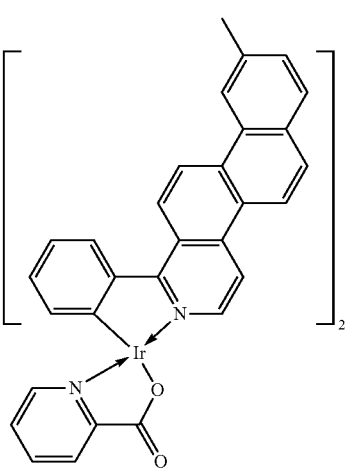

[Chem.17]
KK-64
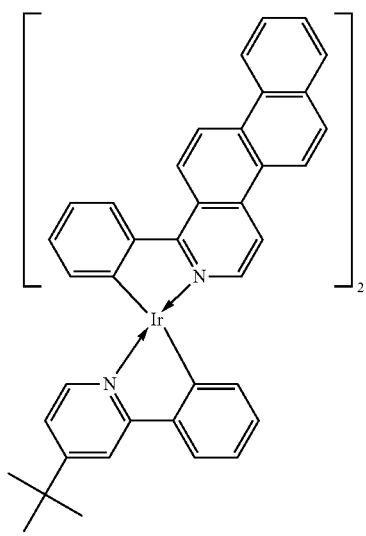
KK-65
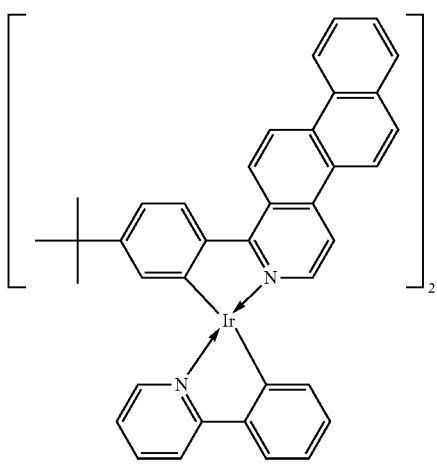
KK-66
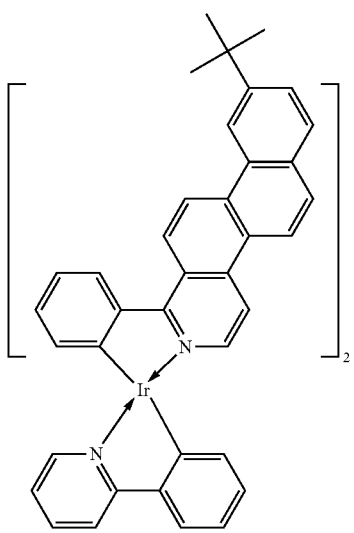
KK-67
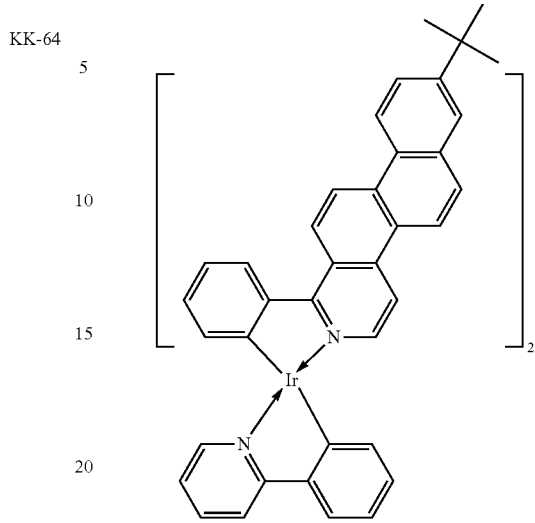
KK-68
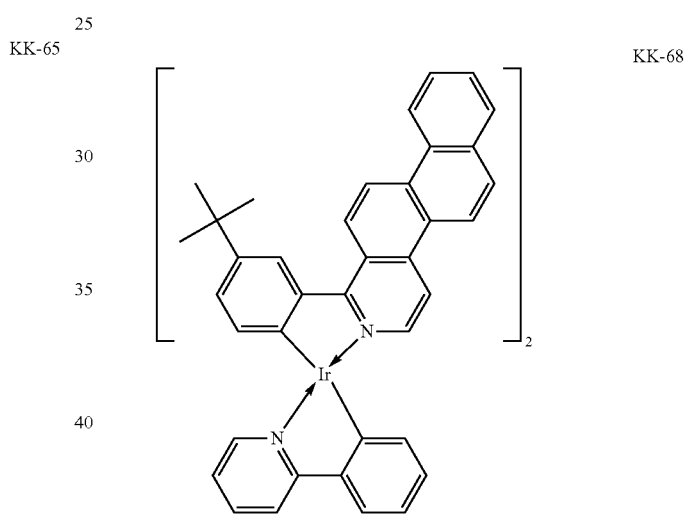
KK-69
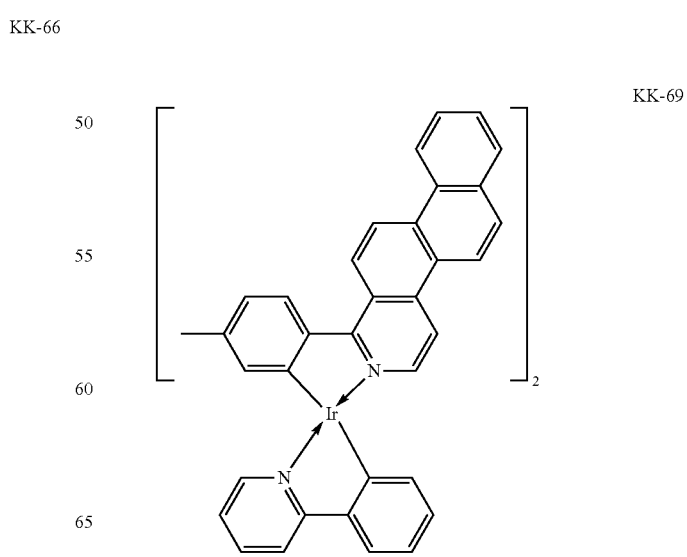

KK-70
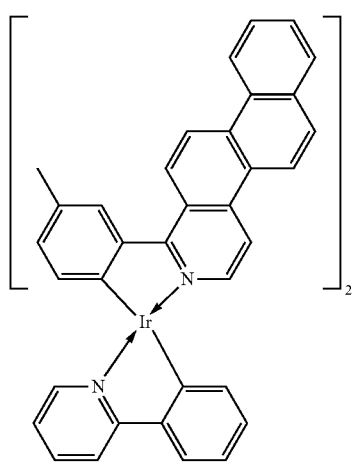
KK-73
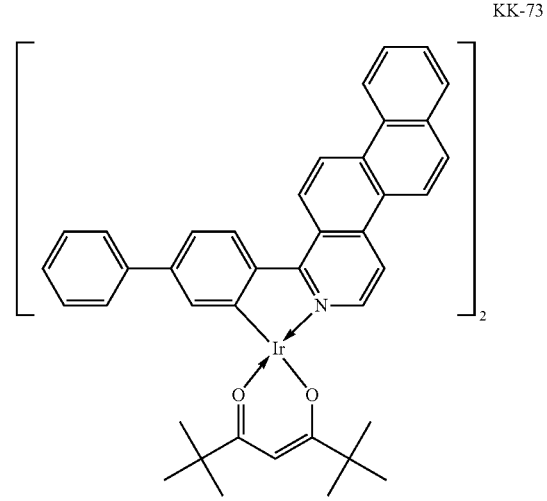
[Chem.18]
KK-71
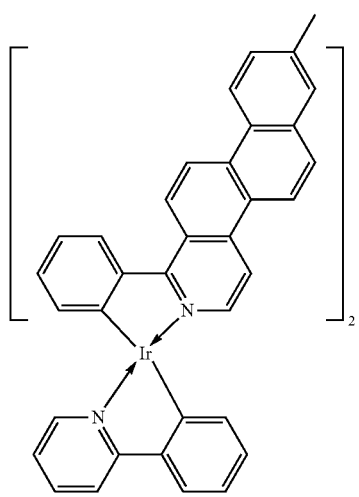
KK-74
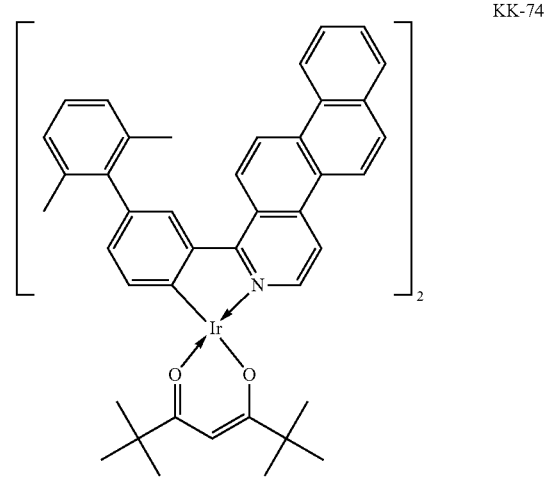
KK-72
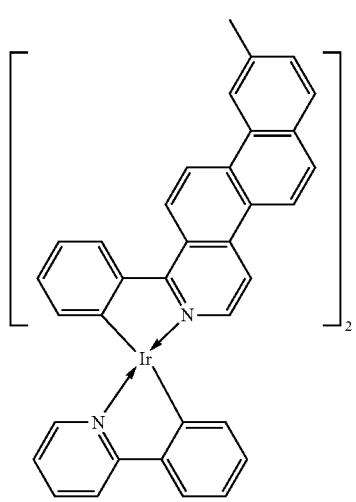
KK-75
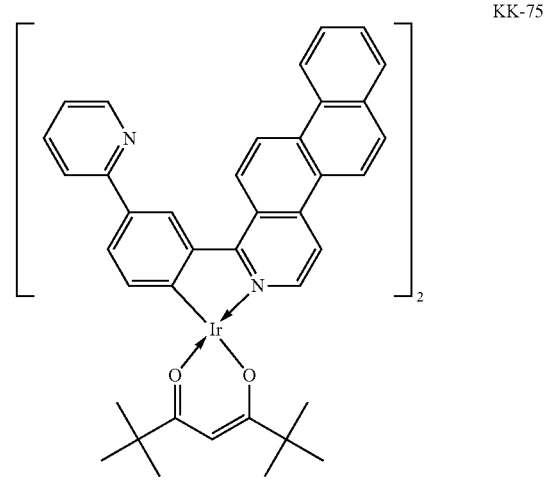

KK-76
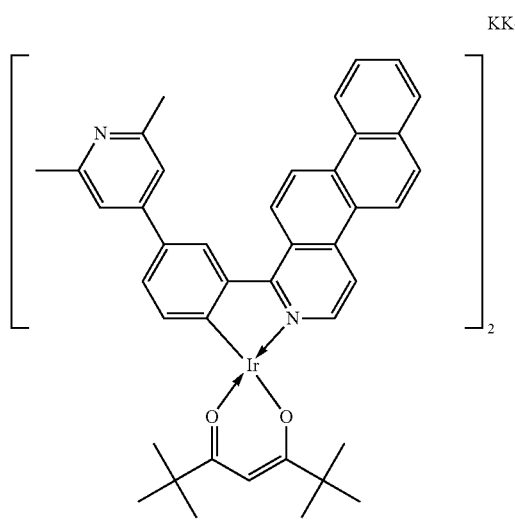
KK-77
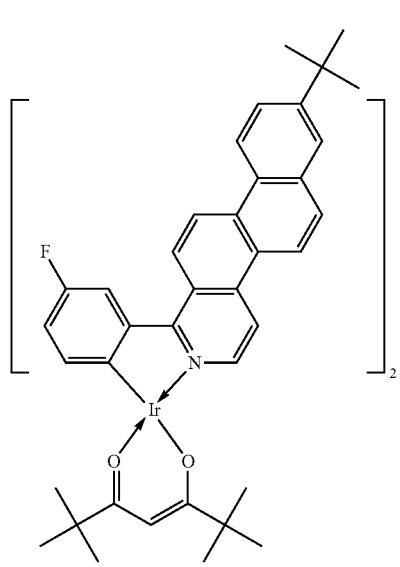
KK-78
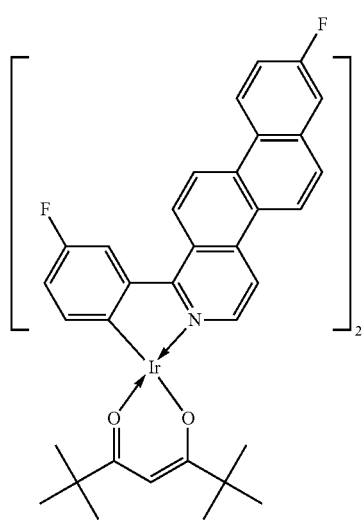
KK-79
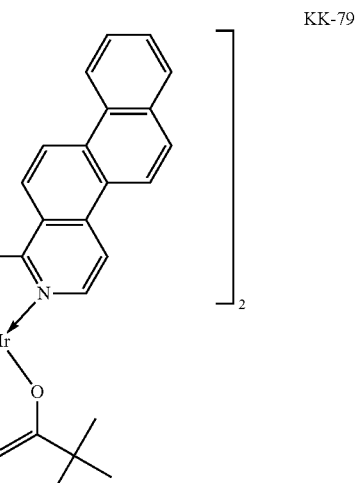
KK-80
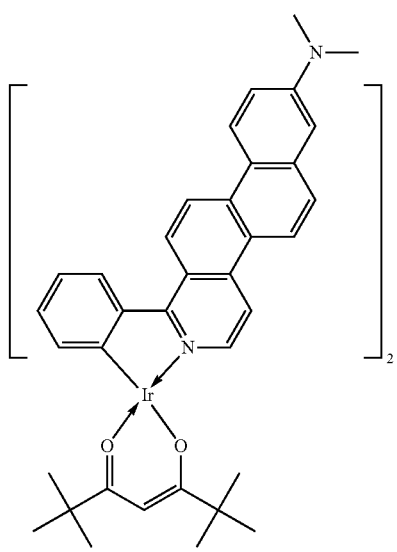
KK-81
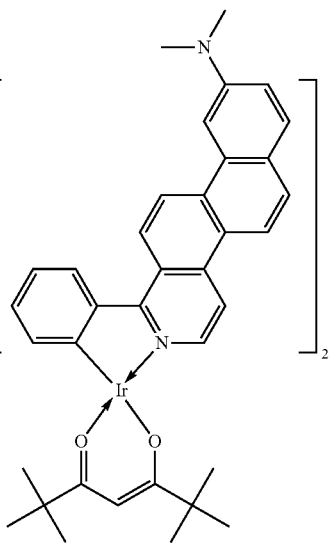

[Chem.19]

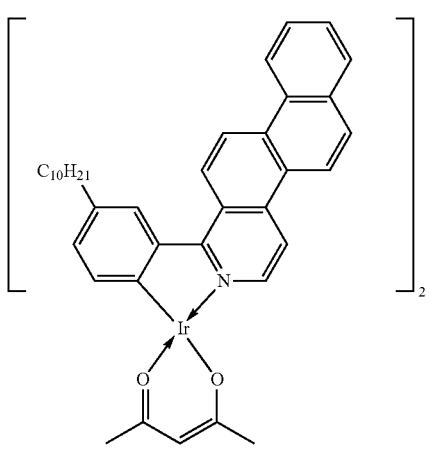

KK-82

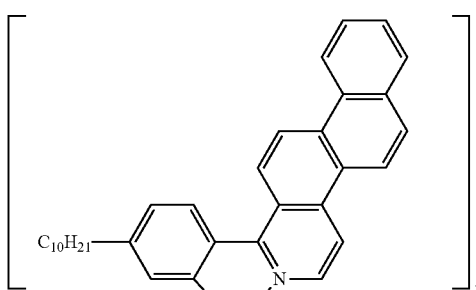

KK-83

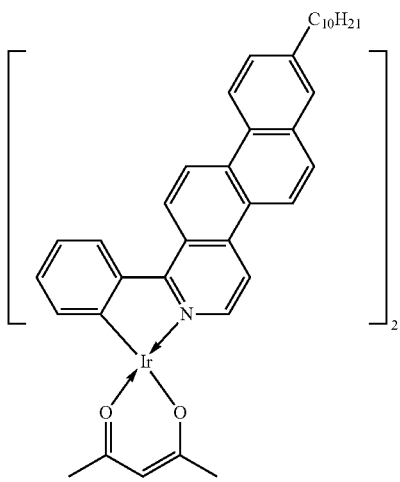

KK-84

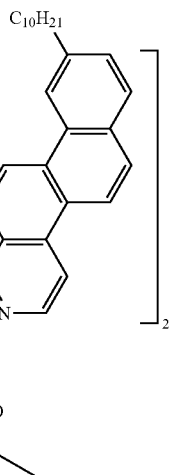

KK-85

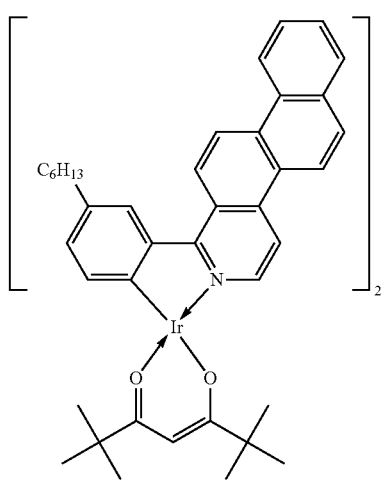

KK-86

KK-87

The iridium complexes of Group 1 shown by Example Compounds KK-01 to KK-27 above are iridium complexes represented by Formula [1] in which $IrL'_n$ is represented by Formula [3] and at least one of $R_{25}$ and $R_{27}$ is a methyl group.

The iridium complexes of Group 1 have a markedly high emission quantum yield. Thus, an organic light-emitting device having a high luminous efficiency may be produced using the iridium complex of Group 1 as a guest molecule of a light-emitting layer. The iridium complexes of Group 1 include two ligands that are 1-phenylnaphtho[2,1-f]isoquinoline derivatives and a diketone-based bidentate ligand that is acetylacetone. Thus, the molecular weight of the iridium complex is relatively small, which facilitates the sublimation purification.

The iridium complexes of Group 2 shown by Example Compounds KK-28 to KK-54 are iridium complexes represented by Formula [1] in which $IrL'_n$ is represented by Formula [3] and at least one of $R_{25}$ and $R_{27}$ is a tertiary butyl group.

The iridium complexes of Group 2 have a markedly high emission quantum yield. Thus, an organic light-emitting device having a high luminous efficiency may be produced using the iridium complex of Group 2 as a guest molecule of a light-emitting layer. The iridium complexes of Group 2 include two ligands that are 1-phenylnaphtho[2,1-f]isoquinoline derivatives and a diketone-based bidentate ligand that is dipivaloylmethane. Thus, the molecular weight of the iridium complex is relatively small. In addition, dipivaloylmethane serves as a steric-hindrance group. This facilitates the sublimation purification. The iridium complexes of Group 2 also have high solubility, which leads to ease of handling in synthesis and purification.

The iridium complexes of Group 3 shown by Example Compounds KK-55 to KK-63 are iridium complexes represented by Formula [1] in which $IrL'_n$ is represented by Formula [4].

The iridium complexes of Group 3, which include a ligand that is a picolinic acid derivative, have a shorter peak emission wavelength than an iridium complex including a diketone-based bidentate ligand.

The iridium complexes of Group 4 shown by Example Compounds KK-64 to KK-72 are iridium complexes represented by Formula [1] in which $IrL'_n$ is represented by Formula [5].

The iridium complexes of Group 4, which include a nonluminescent ligand that is a phenylpyridine derivative, emit red light due to a ligand that is 1-phenylnaphtho[2,1-f]isoquinoline. Thus, the molecular weight of the iridium complex is relatively small compared with a homoleptic iridium complex including ligands that are 1-phenylnaphtho[2,1-f]isoquinoline, which facilitates the sublimation purification. Furthermore, an organic light-emitting device produced using the iridium complex of Group 4 has a long operating life comparable to the homoleptic iridium complex.

The iridium complexes of Group 5 shown by Example Compounds KK-73 to KK-76 are iridium complexes represented by Formula [1] in which $IrL'_n$ is represented by Formula [3].

The iridium complexes of Group 5 have a markedly high emission quantum yield. Thus, an organic light-emitting device having a high luminous efficiency may be produced using the iridium complex of Group 5 as a guest molecule of a light-emitting layer. In the iridium complex of Group 5, the phenyl group of a ligand that is a 1-phenylnaphtho[2,1-f]isoquinoline derivative is replaced with a substituted or unsubstituted aryl group or with a substituted or unsubstituted heterocyclic group.

This facilitates the sublimation purification because the substituted or unsubstituted aryl group or the substituted or unsubstituted heterocyclic group serves as a steric-hindrance group.

The iridium complexes of Group 6 shown by Example Compounds KK-77 and KK-78 are iridium complexes represented by Formula [1] in which $IrL'_n$ is represented by Formula [3].

The iridium complexes of Group 6 have a markedly high emission quantum yield. Thus, an organic light-emitting device having a high luminous efficiency may be produced using the iridium complex of Group 6 as a guest molecule of a light-emitting layer. Since the iridium complexes of Group 6 include a fluorine atom that is a substituent of the ligand, the alkyl group serves as a steric-hindrance group and the luminescent ligands repel one another, which facilitates the sublimation purification. In addition, the iridium complexes of Group 6 allow light emission without a reduction in luminous efficiency even when high-concentration doping, e.g., 5% by weight or more of a matrix, is performed.

The iridium complexes of Group 7 shown by Example Compounds KK-79 to KK-81 are iridium complexes represented by Formula [1] in which $IrL'_n$ is represented by Formula [3].

The iridium complexes of Group 7 have a markedly high emission quantum yield. Thus, an organic light-emitting device having a high luminous efficiency may be produced using the iridium complex of Group 7 as a guest molecule of a light-emitting layer. The iridium complexes of Group 7 include a substituted amino group in the ligand. Thus, the HOMO level of the iridium complex is shallow, that is, close to the vacuum level, which reduces the barrier to charges when the iridium compound is used in combination with a host material (host molecule) having a shallow HOMO level. This realizes low-voltage operation of the organic light-emitting device. The substituted amino group also serves as a steric-hindrance group, which facilitates the sublimation purification.

The iridium complexes of Group 8 shown by Example Compounds KK-82 to KK-87 are iridium complexes represented by Formula [1] in which $IrL'_n$ is represented by Formula [3].

The iridium complexes of Group 8 have a markedly high emission quantum yield. Thus, an organic light-emitting device having a high luminous efficiency may be produced using the iridium complex of Group 8 as a guest molecule of a light-emitting layer. The iridium complex of Group 8 includes a long-chain alkyl group as a substituent and therefore has a markedly high solubility. Thus, the iridium complex may be easily used for forming a film by coating, such as a wet method.

Description of a Host Material Used in Combination with the Guest Material According to the Present Invention The iridium complex according to the present invention has a high quantum yield because its ligand has a 1-phenylnaphtho[2,1-f]isoquinoline skeleton having a high oscillator strength.

The inventors of the present invention have conducted studies on a host material suitable for use in a light-emitting layer in order to use the iridium complex according to the present invention more effectively. As a result, the inventors have found that the efficiency and drive durability of the organic light-emitting device may be improved by designing the molecule of the host material with consideration of the following three points:

1) The host material is composed of a hydrocarbon only;
2) The host material has an appropriate band gap; and
3) All carbon-carbon bonds in the molecule are formed by $sp^2$ hybridized orbitals.

These three points are described in detail below.

1) The host material is composed of a hydrocarbon only

One of the reasons for degradation of a light-emitting device due to energization is formation of excimers that trap carriers in a light-emitting layer. Excimers have a small energy and thus trap carriers, which reduces the luminous efficiency of the organic light-emitting device and also causes a light-emitting region to be localized. As a result, the peripheral molecules become likely to cause material degradation, which reduces the drive durability of the organic light-emitting device.

A compound including a heterocyclic group or a hetero atom has a large polarity of the molecules and is therefore considered to be likely to interact with other molecules. Thus, if such a compound is used as the material of a light-emitting layer, the compound interacts not only with a light-emitting material but also with the materials of the adjoining positive-hole-transportation layer and electron-transportation layer and thus becomes likely to form excimers, which leads to degradation of the organic light-emitting device.

In addition, a carbon-hetero atom bond or a hetero atom-hetero atom bond is formed among the molecules of the compound including a heterocyclic group or a hetero atom. A comparison of bond-dissociation energies, which generally show the strength of the bond, shows that a carbon-carbon bond has a larger bond-dissociation energy than a carbon-hetero atom bond or a hetero atom-hetero atom bond. For example, the bond-dissociation energy of a carbon-carbon bond is 3.61 eV, the bond-dissociation energy of a carbon-nitrogen bond is 3.03 eV, the bond-dissociation energy of a carbon-sulfur bond is 2.82 eV, the bond-dissociation energy of a nitrogen-nitrogen bond is 2.26 eV, and the bond-dissociation energy of a nitrogen-oxygen bond is 2.08 eV. Therefore, even when the compound constituting the host material is cycled repeatedly from its excited state to its ground state, the organic light-emitting device is less likely to be degraded because the host material composed of a hydrocarbon only has high resistance to degradation.

Thus, use of the host material composed of only a hydrocarbon as in the present invention allows an organic light-emitting device to have a high luminous efficiency and high durability compared with a host material including a heterocyclic group or a hetero atom.

2) The host material has an appropriate band gap

The band gap of the host material is set appropriately in order to prevent a light-emitting material (guest material) from being in an excessive radical state.

The term "red light" herein refers to light having a peak emission wavelength of 580 to 650 nm (lowest triplet excitation level (T1): 1.9 to 2.1 eV). The host material preferably has a higher T1 than a light-emitting material. However, an excessively high T1 of the host material increases the lowest singlet excitation level (S1) and the band gap. As a result, charge accumulation may occur at the interface between the host material and the adjacent materials. In addition, the difference in the highest occupied molecular orbital (HOMO) level and the difference in the lowest unoccupied molecular orbital (LUMO) level between the host material and the light-emitting material are increased, and, as a result, the light-emitting material may serve as a charge trap. This promotes degradation of the light-emitting device. The iridium complex (light-emitting material) according to the present invention having a naphtho[2,1-f]isoquinoline skeleton is likely to capture charges because the LUMO extends over the molecule of the iridium complex. Thus, the iridium complex according to the present invention may be used in combination with a host material having a narrow band gap in order to facilitate charge injection and charge transportation. The band gap of the host material is preferably 2.8 to 3.4 eV and more preferably 2.8 to 3.2 eV with consideration of the requirements for T1 of the host material and delta S-T (energy difference between S1 and T1) of a hydrocarbon.

Table 1 shows an energy of T1 and delta S-T of each common aromatic ring as a single substance. Among the structures of the aromatic rings, in particular, benzene, naphthalene, phenanthrene, fluorene, triphenylene, chrysene, picene, indeno[2,1-a]phenanthrene, indeno[1,2-b]phenanthrene, or fluoranthene may be used.

TABLE 1

| | Structural formula | Energy of T1 | Delta S-T |
|---|---|---|---|
| Benzene | | 3.66 eV | 1.11 eV |
| Naphthalene | | 2.63 eV | 1.37 eV |
| Phenanthrene | | 2.70 eV | 0.90 eV |
| Fluorene | | 2.94 eV | 1.19 eV |

TABLE 1-continued

| | Structural formula | Energy of T1 | Delta S-T |
|---|---|---|---|
| Triphenylene | 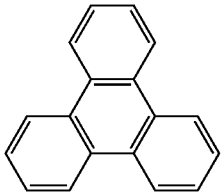 [SMILES: c1ccc2c(c1)c1ccccc1c1ccccc21] | 2.90 eV | 0.72 eV |
| Chrysene | 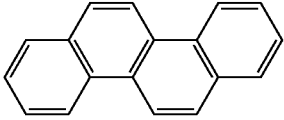 [SMILES: c1ccc2c(c1)ccc1c3ccccc3ccc21] | 2.48 eV | 0.95 eV |
| Picene | 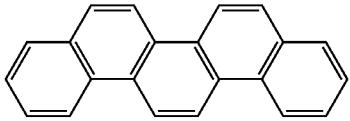 [SMILES: c1ccc2c(c1)ccc1c2ccc2c3ccccc3ccc21] | 2.49 eV | 0.81 eV |
| Indeno[2,1-a]phenanthrene | 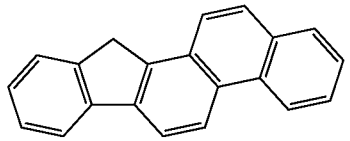 [SMILES: c1ccc2c(c1)Cc1c-2ccc2c1ccc1ccccc12] | 2.58 eV | 1.07 eV |
| Indeno[1,2-b]phenanthrene | 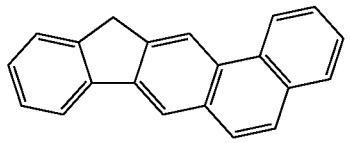 [SMILES: c1ccc2c(c1)Cc1cc3c(ccc4ccccc43)cc1-2] | 2.61 eV | 1.07 eV |
| Fluoranthene | 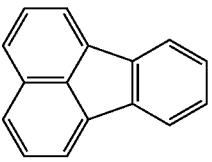 [SMILES: c1ccc2c(c1)-c1cccc3cccc-2c13] | 2.29 eV | 0.77 eV |
| Anthracene | 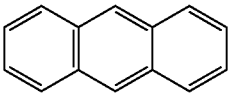 [SMILES: c1ccc2cc3ccccc3cc2c1] | 1.84 eV | 1.45 eV |
| Pyrene | 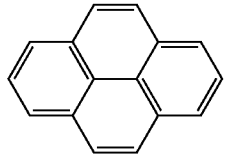 [SMILES: c1cc2ccc3cccc4ccc(c1)c2c34] | 2.10 eV | 1.24 eV |

In order to achieve the above-described band gap, a compound represented by the Formula [6] below may be employed.

where, a, b, c, and d are each independently 0 or 1, and a+b+c+d is greater than or equal to 0 and is less than or equal to 4. Ar1 to Ar6 are selected from benzene, naphthalene, phenanthrene, fluorene, triphenylene, chrysene, picene, fluoranthene, indeno[2,1-a]phenanthrene, and indeno[1,2-b]phenanthrene. Two methyl groups are located at the 9-position of fluorene, the 13-position of indeno[2,1-a]phenanthrene, and the 12-position of indeno[1,2-b]phenanthrene.

The molecular weight of the compound represented by Formula [6] is preferably 1,000 or less and more preferably 900 or less.

Among compounds represented by Formula [6], a compound represented by Formula [7] is more preferable.

where, p and q are each independently 0 or 1 and p+q is greater than or equal to 0 and is less than or equal to 2.

In Formula [7], Ar8 and Ar9 may have the skeletons shown below.

[Chem. 20]

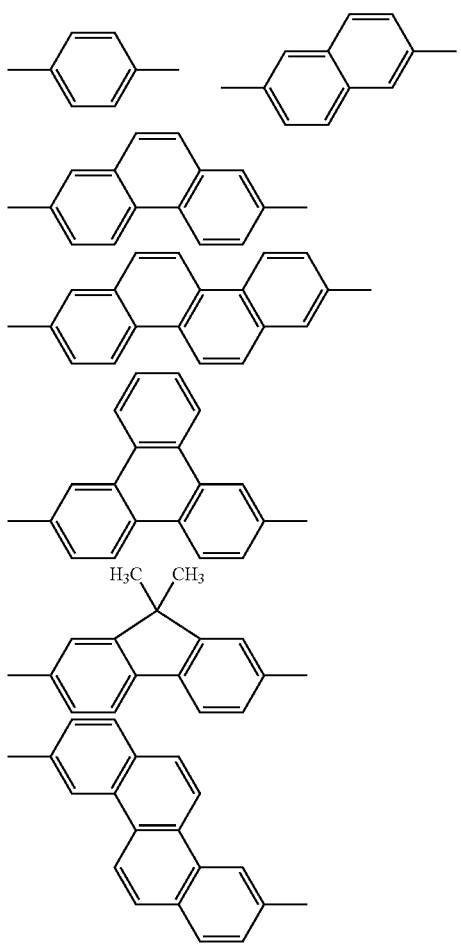

In other words, in order to produce a host material having a narrow band gap suitable for emitting red light, the following conditions need to be satisfied: a) conjugation is allowed to extend, and b) no peri-position is present at linkages. As shown by the skeletons above, Ar8 and Ar9 are arylene groups having bonds at the positions such that conjugation is allowed to extend (i.e., the bad gap is reduced) over Ar7 and Ar10 that are aryl groups located at the both ends of the molecule.

It is preferable that Ar8 and Ar9 do not have a peri-position at the respective linkages to Ar7 and Ar10. In this case, the dihedral angle of the linkage is reduced, which allows two p-orbitals to be brought into contact with each other in parallel. This allows conjugation to extend. For example, a comparison between 2,6-naphthalene above and 1,4-naphthalene shows that, despite both having bonds in the same direction, 1,4-naphthalene causes greater hydrogen repulsion, which increases the dihedral angle more. This reduces overlap of p-orbitals and consequently suppresses extension of the conjugation, which results in an increase in the band gap.

Preferably, p+q is greater than or equal to 1 and be less than or equal to 2. If p+q is greater than or equal to 3, the molecular weight is increased, which results in, for example, a reduction in the solubility of the compound in a solvent and the decomposition of the compound in the process of sublimation purification or vapor deposition. Thus, ease of handling is reduced. If the host material is decomposed, a degradation product or impurity of the host material may act as a carrier trap and disturbs the carrier balance in an organic light-emitting device, which degrades the durability of the organic light-emitting device.

With consideration of the above-described conditions, a host material having a band gap suitable for emitting red light may be produced. Thus, ease of injecting charges is improved, and thereby formation of charge accumulation can be suppressed.

3) All carbon-carbon bonds in the molecule are formed by $sp^2$ hybridized orbitals Although the efficiency and the drive durability of the organic light-emitting device may be improved to a sufficient degree by satisfying the above-described conditions 1) and 2), more preferably, all carbon-carbon bonds in the molecule are formed by $sp^2$ hybridized orbitals. This is because, when the skeleton of the molecule is constituted by $sp^2$ carbon atoms, the structure of the molecule is considered to be less likely to be changed from the ground state to the charged state or the excited state. Thus, even when a polycyclic aromatic hydrocarbon is changed to the unstable cationic state by charges injected from the electrodes, such a host material is considered to have a high resistance to degradation. The carbon-carbon single bond energy is 3.9 eV. The carbon-carbon double bond energy is 7.5 eV. Thus, the carbon-carbon double bond energy is larger than the carbon-carbon single bond energy. Therefore, a carbon-carbon bond formed by $sp^2$ hybridized orbitals is considered to be more stable.

In the 1-phenylnaphtho[2,1-f]isoquinoline skeleton of the ligand according to the present invention, the conjugation plane formed by pi-orbitals is extended as a result of the condensation of quinoline and a naphthalene ring. Therefore, the light-emitting material is likely to interact with its neighboring material (particularly, the host material). Thus, the light-emitting material may capture charges in the host material to form a radical state or an exciplex with the host material, which leads to a reduction in the luminous efficiency and durability of the light-emitting device.

The luminous efficiency and drive durability of the organic light-emitting device can be improved to a sufficient degree by satisfying above-described conditions 1) to 3), particularly conditions 1) and 2). However, the inventors of the present invention have found that the luminous efficiency and drive durability of the organic light-emitting device may be further improved by avoiding the formation of the radical state and the exciplex.

The inventors have found that the formation of the radical state and the exciplex may be avoided by designing the compound used as a host material which has a "unit capable of reducing the interaction" in the structure of the compound, and thereby the luminous efficiency and drive durability of the organic light-emitting device may be further improved. The molecule of the host material can be designed with consideration of the following two points regarding the "unit capable of reducing the interaction".

4) The direction of condensation of the end groups is the direction of the short axis of the molecule 5) The end groups have different skeletons from each other These two points are described below in detail.

4) The direction of condensation of the end groups is the direction of the short axis of the molecule Ar7 and Ar10 in Formula [6] are now described. When Ar7 and Ar10 are selected from the same group as Ar8 and Ar9, the resulting compound has a linear structure. In this case, when each material is formed into a film and brought into intimate contact with one another in the organic light-emitting device, the iridium complex according to the present invention is considered to receive electrons from the host material brought into intimate contact with the iridium complex and to be likely to form the radical state because the LUMO extends over the molecule of the iridium complex.

Thus, the inventors have found that the luminous efficiency and drive durability of the organic light-emitting device may be further improved using a host material including Ar7 and Ar10 that are aryl groups formed by condensation of aromatic rings in a direction different from the direction (direction of the long axis) in which Ar7 and Ar10 are bonded to Ar8 and Ar9, respectively. Specifically, Ar7 and Ar10 may be selected from the structures below.

[Chem. 21]

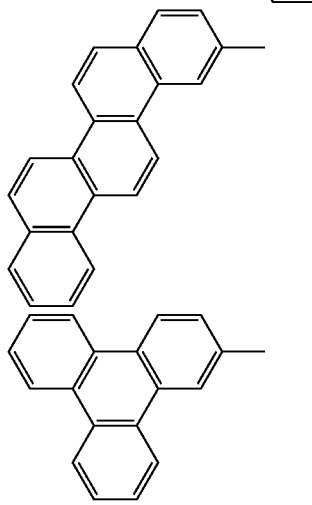

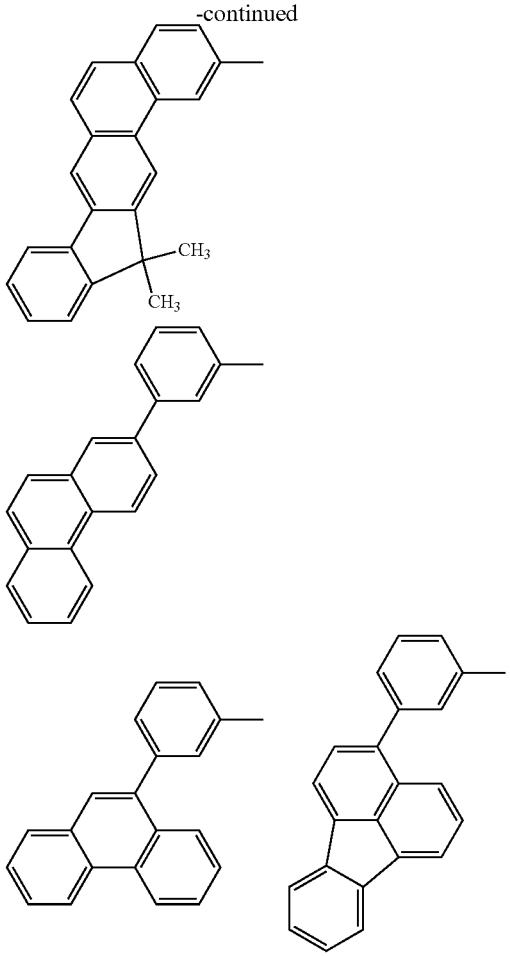

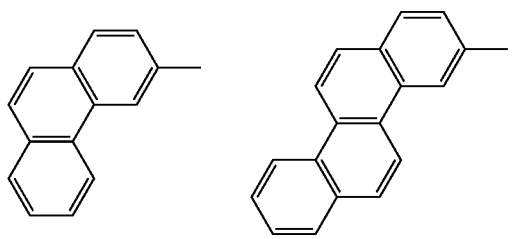

In addition, the following aryl groups may also be used as Ar10.

[Chem. 22]

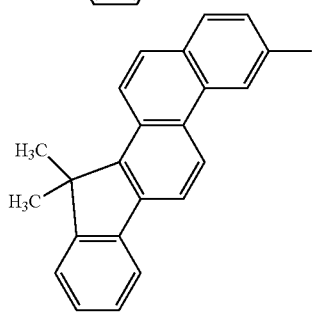

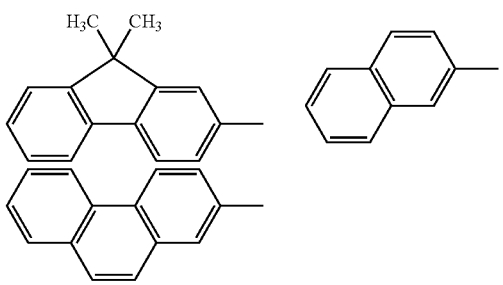

In other words, the hydrocarbon organic compound according to the present invention has a band gap suitable for emitting red light due to its conjugation length extended by Ar8 and Ar9. In addition, Ar7 and Ar10 at the both ends of the molecule are bent in a direction different from that of the long axis of Ar8 and Ar9, which prevents the materials from being brought into intimate contact with one another. This prevents the light-emitting material from forming the radical state.

5) The end groups have different skeletons from each other

More preferably, Ar7 and Ar10, which are aryl groups at the both ends of the molecule, have different skeletons from each other. In this case, the molecule has a low symmetry compared with the case where Ar7=Ar10 and, as a result, the molecules are prevented from being stacked on one another. This further prevents the light-emitting material from forming an excessive radical state.

<Examples of the Host Material According to the Present Invention>

Specific structural formulae of the host material that may be used in the present invention are shown below.

[Chem.23]

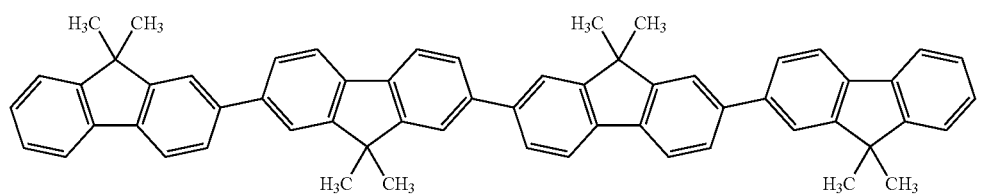

X-101

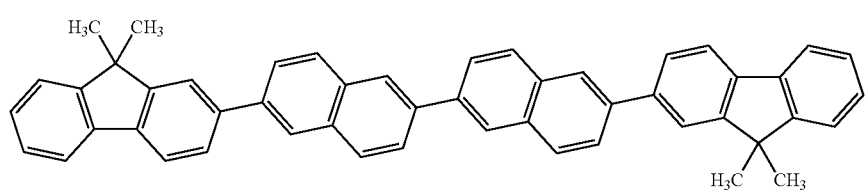

X-102

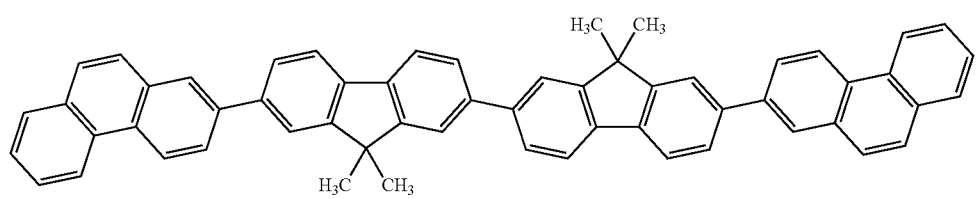

X-103

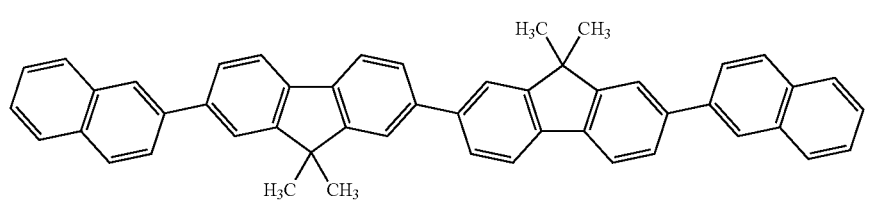

X-104

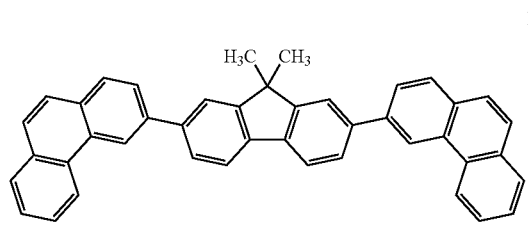

X-105

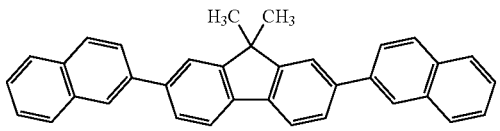

X-106

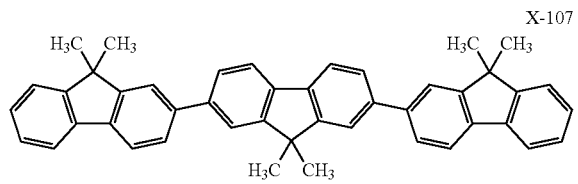

X-107

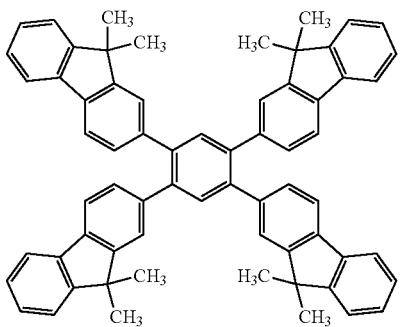

X-108

[Chem.24]
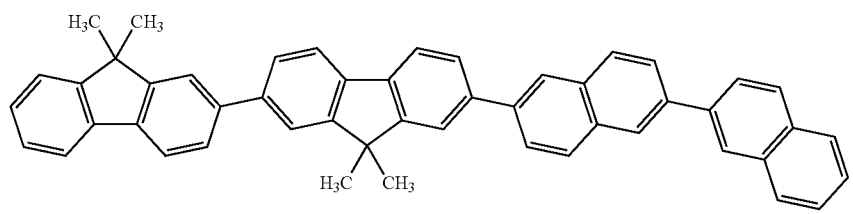
Y-101
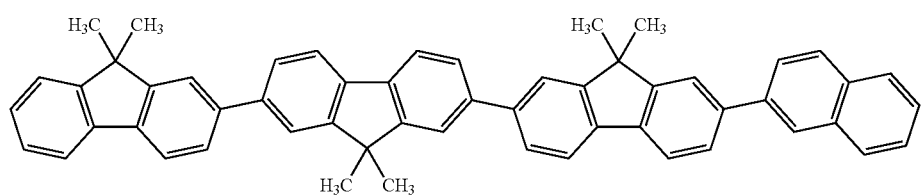
Y-102
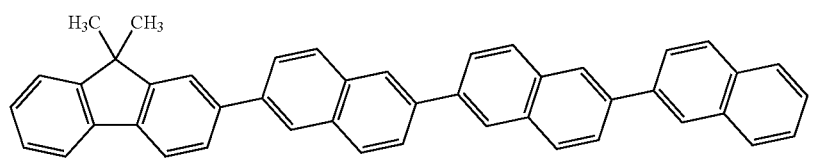
Y-103
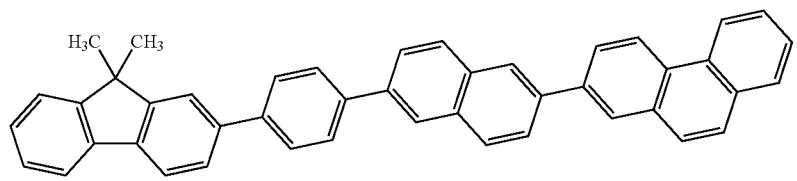
Y-104
[Chem.25]
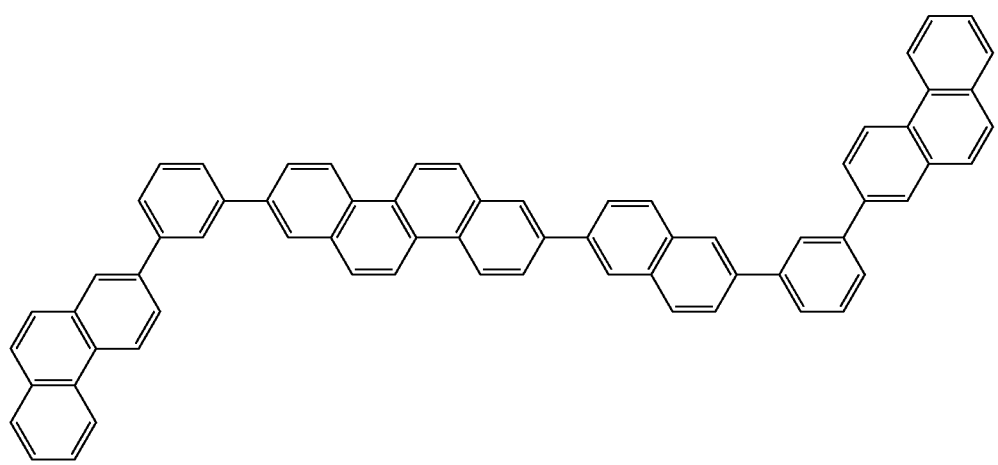
A-101

-continued

A-102

A-103

A-104

[Chem.26]

B-101

-continued
B-102
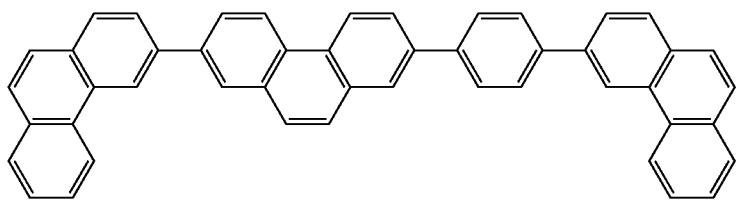
B-103
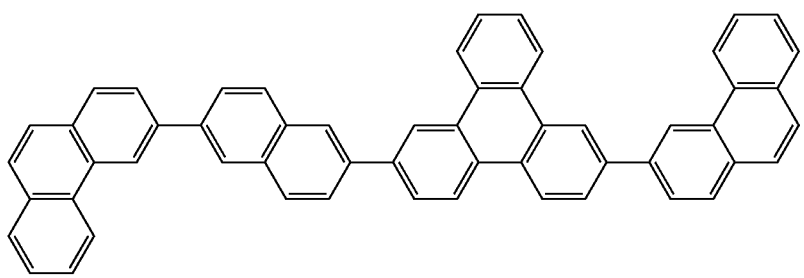
B-104
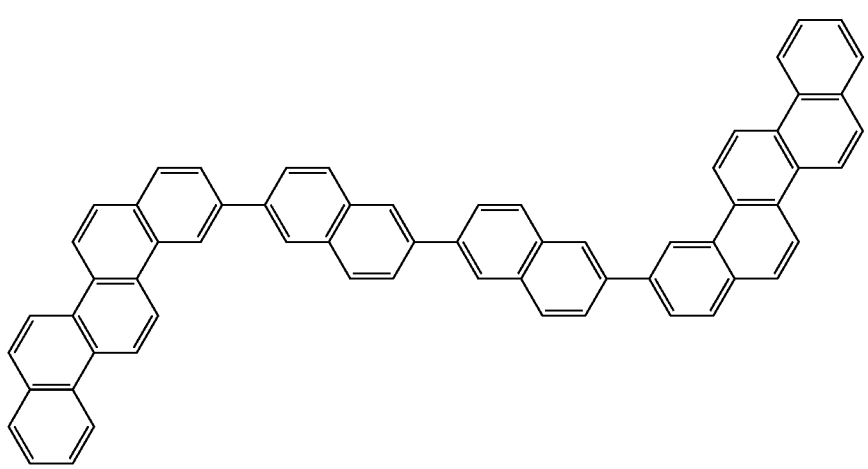
B-105
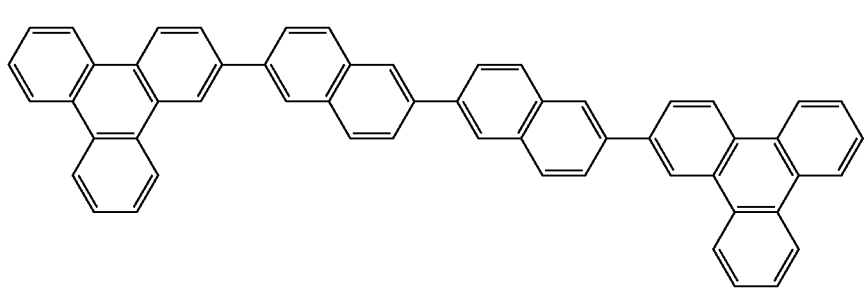
[Chem.27]
C-101
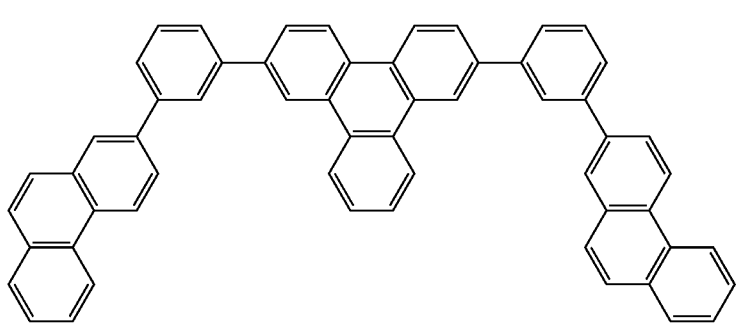

C-102
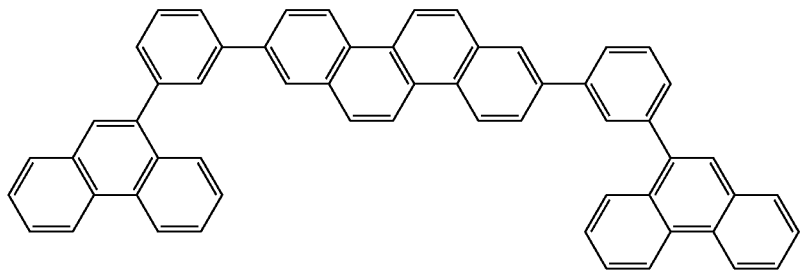
C-103
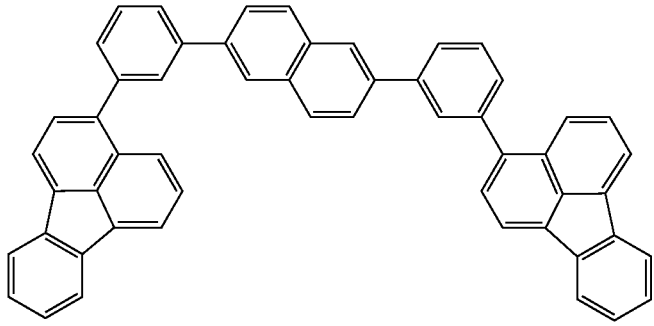
[Chem.28]
D-101
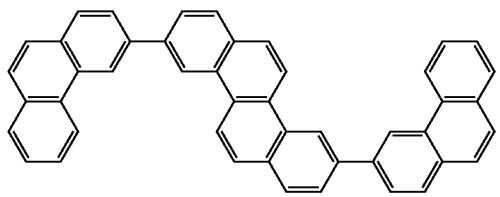
D-102
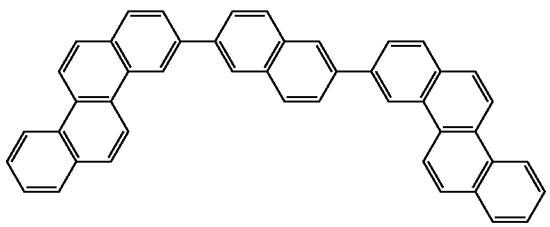
D-103
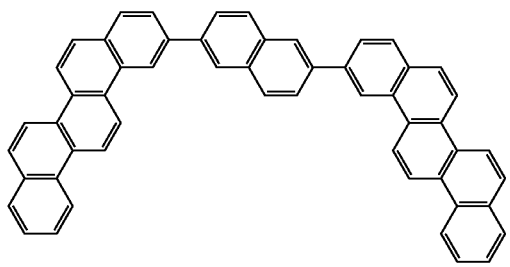
D-104
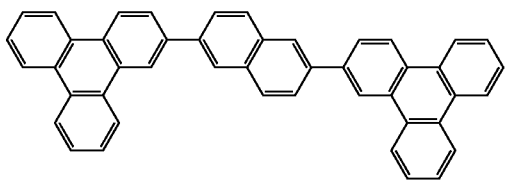
[Chem.29]
E-101
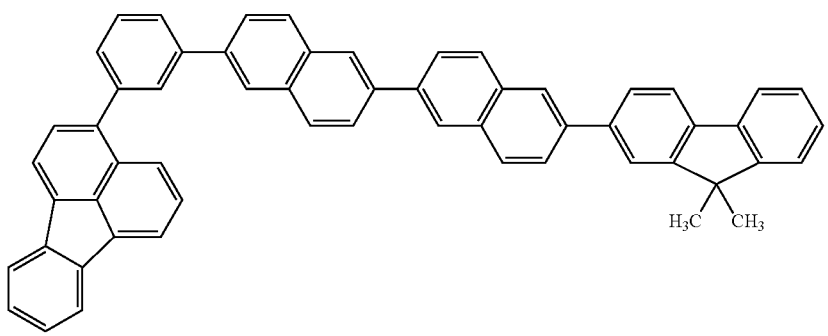

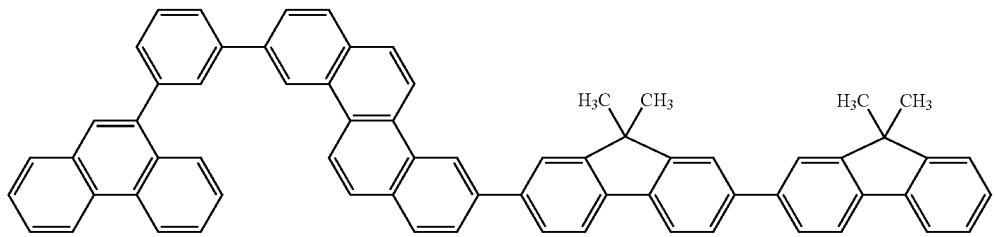
E-102
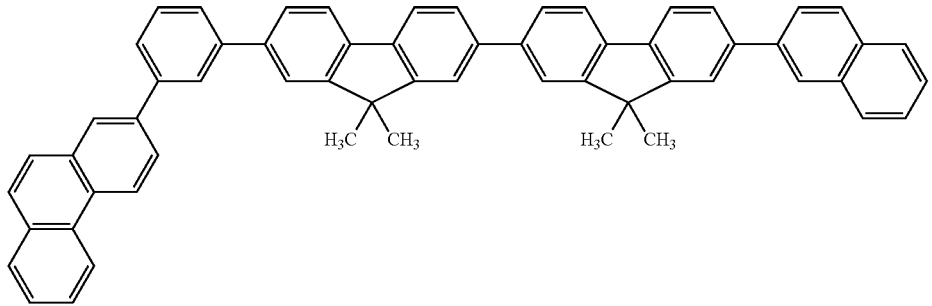
E-103
[Chem.30]
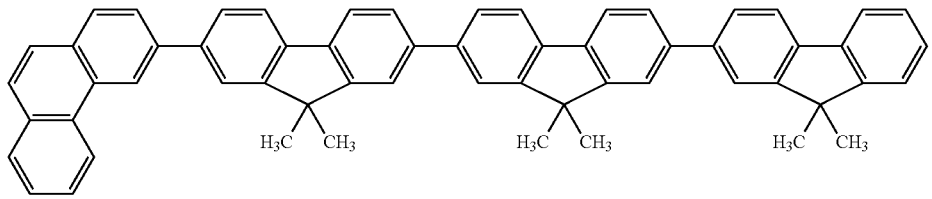
F-101
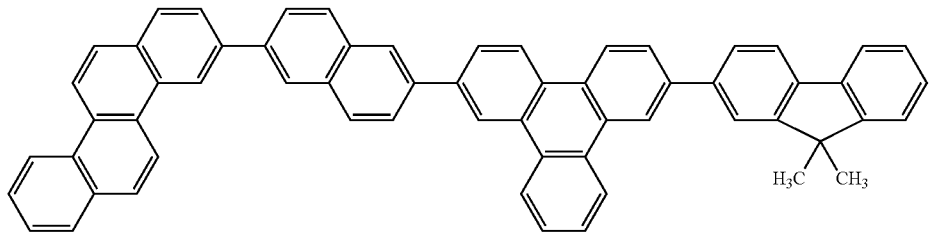
F-102
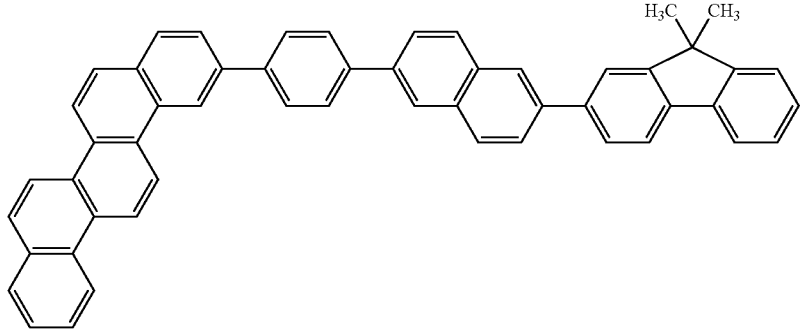
F-103
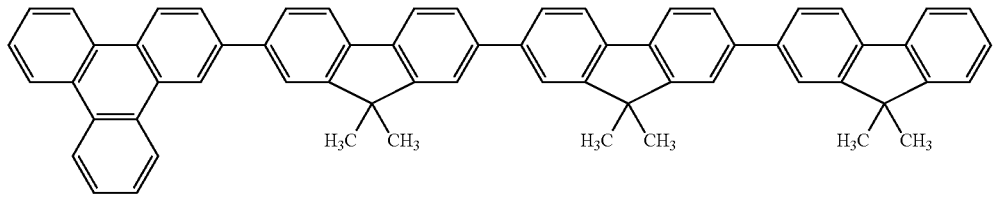
F-104

-continued
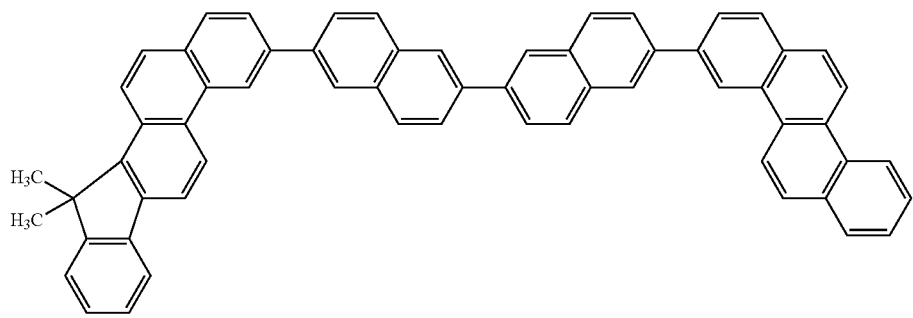
F-105
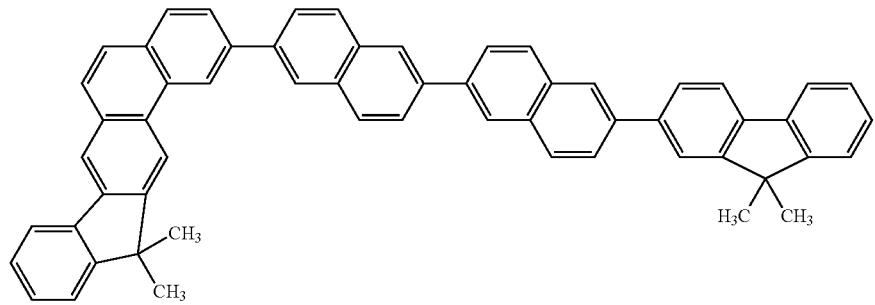
F-106
[Chem.31]
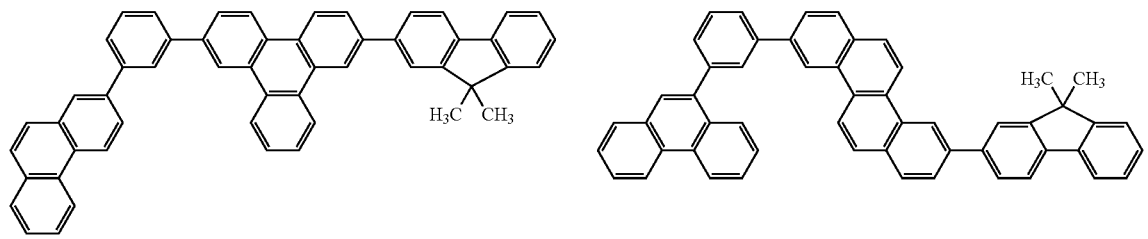
G-101    G-102
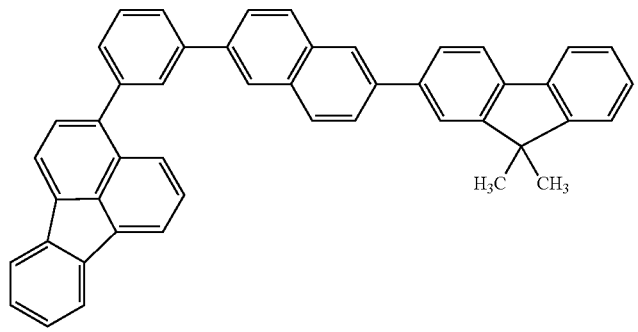
G-103
[Chem.32]
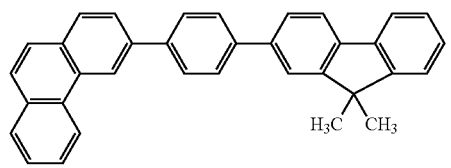
H-101
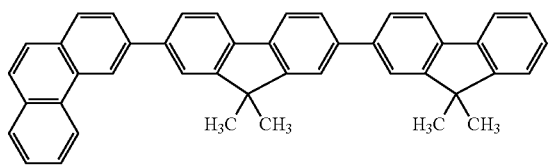
H-102

-continued
H-103
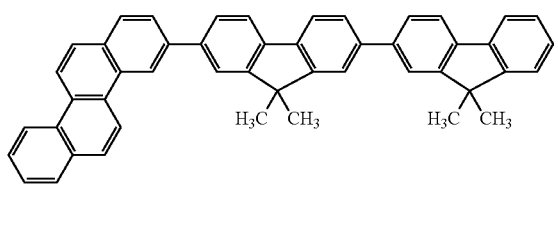
H-104
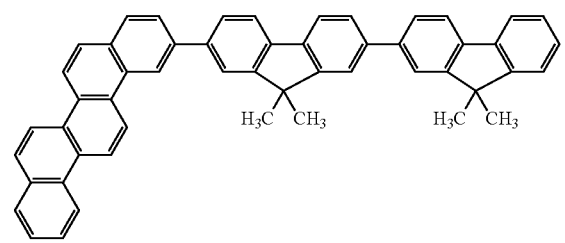
H-105
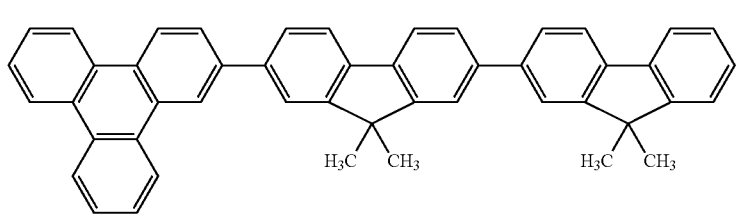
H-106
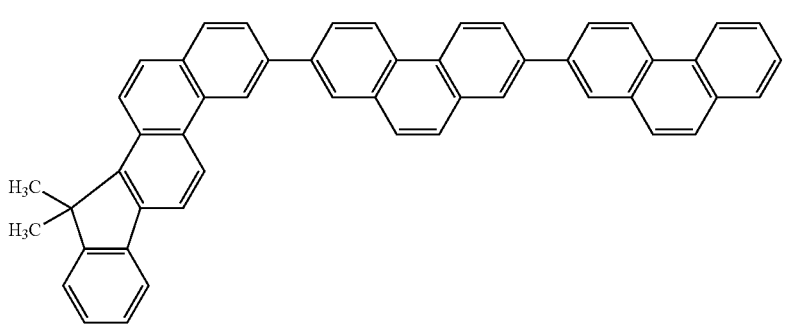
H-107
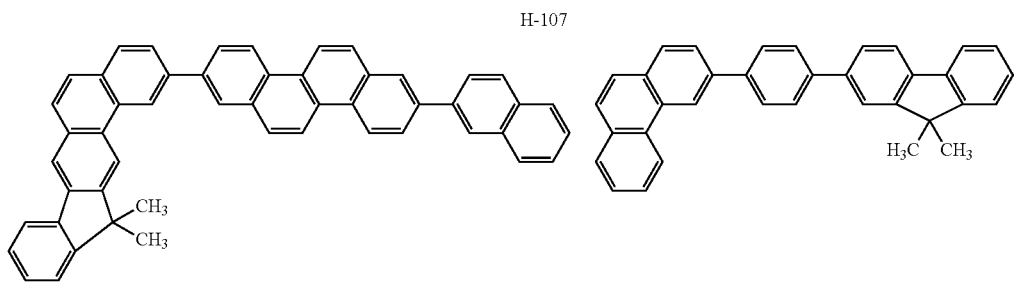
H-108
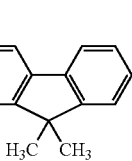
[Chem.33]
I-101
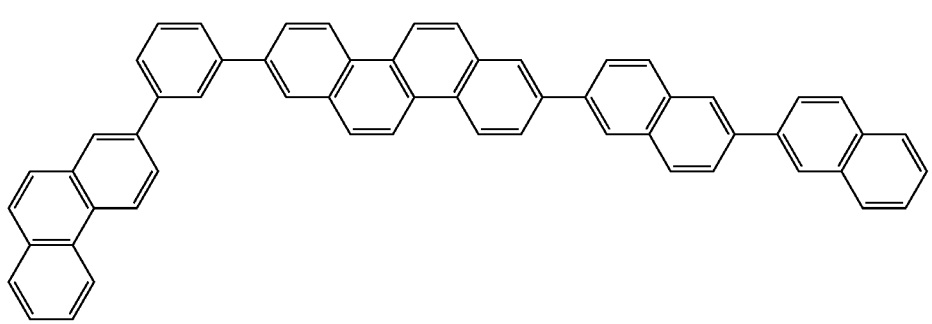

-continued
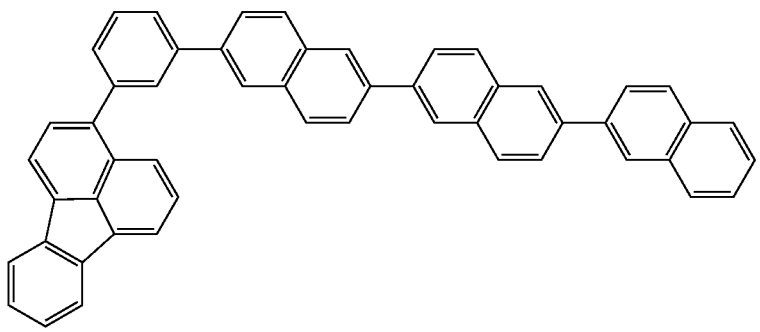
I-102
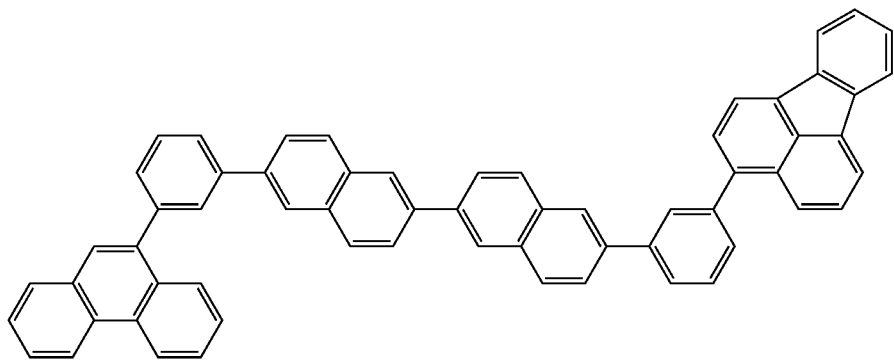
I-103
[Chem.34]
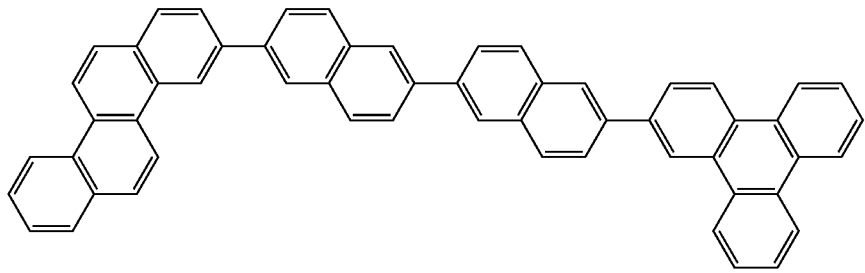
J-101
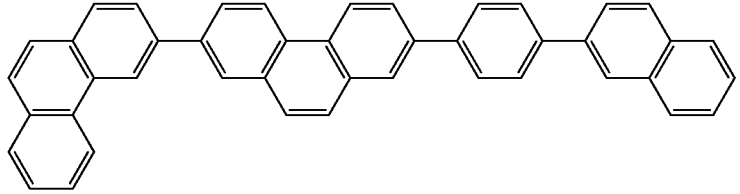
J-102
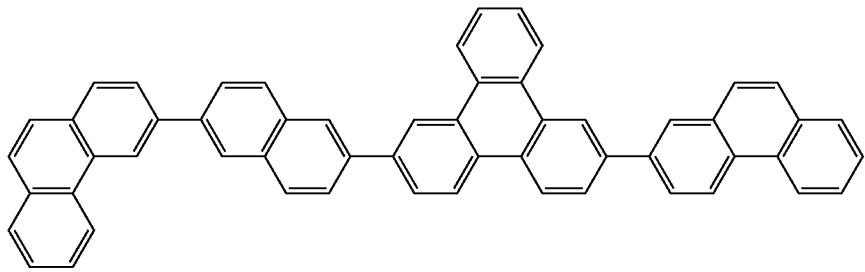
J-103

-continued
J-104
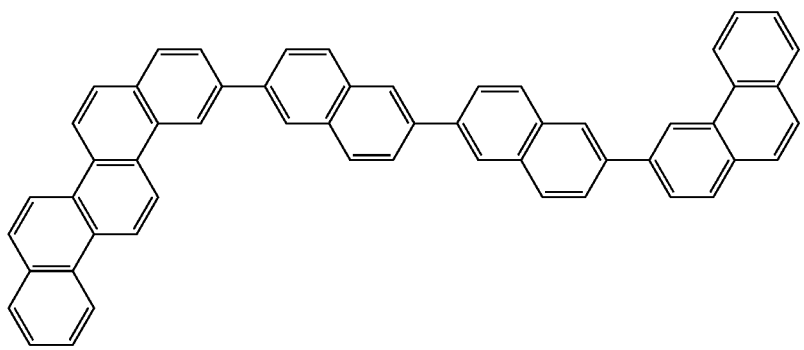
J-105
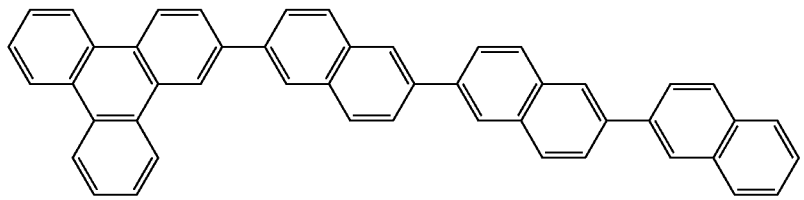
[Chem.35]
K-101  K-102
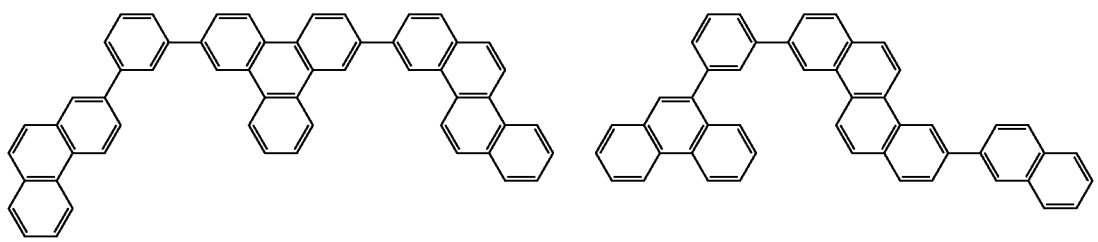
K-103  K-104
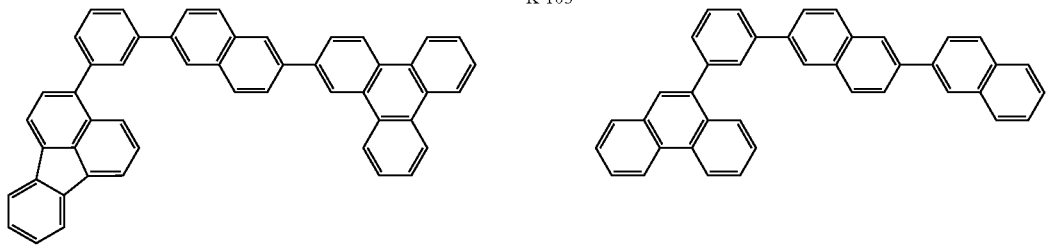
[Chem.36]
L-101  L-102
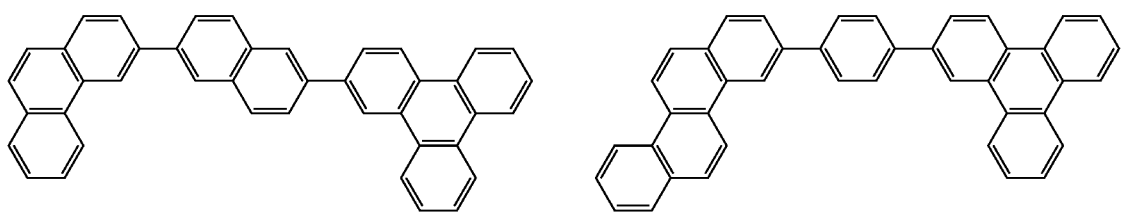
L-103  L-104
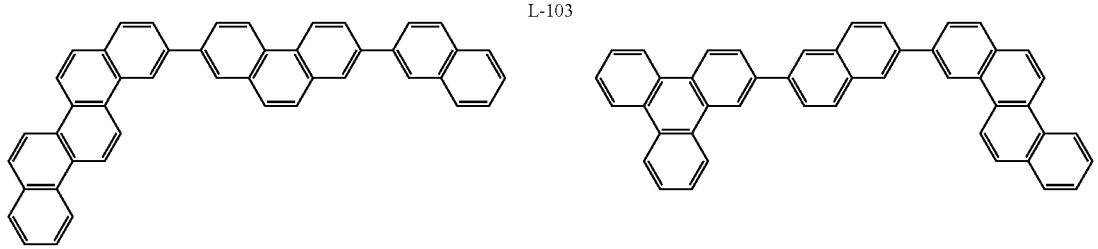

L-105

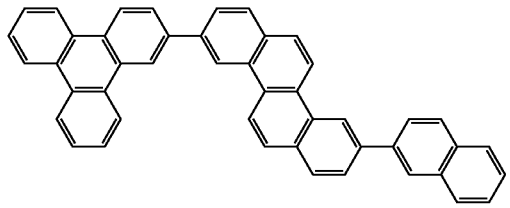

L-106

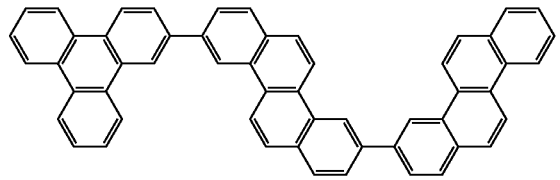

Examples of a compound that satisfies 1), 2), and p=q=1 and does not include an m-phenylene group include, but are not limited to, the compounds of Group X above. When an sp³ carbon is present, the HOMO level is raised, which facilitates hole injection. Since the compounds of Group X do not include an m-phenylene group, an unoccupied orbital is located only at the end of Ar7 or Ar10, which improves charge conductivity.

Examples of a compound that satisfies 1), 2), 5), and p=q=1 and does not include an m-phenylene group include, but are not limited to, the compounds of Group Y above. In materials of Group Y, the aryl groups at the both ends of the molecule are different from each other, which reduces the overlap among the materials. When an sp³ carbon is present, the HOMO level is raised, which facilitates hole injection. Since the compounds of Group Y do not include an m-phenylene group, an unoccupied orbital is located only at the end of Ar7 or Ar10, which improves charge conductivity.

Examples of a compound that satisfies 1), 2), 3), 4), and p=q=1 and includes an m-phenylene group include, but are not limited to, the compounds of Group A above. The compounds of Group A are composed of a hydrocarbon only and include only sp² carbons. Thus, the compounds of Group A are chemically stable, are less likely to change its structure, and therefore have a resistance to degradation. Since the compounds of Group A include an m-phenylene group, molecular orbitals are localized at Ar8 and Ar9 and an unoccupied orbital is located at Ar7 or Ar10, which reduces the overlap among the molecular orbitals.

Examples of a compound that satisfies 1), 2), 3), 4), and p=q=1 and does not include an m-phenylene group include, but are not limited to, the compounds of Group B above. The compounds of Group B are composed of a hydrocarbon only and include only sp² carbons. Thus, the compounds of Group B are chemically stable, are less likely to change its structure, and therefore have a resistance to degradation. Since the compounds of Group B do not include an m-phenylene group, an unoccupied orbital is located only at the end of Ar7 or Ar10, which improves charge conductivity.

Examples of a compound that satisfies 1), 2), 3), 4), p=1, and q=0 and includes an m-phenylene group include, but are not limited to, the compounds of Group C above. The compounds of Group C include less number of arylene groups than the compounds of a group in which p=q=1 and therefore tend to have a small molecular weight. In addition, the number of rotatable portions in the molecule is small, which increases sublimability and molecular stability. Since the compounds of Group C include an m-phenylene group, molecular orbitals are localized at Ar8 and Ar9 and an unoccupied orbital is located at Ar7 or Ar10, which reduces the overlap among the molecular orbitals.

Examples of a compound that satisfies 1), 2), 3), 4), p=1, and q=0 and does not include an m-phenylene group include, but are not limited to, the compounds of Group D above. The compounds of Group D include less number of arylene groups than the compounds of a group in which p=q=1 and therefore tend to have a small molecular weight. In addition, the number of rotatable portions in the molecule is small, which increases sublimability and molecular stability. Since the compounds of Group D do not include an m-phenylene group, an unoccupied orbital is located only at the end of Ar7 or Ar10, which improves charge conductivity.

Examples of a compound that satisfies 1), 2), 4), 5), and p=q=1 and includes an m-phenylene group include, but are not limited to, the compounds of Group E above. In materials of Group E, the aryl groups at the both ends of the molecule are different from each other, which reduces the overlap among the materials. When an sp³ carbon is present, the HOMO level is raised, which facilitates hole injection. Since the compounds of Group E include an m-phenylene group, molecular orbitals are localized at Ar8 and Ar9 and an unoccupied orbital is located at Ar7 or Ar10, which reduces the overlap among the molecular orbitals.

Examples of a compound that satisfies 1), 2), 4), 5), and p=q=1 and does not include an m-phenylene group include, but are not limited to, the compounds of Group F above. In materials of Group F, the aryl groups at the both ends of the molecule are different from each other, which reduces the overlap among the materials. When an sp³ carbon is present, the HOMO level is raised, which facilitates hole injection. Since the compounds of Group F do not include an m-phenylene group, an unoccupied orbital is located only at the end of Ar7 or Ar10, which improves charge conductivity.

Examples of a compound that satisfies 1), 2), 4), 5), p=1, and q=0 and includes an m-phenylene group include, but are not limited to, the compounds of Group G above. The compounds of Group G include less number of arylene groups than the compounds of a group in which p=q=1 and therefore tend to have a small molecular weight, which increases sublimability and molecular stability.

In materials of Group G, the aryl groups at the both ends of the molecule are different from each other, which reduces the overlap among the materials. When an sp³ carbon is present, the HOMO level is raised, which facilitates hole injection. Since the compounds of Group G include an m-phenylene group, molecular orbitals are localized at Ar8 and Ar9 and an unoccupied orbital is located at Ar7 or Ar10, which reduces the overlap among the molecular orbitals.

Examples of a compound that satisfies 1), 2), 4), 5), p=1, and q=0 and does not include an m-phenylene group include, but are not limited to, the compounds of Group H above. The compounds of Group H include less number of arylene groups than the compounds of a group in which p=q=1 and therefore tend to have a small molecular weight, which increases sublimability and molecular stability.

In materials of Group H, the aryl groups at the both ends of the molecule are different from each other, which reduces the overlap among the materials. When an sp³ carbon is present, the HOMO level is raised, which facilitates hole injection. Since the compounds of Group H do not include an m-phenylene group, an unoccupied orbital is located only at the end of Ar7 or Ar10, which improves charge conductivity.

Examples of a compound that satisfies 1), 2), 3), 4), 5), and p=q=1 and includes an m-phenylene group include, but are not limited to, the compounds of Group I above. The compounds of Group I are stable and less likely to change its structure in the radical state or in the excited state and the aryl groups at the both ends of the molecule are different from each other, which reduces the overlap among the materials. Since the compounds of Group I include an m-phenylene group, molecular orbitals are localized at Ar8 and Ar9 and an unoccupied orbital is located at Ar7 or Ar10, which reduces the overlap among the molecular orbitals.

Examples of a compound that satisfies 1), 2), 3), 4), 5), and p=q=1 and does not include an m-phenylene group include, but are not limited to, the compounds of Group J above. The compounds of Group J are stable and less likely to change its structure in the radical state or in the excited state and the aryl groups at the both ends of the molecule are different from each other, which reduces the overlap among the materials. Since the compounds of Group J do not include an m-phenylene group, an unoccupied orbital is located only at the end of Ar7 or Ar10, which improves charge conductivity.

Examples of a compound that satisfies 1), 2), 3), 4), 5), p=1, and q=0 and includes an m-phenylene group include, but are not limited to, the compounds of Group K above. The compounds of Group K also have the above-described properties and include less number of arylene groups than the compounds of a group in which p=q=1 and therefore tend to have a small molecular weight. In addition, the number of rotatable portions in the molecule is small, which increases sublimability and molecular stability. Since the compounds of Group K include an m-phenylene group, molecular orbitals are localized at Ar8 and Ar9 and an unoccupied orbital is located at Ar7 or Ar10, which reduces the overlap among the molecular orbitals.

Examples of a compound that satisfies 1), 2), 3), 4), 5), p=1, and q=0 and does not include an m-phenylene group include, but are not limited to, the compounds of Group L above. The compounds of Group L also have the above-described properties and include less number of arylene groups than the compounds of a group in which p=q=1 and therefore tend to have a small molecular weight. In addition, the number of rotatable portions in the molecule is small, which increases sublimability and molecular stability. Since the compounds of Group L do not include an m-phenylene group, an unoccupied orbital is located only at the end of Ar7 or Ar10, which improves charge conductivity.

In addition to the above-described host material and the iridium complex that serves as a light-emitting material, the light-emitting layer may include another organic compound as a third component. In this case, the third component may be the following material.

A) A material having a higher HOMO level than a host material that is a hydrocarbon: A material having this characteristic has a high HOMO level and thus facilitates hole-injection and hole-transportation into a light-emitting layer. This results in a reduction in the driving voltage of the light-emitting device and reduces formation of an excessive anionic state of the light-emitting material, which increases the operating life of the light-emitting device. The expression "the HOMO level is high" is, in other words, e.g., "the HOMO level is deep", "the HOMO level is far from the vacuum level", or "the absolute value of the HOMO level is large". The same is true for the LUMO level.

Examples of such a compound include, but are not limited to, the compounds below.

The following compounds are amine-containing compounds, which have a high hole-injection/transportation capability.

[Chem. 37]

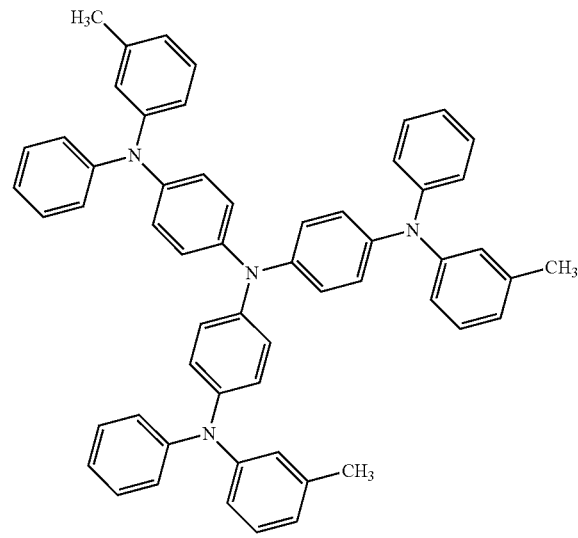

M-101

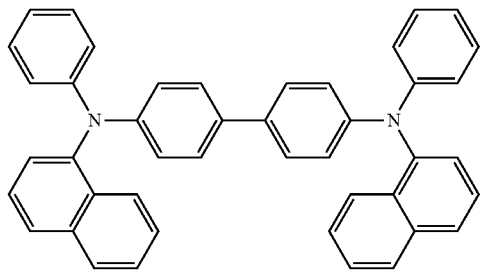

M-102

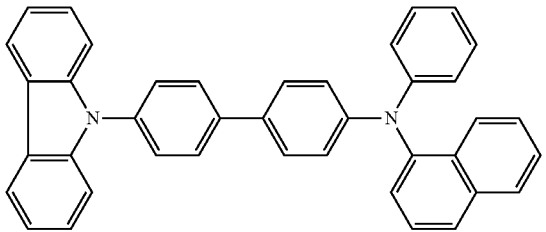

M-103

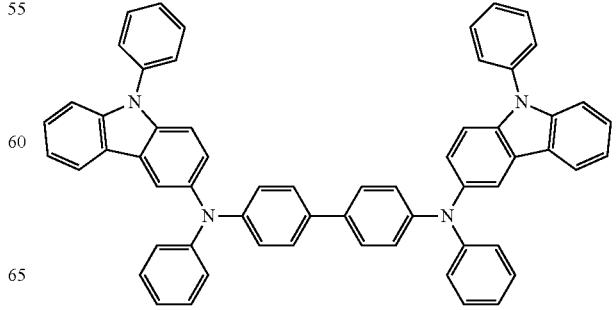

M-104

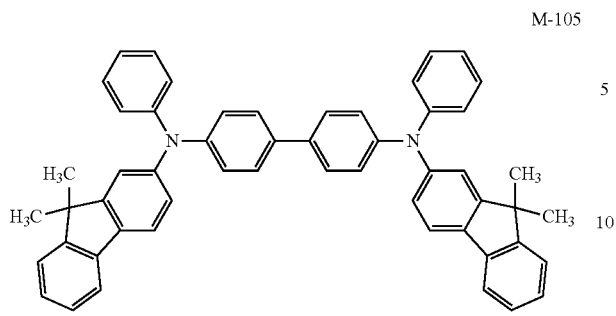

M-105

The following compounds are metal complex compounds, which have a smaller delta S-T than a hydrocarbon. Thus, the band gap is small and thereby charge transportation is improved. In addition, a metal complex containing a heavy metal has a long holding time at T1, which allows the energy received from the host material to be transferred to the light-emitting material efficiently.

[Chem. 38]

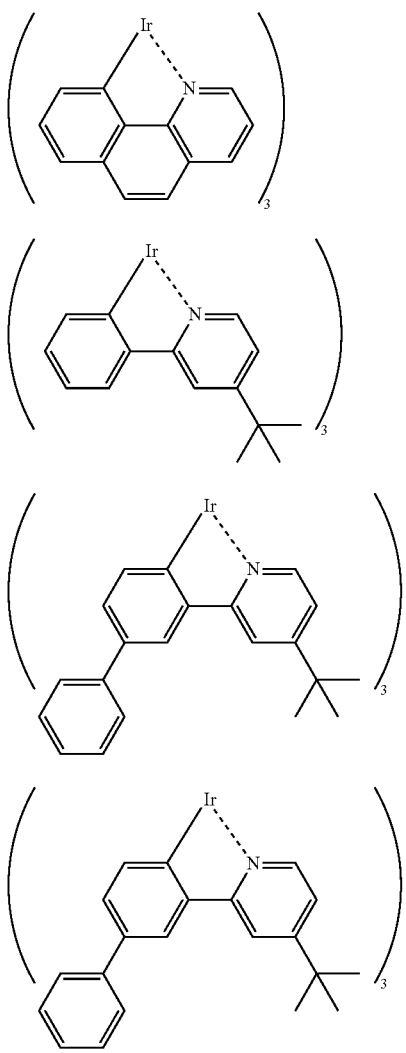

N-101

N-102

N-103

N-104

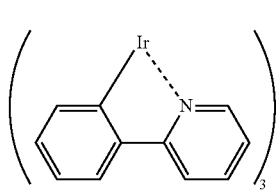

N-105

B) A material having smaller (deeper) energy of the LUMO level than the host material that is a hydrocarbon: The host material according to the present invention has a larger (shallower) energy of the LUMO level than the light-emitting material according to the present invention. Thus, addition of a third component having a higher LUMO level than the host material reduces formation of an excessive anionic state of the light-emitting material, which increases the operating life of the light-emitting device.

Examples of such a compound include, but are not limited to, the compounds below.

[Chem. 39]

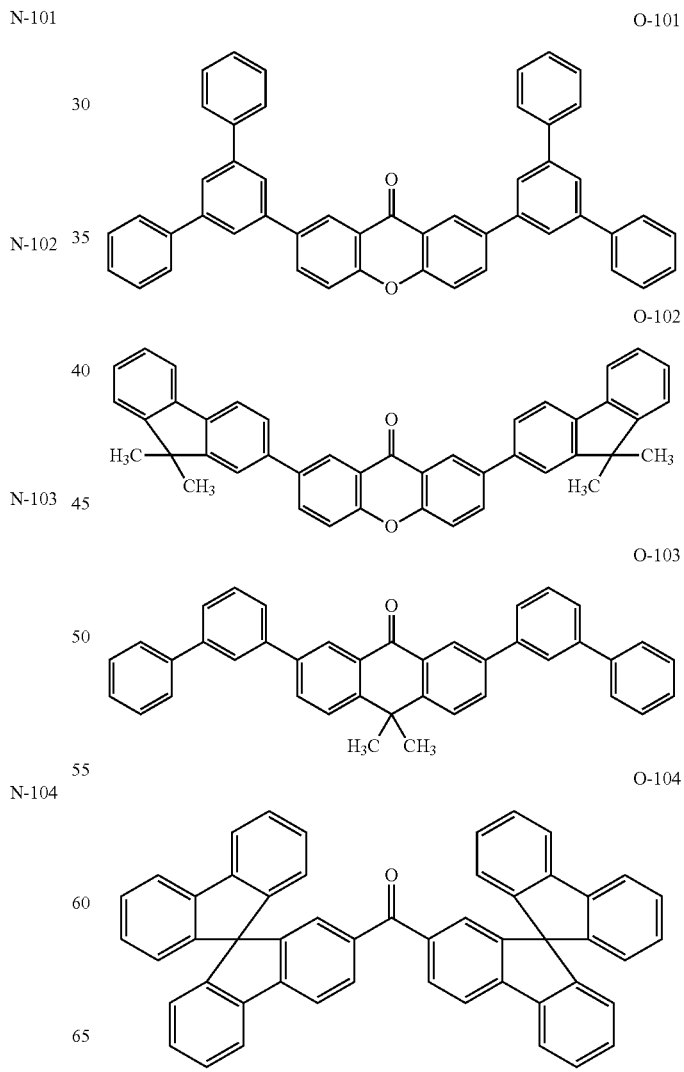

O-101

O-102

O-103

O-104

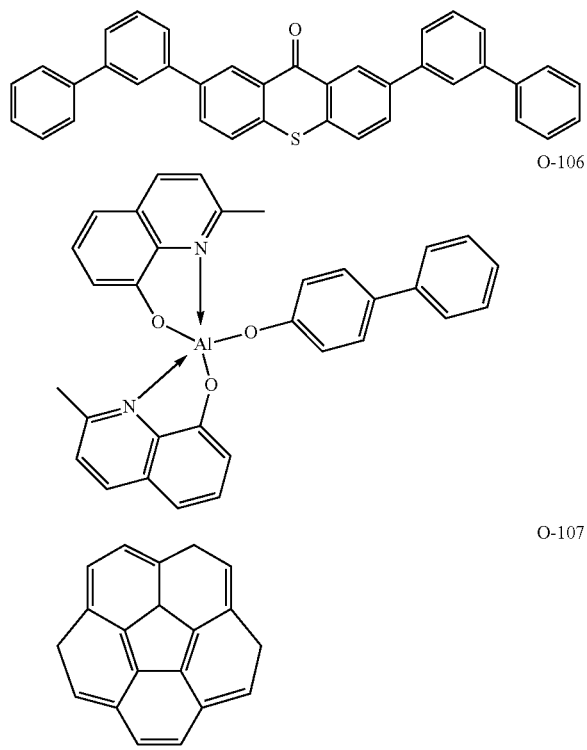

C) A material having a larger energy of the HOMO level than the host material and a smaller energy of the LUMO level than the host material: Addition of a third component having this characteristic facilitates hole injection and reduces electron trap formed by the light-emitting material. This increases the operating life of the light-emitting device.

Description of Organic Light-emitting Device

The organic light-emitting device according to the present invention is described below.

The organic light-emitting device according to the present invention includes a pair of electrodes (an anode and a cathode) and an organic-compound layer interposed between the electrodes. The organic-compound layer includes the organic compound represented by Formula [1]. When carriers are injected from the anode and cathode, excitons of a luminescent organic compound in the organic-compound layer are formed. The organic light-emitting device emits light when the excitons transit to the ground state.

Among the compounds constituting the light-emitting layer, a compound having the largest weight fraction is referred to as a main component and compounds having a smaller weight fraction than the main component are referred to as sub components.

A material that is the main component is also referred to as host material.

An example of a material that is the sub component is a dopant (guest) material. Other examples of the sub component include a light-emission-assist material and a charge-injection material.

The organic compound according to the present invention is a light-emitting material (guest material). The content of the guest material in the host material is preferably 0.1 wt % or more and 20 wt % or less and more preferably 1 wt % or more and 15 wt % or less.

The inventors of the present invention have performed extensive studies and have found that an organic light-emitting device that includes a light-emitting layer including the organic compound (light-emitting material) according to the present invention represented by Formula [1] and that includes the compound (host material) represented by Formula [5] emits light with high efficiency and high brightness and has a markedly high durability.

Examples of an organic light-emitting device including the organic compound according to the present invention are described below.

Examples of an organic light-emitting device prepared using the organic compound according to the present invention include the following:

i) an organic light-emitting device including an anode, a light-emitting layer, and a cathode that are stacked on or above a substrate in this order;

ii) an organic light-emitting device including an anode, a hole-transportation layer, an electron-transportation layer, and a cathode that are stacked on or above a substrate in this order;

iii) an organic light-emitting device including an anode, a hole-transportation layer, a light-emitting layer, an electron-transportation layer, and a cathode that are stacked on or above a substrate in this order;

iv) an organic light-emitting device including an anode, a hole-injection layer, a hole-transportation layer, a light-emitting layer, an electron-transportation layer, and a cathode that are stacked on or above a substrate in this order; and v) an organic light-emitting device including an anode, a hole-transportation layer, a light-emitting layer, a hole-exciton-blocking layer, an electron-transportation layer, and a cathode that are stacked on or above a substrate in this order.

Note that the above-described five multilayered organic light-emitting devices are just examples of an organic light-emitting device having a basic structure and the structure of an organic light-emitting device prepared with the compound according to the present invention is not limited to these five examples. The organic light-emitting device may have various layer structures. For example, an insulating layer may be interposed at the interface between an electrode and an organic-compound layer. The organic light-emitting device may include an adhesive layer or an interference layer. The electron-transportation layer or the hole-transportation layer may be constituted by two layers having different ionization potentials with each other.

The organic compound according to the present invention represented by Formula [1] is used as the light-emitting layer of the light-emitting device. The type of the light-emitting device may be a bottom-emission type in which light is emitted from an electrode on a substrate-side or a top-emission type in which light is emitted from a side opposite to the substrate-side. A light-emitting device may alternatively have a structure in which light is emitted from the both sides or a tandem structure in which a plurality of organic light-emitting devices are stacked on top of one another.

The organic light-emitting device according to the present invention may include a publicly-known compound as needed in addition to the organic compound according to the present invention. Examples of such a compound include a compound having a hole-injection capability, a compound having a hole-transportation capability, a host compound that can be used as a host material, a light-emitting compound, a compound having an electron-injection capability, and a compound having an electron-transportation capability. These compounds may be low-molecular weight compounds or high-molecular weight compounds.

Examples of these compounds are described below.

The material having a positive-hole-injection/transportation capability may be a material that facilitates injection of positive holes from an anode and that has a high mobility of positive holes that facilitates transportation of the injected positive holes to the light-emitting layer. In addition, a material having a high glass transition temperature may be used in order to suppress degradation of the film quality of the light-emitting device caused by crystallization or the like. Examples of low-molecular weight and high-molecular weight materials having the positive-hole-injection/transportation capability include a triarylamine derivative, an aryl-carbazole derivative, a phenylenediamine derivative, a stilbene derivative, a phthalocyanine derivative, a porphyrin derivative, poly(vinylcarbazole), poly(thiophene), and other high-molecular weight compounds having a conductivity. These materials having the positive-hole-injection/transportation capability may also be suitably used as an electron-blocking layer.

Specific examples of compounds used as the material having the positive-hole-injection/transportation capability include, but are not limited to, the compounds below.

[Chem.40]

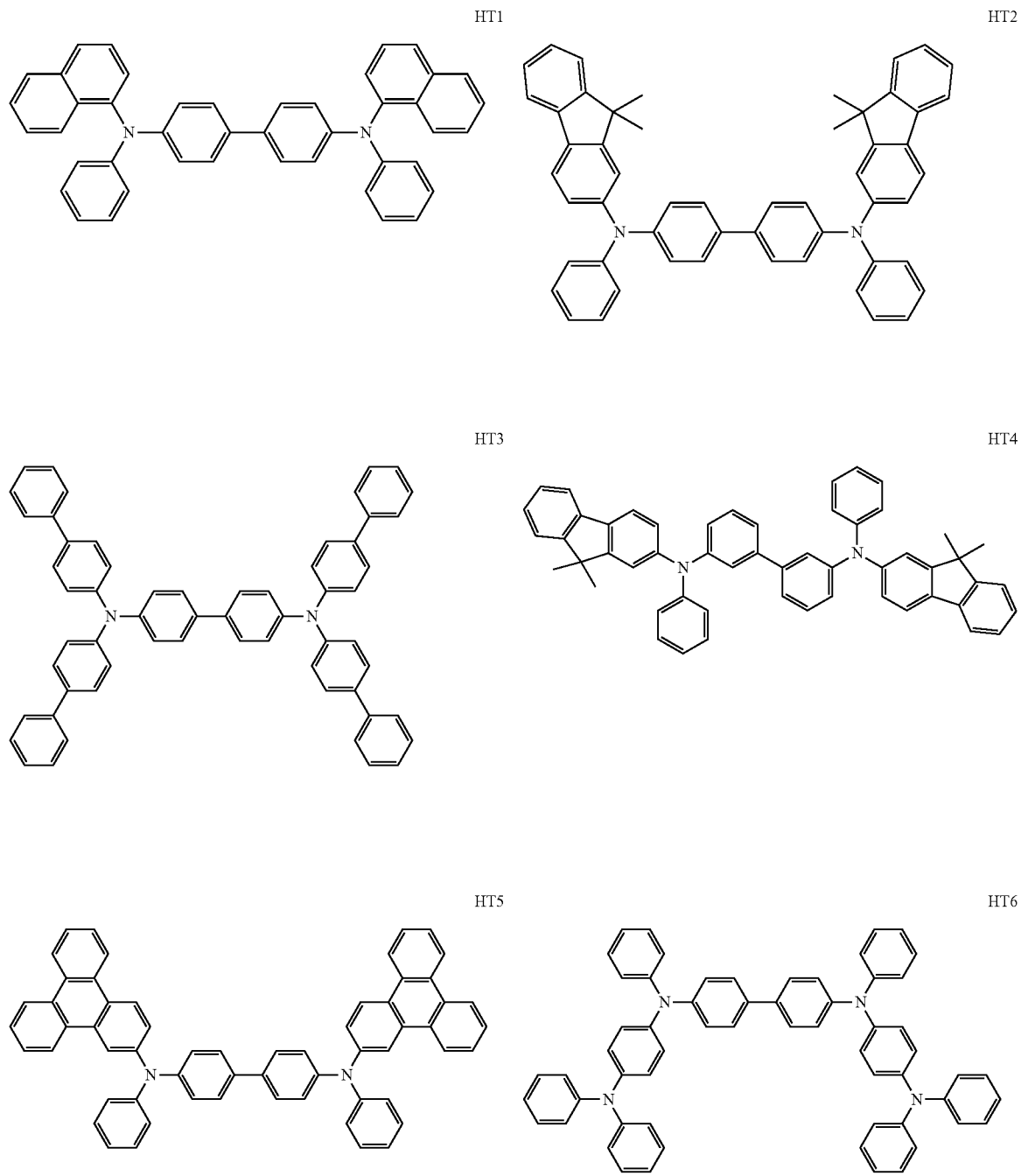

-continued
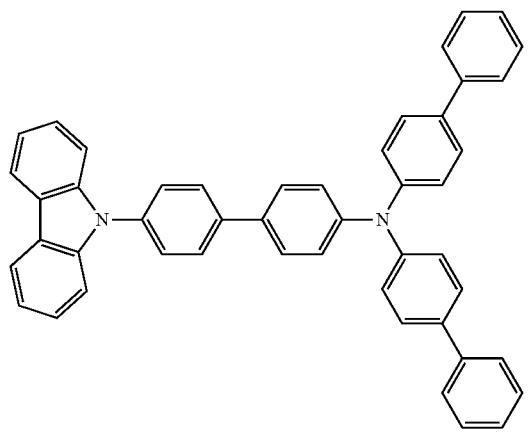
HT7
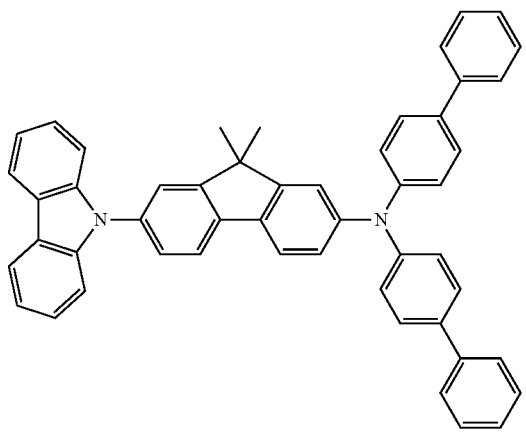
HT8
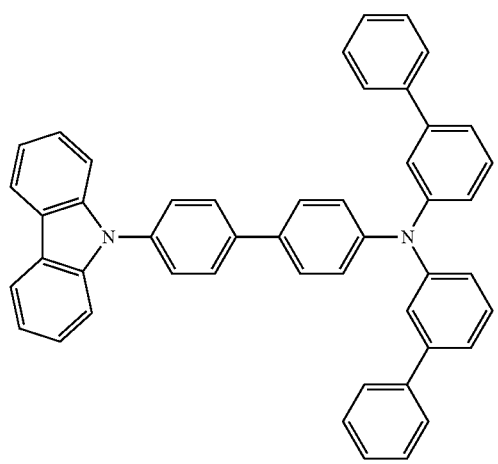
HT9
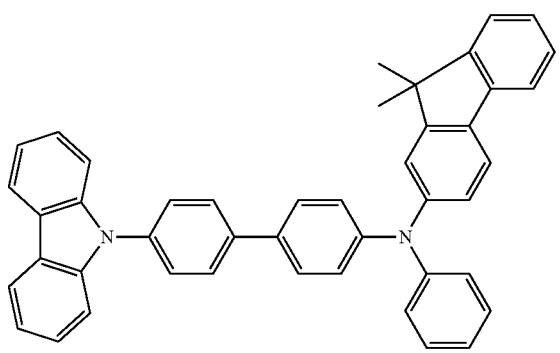
HT10
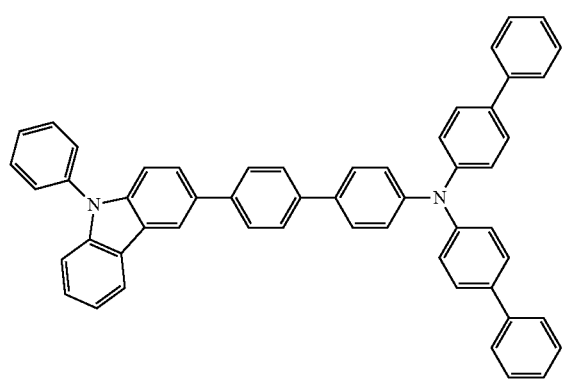
HT11
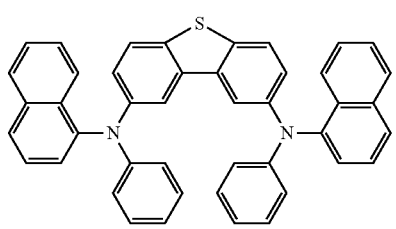
HT12

HT13

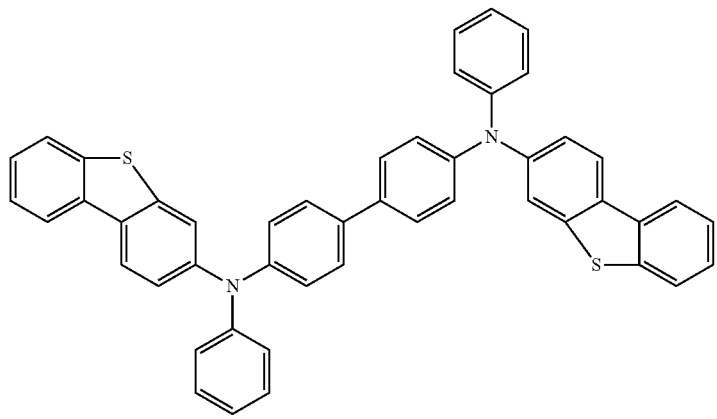

HT14

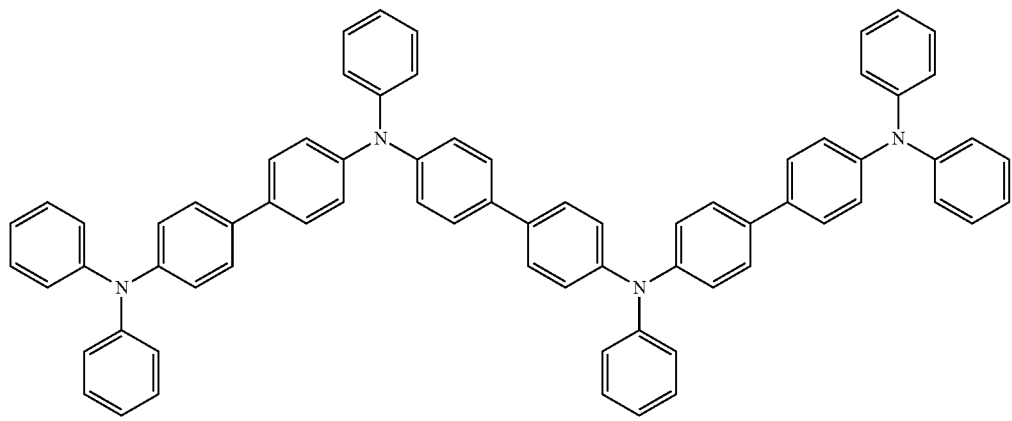

Examples of the light-emitting material that mainly contributes to the light-emitting function include, in addition to the iridium complex according to the present invention and its derivatives, condensed ring compounds (e.g., a fluorene derivative, a naphthalene derivative, a pyrene derivative, a perylene derivative, a tetracene derivative, an anthracene derivative, and rubrene), a quinacridone derivative, a coumalin derivative, a stilbene derivative, an organoaluminium complex such as tris(8-quinolinolato)aluminium, a platinum complex, a rhenium complex, a copper complex, an europium complex, a ruthenium complex, and high-molecular-weight derivatives such as a poly(phenylenevinylene) derivative, a poly(fluorene) derivative, and a poly(phenylene) derivative.

Specific examples of compounds used as the light-emitting material include, but are not limited to, the compounds below.

[Chem.41]

BD1

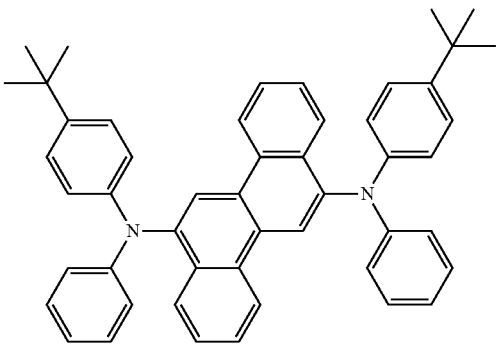

BD2
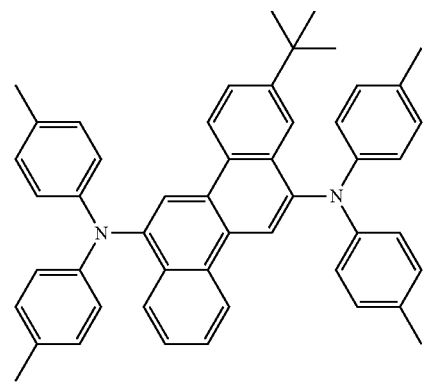
BD3
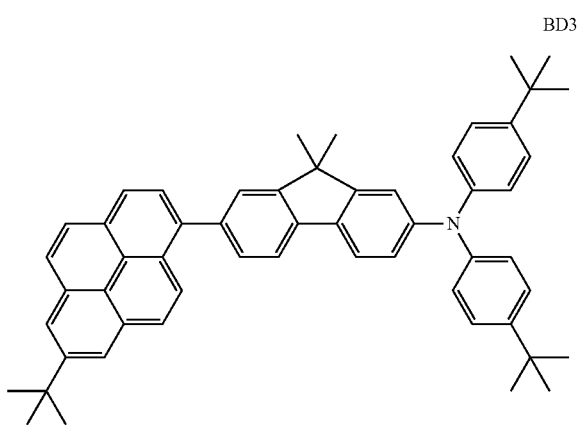
BD4
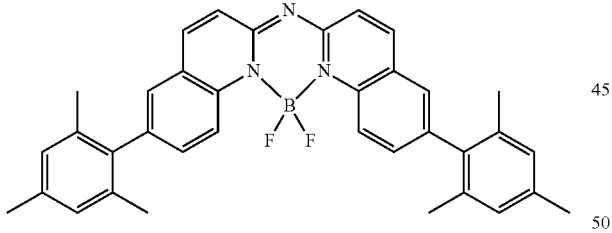
BD5
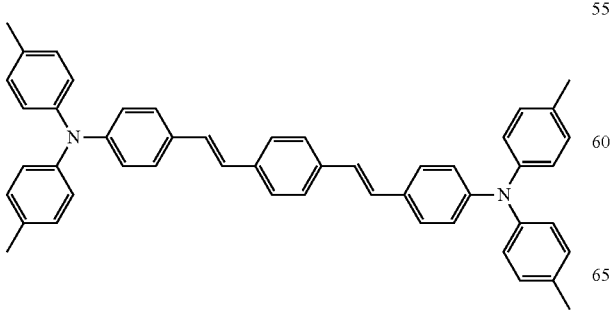
BD6
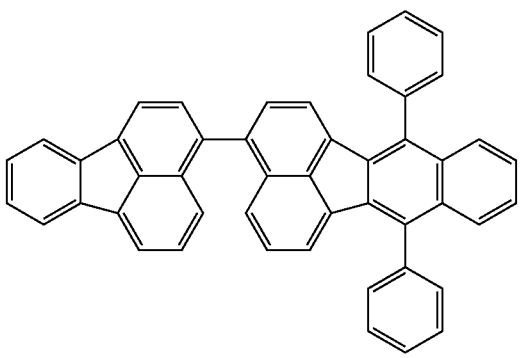
BD7
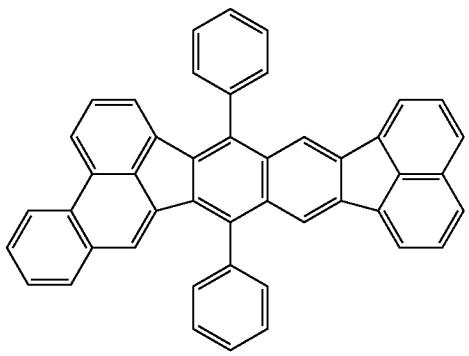
BD8
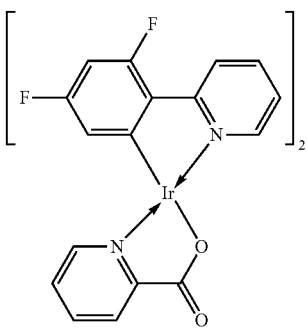
GD1
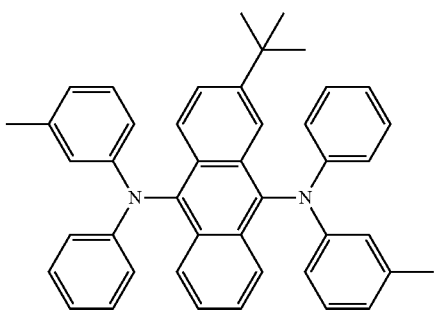
GD2
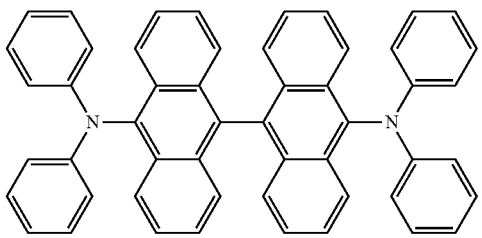

-continued
GD3
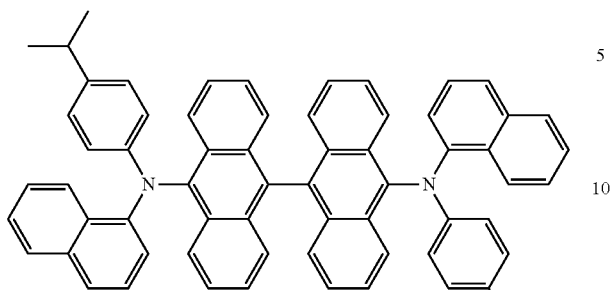
GD4
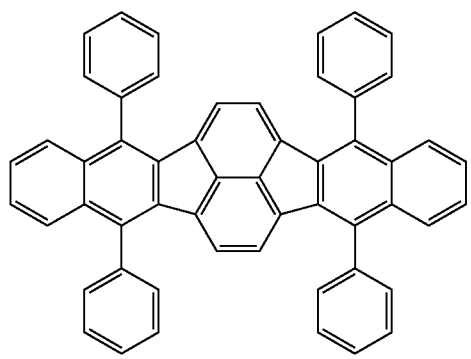
GD5
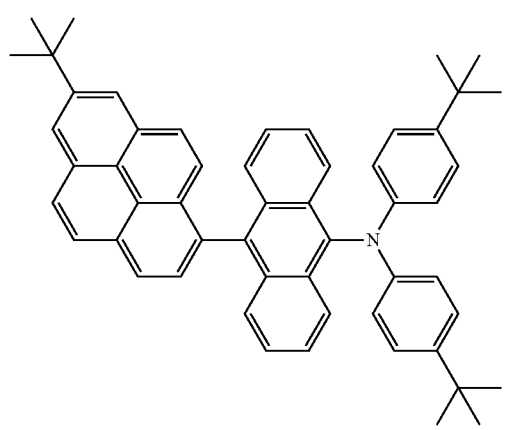
GD6
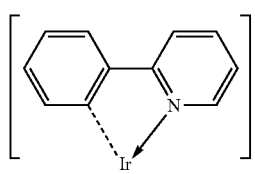
GD7
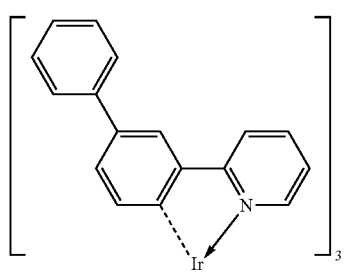
-continued
GD8
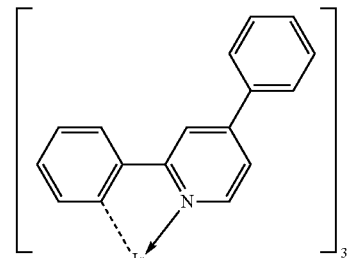
RD1
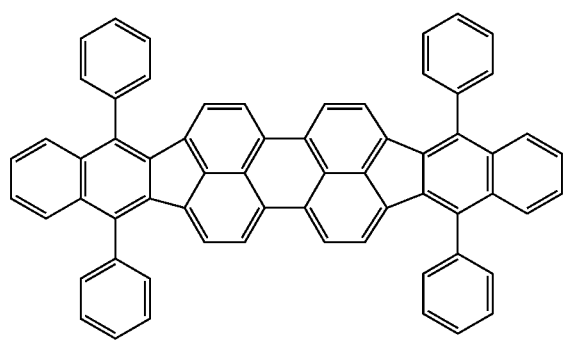
RD2
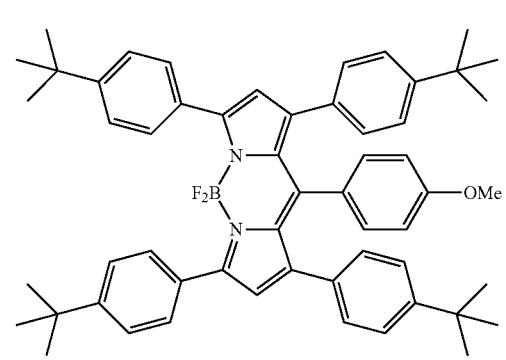
RD3
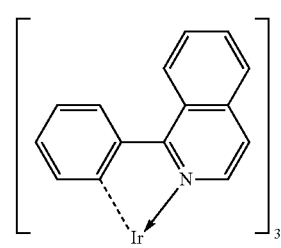
RD4
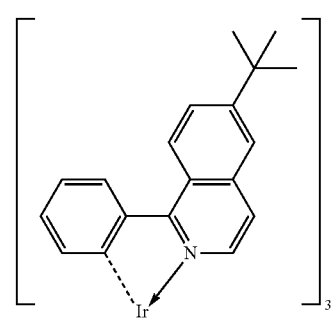

RD5

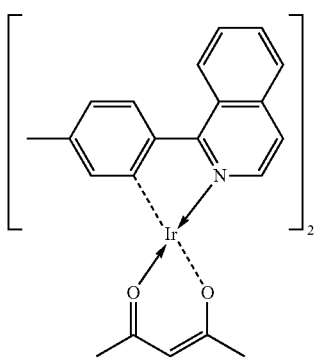

RD6

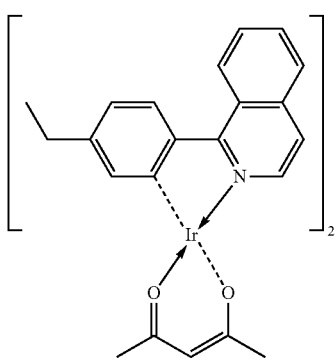

RD7

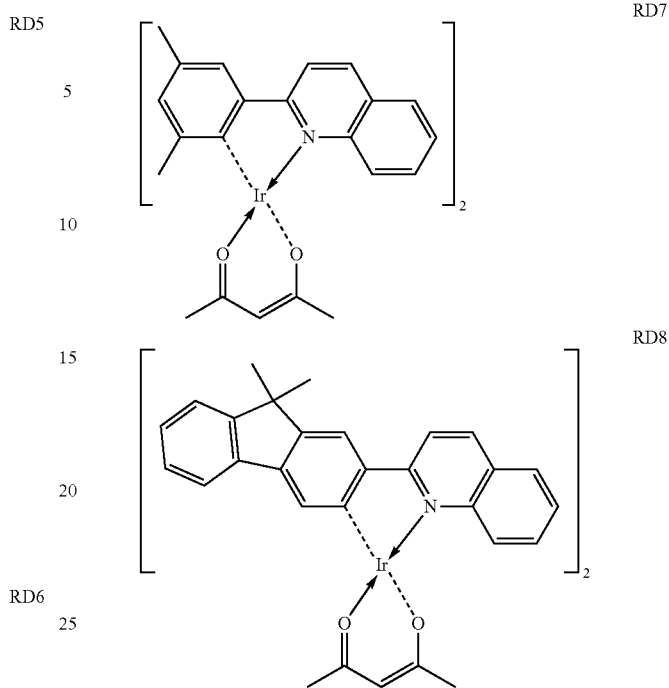

RD8

Examples of the host material and the assist material of the light-emitting layer include, in addition to the heterocyclic compounds according to the present invention, an aromatic hydrocarbon and its derivative, a carbazole derivative, a dibenzofuran derivative, a dibenzothiophene derivative, an organoaluminium complex such as tris(8-quinolinolato)aluminium, and an organoberyllium complex.

Specific examples of compounds used as the host material and the light-emitting-assist material of the light-emitting layer include, but are not limited to, the compounds below.

[Chem.42]

EM1

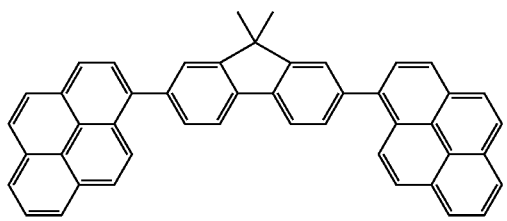

EM2

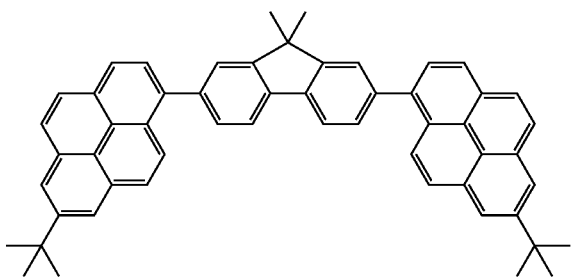

EM3

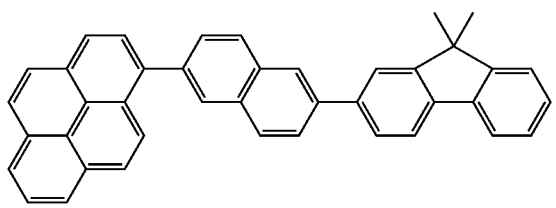

EM4

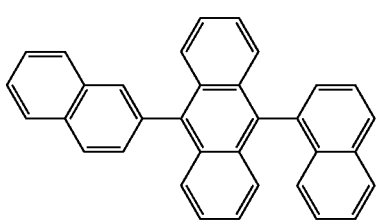

-continued

EM5
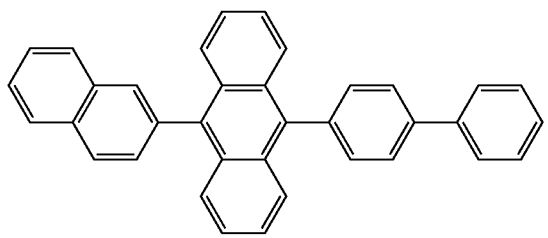

EM6
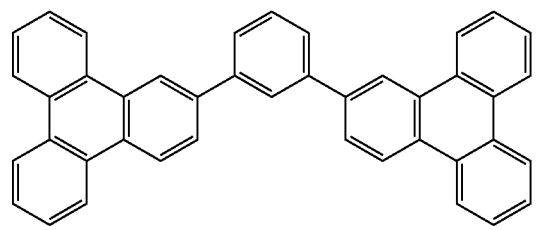

EM7
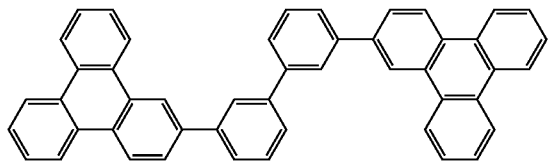

EM8
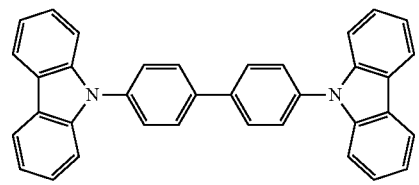

EM9
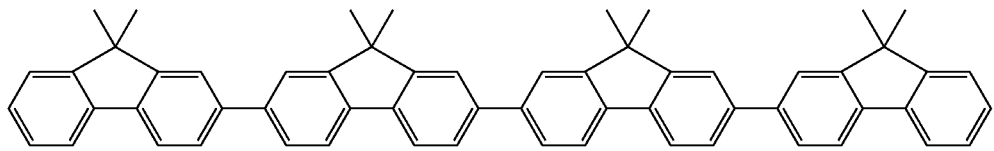

EM10
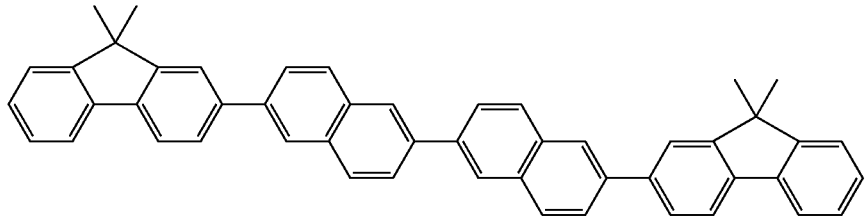

EM11
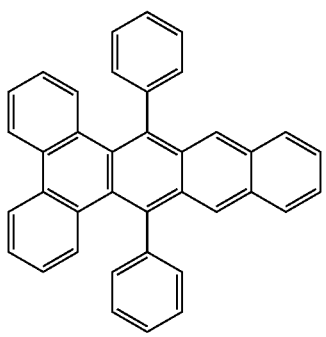

EM12
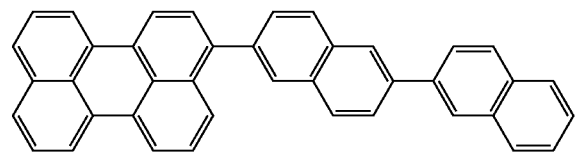

EM13
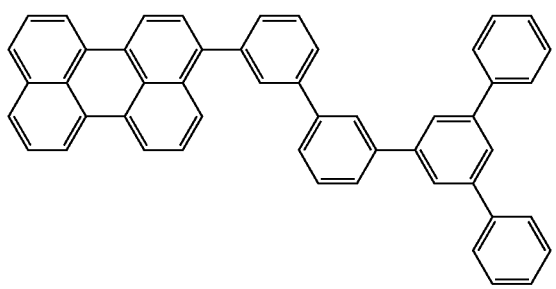

EM14
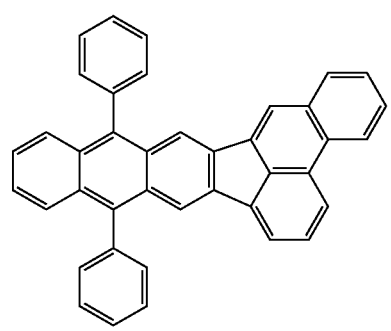

The material having an electron-injection/transportation capability may be appropriately selected from materials that facilitate injection of electrons from an cathode and allow the injected electrons to be transported to the light-emitting layer with consideration of, for example, the balance between the electron-transportation capability of the material and the mobility of positive holes of the material having the positive-hole-transporting capability. Examples of the material having the electron-injection capability and the electron-transportation capability include, an oxadiazole derivative, an oxazole derivative, a pyrazine derivative, a triazole derivative, a triazine derivative, a quinoline derivative, a quinoxaline derivative, a phenanthroline derivative, and organoaluminium complex. These materials having the electron-injection/transportation capability may be suitably used as a positive-hole-blocking layer.

Specific examples of compounds used as the material having the electron-injection/transportation capability include, but are not limited to, the compounds below.

[Chem. 43]

ET2

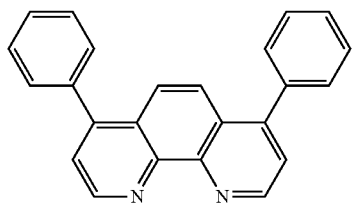

ET2

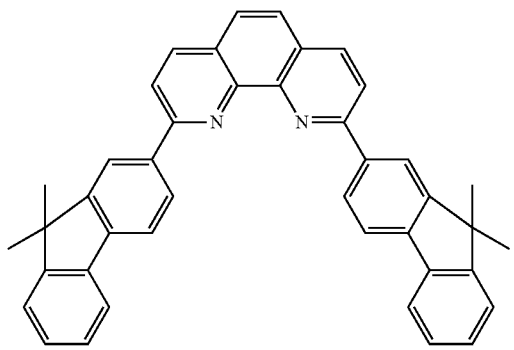

ET3

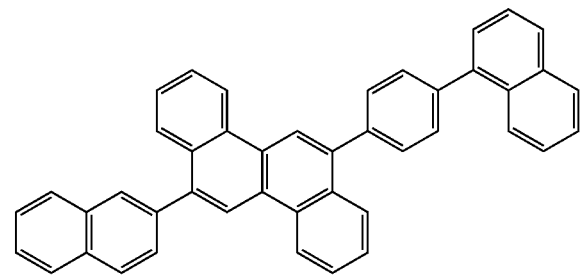

ET4

ET5

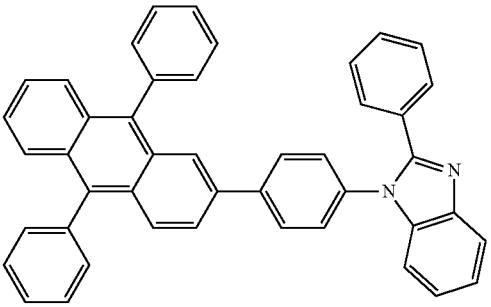

ET6

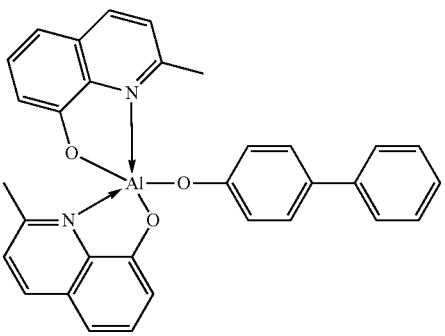

ET7

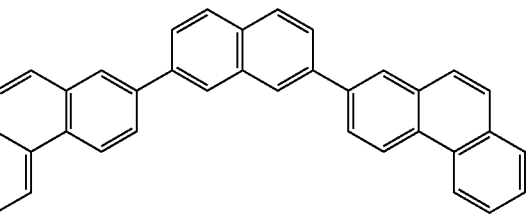

ET8

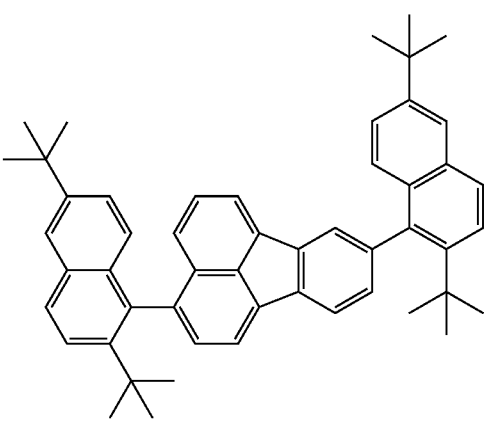

These materials may be used as a mixture with an alkali metal or an alkaline-earth metal, such as LiF, KF, $Cs_2CO_3$, or CsF.

The work function of a material used as an anode may be as large as possible. Examples of such a material include single-element metals such as gold, platinum, silver, copper, aluminium, molybdenum, nickel, palladium, cobalt, selenium, vanadium, and tungsten; alloys thereof; and metal oxides such as tin oxide, zinc oxide, iridium oxide, indium oxide, indium tin oxide (ITO), indium zinc oxide (IZO), and indium gallium zinc oxide (IGZO). In particular, a transparent oxide semiconductor composed of ITO, IZO, or IGZO has high mobility of positive holes and is therefore suitably used as an electrode material. The host material or the light-emitting material according to the present invention may be suitably stacked on a thin-film transistor (TFT) device including this transparent oxide semiconductor. In this case, the mobility of positive holes is increased, which results in high video features and power-saving features of the TFT device. Conductive polymers such as polyaniline, polypyrrole, and polythiophene may be alternatively used as the electrode material. These electrode materials may be used alone or in combination with two or more. The anode may have a single-layer structure or a multilayered structure.

On the other hand, the work function of a material used as a cathode may be as small as possible. Examples of such a material include single-element metals such as alkali metals (e.g., lithium), alkaline-earth metals (e.g., calcium), aluminium, titanium, manganese, silver, lead, and chromium; alloys of these single-element metals such as magnesium-silver, aluminium-lithium, and aluminium-magnesium; and metal oxides such as indium tin oxide (ITO). These electrode materials may be used alone or in combination with two or more. The cathode may have a single-layer structure or a multilayered structure.

A layer including the organic compound according to the present invention and a layer including a compound other than the organic compound according to the present invention, which are used for producing the organic-light emitting device according to the present invention, are generally formed into a thin film by a vacuum deposition method, an ionized vapor deposition method, a sputtering method, a plasma method, or a transferring method. In another case, the material of the layer is dissolved in a solvent appropriate to the material and formed into a thin film by a publicly-known coating method such as a spin-coating method, a dipping method, a casting method, a LB method, or an inkjet method. Layers formed by a vapor deposition method, the solution coating method, or the like are less likely to cause crystallization or the like and therefore have high temporal stability. When a solution coating method is employed, the material of the layer may be combined with an appropriate binder resin.

Examples of the binder resin include, but are not limited to, a polyvinylcarbazole resin, a polycarbonate resin, a polyester resin, an acrylonitrile-butadiene-styrene (ABS) resin, an acrylic resin, a polyimide resin, a phenolic resin, an epoxy resin, a silicone resin, and a urea resin. These binder resins may be used alone as a homopolymer or a copolymer or may be used as a mixture with two or more. Optionally, publicly-known additives such as a plasticizer, an antioxidant, and a ultraviolet absorber may be used.

Applications of Organic Light-emitting Device

The organic light-emitting device according to the present invention may be used as a component of a display apparatus or a lighting apparatus. Other applications include an exposure light source of an electrophotographic image-forming apparatus, a backlight of a liquid crystal display, and a light fixture.

The organic light-emitting device according to the present invention may further include a color filter.

The display apparatus according to the present invention includes a display unit including a plurality of pixels each including the organic light-emitting device according to the present invention.

The pixels each include the organic light-emitting device according to the present invention and an active device. An example of the active device is a switching device for controlling the emission brightness. An example of the switching device is a TFT device.

The anode and cathode of the organic light-emitting device included in each pixel are connected to the drain electrode or the source electrode of the TFT device. The display apparatus may be used as an image display apparatus of a personal computer (PC). The TFT device is disposed on the insulated surface of a substrate.

The display apparatus may include an input unit for inputting image information sent from an area CCD, a linear CCD, or a memory card and display the received image on its display unit.

The display units of the image-processing apparatus and the image-forming apparatus may have touch-panel system. The display apparatus may be used as a display unit of a multifunction printer.

A lighting apparatus is used for, for example, lighting a room and may emit light of any color, such as white, neutral white, or any other color selected from blue to red.

The lighting apparatus according to the present invention includes the organic light-emitting device according to the present invention and an AC/DC converter circuit connected to the organic light-emitting device. The lighting apparatus may further include a color filter.

The AC/DC converter circuit constituting the lighting apparatus according to the present invention is a circuit for converting the alternating-current voltage to the direct-current voltage.

The image-forming apparatus according to the present invention includes a photosensitive member, a charging unit for charging the surface of the photosensitive member, an exposure unit for exposing the photosensitive member to form an electrostatic latent image, and a developer for developing the electrostatic latent image formed on the surface of the photosensitive member. The exposure unit included in the image-forming apparatus includes the organic light-emitting device according to the present invention.

The display apparatus according to the present invention is described with reference to the attached drawing. The FIGURE is a schematic cross-sectional view illustrating an example of a display apparatus including an organic light-emitting device and a TFT device connected to the organic light-emitting device. The organic light-emitting device constituting the display apparatus 1 shown in the FIGURE is the organic light-emitting device according to the present invention.

The display apparatus 1 shown in the FIGURE includes a substrate 11 composed of glass or the like and a dampproof film 12 disposed on the upper surface of the substrate 11 in order to protect a TFT device or an organic-compound layer. The reference numeral 13 denotes a gate electrode 13 composed of a metal. The reference numeral 14 denotes a gate insulation film. The reference numeral 15 denotes a semiconductor layer.

A TFT device 18 includes the semiconductor layer 15, a drain electrode 16, and a source electrode 17. An insulation film 19 is disposed on the upper surface of the TFT device 18. The source electrode 17 is connected to an anode 21, which constitutes the organic light-emitting device, through a contact hole 20.

The mode of the electrical connection between the electrode (anode or cathode) included in the organic light-emitting device and the electrode (source electrode or drain electrode) included in the TFT device is not limited to the mode shown in the FIGURE. In other words, any mode of the electrical connection may be employed as long as either the anode or the cathode is electrically connected to the source electrode or the drain electrode of the TFT device.

In the display apparatus 1 shown in the FIGURE, a plurality of organic-compound layers are illustrated as a single layer. An organic-compound layer 22 may be a plurality of layers. A first protection layer 24 and a second protection layer 25 are disposed on a cathode 23 in order to suppress degradation of the organic light-emitting device.

When the display apparatus 1 shown in the FIGURE is a display apparatus that emits white light, the light-emitting layer included in the organic-compound layer 22 shown in the FIGURE may be formed by mixing a red-light-emitting material, a green-light-emitting material, and a blue-light-emitting material. Alternatively, a layer composed of the red-light-emitting material, a layer composed of the green-light-emitting material, and a layer composed of the blue-light-emitting material may be stacked on top of one another to form a multilayered light-emitting layer. In another case, the layer composed of the red-light-emitting material, the layer composed of the green-light-emitting material, and the layer composed of the blue-light-emitting material may be arranged horizontally to form domains in one light-emitting layer.

Although the switching device of the display apparatus 1 shown in the FIGURE is a transistor, alternatively, a metal-insulator-metal (MIM) device may be used as the switching device.

The transistor of the display apparatus 1 shown in the FIGURE is not limited to a transistor including a single-crystal silicon wafer but may also be a thin-film transistor including an active layer on the insulated surface of the substrate. Alternatively, a thin-film transistor including an active layer composed of single-crystal silicon, a thin-film transistor including an active layer composed of non single-crystal silicon such as amorphous silicon or microcrystal silicon, and a thin-film transistor including an active layer that is a semiconductor composed of a non single-crystal oxide such as indium zinc oxide or indium gallium zinc oxide may also be used. The thin-film transistor is also referred to as TFT device.

The transistor included in the display apparatus 1 shown in the FIGURE may be formed inside a substrate such as a Si substrate. The expression "a transistor is formed inside a substrate" herein means that the transistor is prepared by processing the substrate itself, which is a Si substrate or the like. In other words, when a transistor is formed inside a substrate, the substrate and the transistor appear to be integrated into one device.

Whether a transistor is formed inside a substrate or not depends on the resolution required for the display apparatus. For example, in order to realize a resolution substantially equal to the QVGA resolution per inch, the transistor is preferably formed inside a Si substrate.

As described above, a display apparatus including the organic light-emitting device according to the present invention is capable of consistently displaying a high-quality image even when the display apparatus is used for a prolonged period of time.

EXAMPLES

The present invention will be described specifically with reference to Examples below. However, the present invention is not limited to these Examples.

Example 1

Synthesis of Example Compound KK-01

[Chem.44]

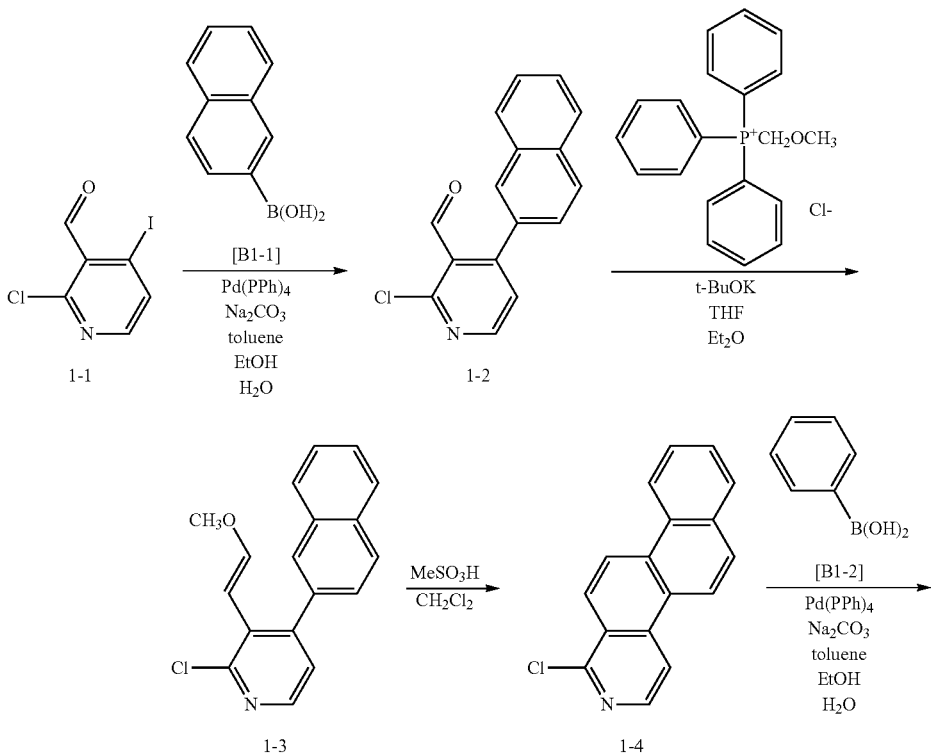

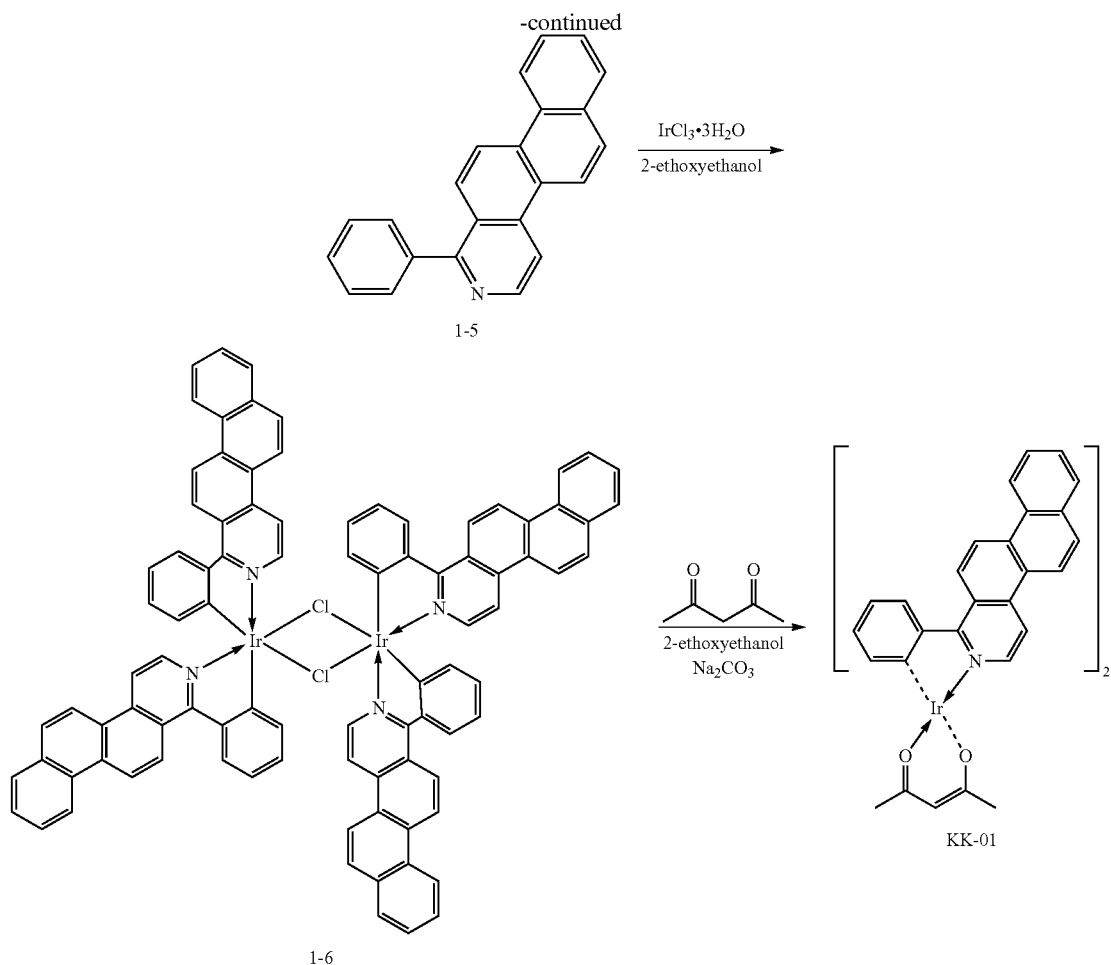

Synthesis of Intermediate 1-2

The following compounds were dissolved in a mixed solution of 160 ml of toluene, 80 ml of ethanol, and 80 ml of a 2-normal aqueous sodium carbonate solution.

Compound 1-1: 6.0 g (22.4 mmol)
Compound B1-1: 3.47 g (20.2 mmol)

In the resulting reaction solution, 1.30 g (1.12 mmol) of tetrakis(triphenylphosphine)palladium(0) was added while the reaction solution was stirred in a nitrogen atmosphere at a room temperature. Subsequently, the reaction solution was heated to 60 degrees Celsius and then stirred for 7 hours. After the reaction was completed, water was added in the reaction solution. The organic layer was extracted with toluene and dried with anhydrous sodium sulfate. Subsequently, the solvent was distilled off under reduced pressure. The residue was purified by column chromatography (gel used in chromatography: BW300 (produced by Fuji Silysia Chemical Ltd.), developing solvent: chloroform) and then washed with methanol. Thus, 4.0 g (yield 74%) of Compound 1-2 was prepared.

Synthesis of Intermediate 1-3

In 30 ml of anhydrous ether, 5.76 g (16.8 mmol) of (methoxymethyl)triphenylphosphonium chloride and 16.8 ml (16.8 mmol) of potassium tert-butoxide (1 M THF solution) were added. The mixture was stirred for 30 minutes at a room temperature to form a suspension. Into the suspension, 1.8 g (6.72 mmol) of Compound 1-2 dissolved in 45 ml of anhydrous THF was added dropwise, and the resulting mixture was stirred for 10 hours at a room temperature. After the reaction was completed, water was added in the mixture. The organic layer was extracted with toluene and dried with anhydrous sodium sulfate. Subsequently, the solvent was distilled off under reduced pressure. The residue was purified by column chromatography (gel used in chromatography: BW300 (produced by Fuji Silysia Chemical Ltd.), developing solvent: chloroform) and recrystallized using a mixture solvent of toluene and ethanol. Thus, 780 mg (yield 39%) of Compound 1-3 was prepared.

Synthesis of Intermediate 1-4

Methanesulfonic acid (4 ml) was added dropwise into 2.0 g (6.76 mmol) of Compound 1-3 dissolved in 40 ml of anhydrous dichloromethane, and the resulting mixture was stirred for 18 hours at a room temperature. After the reaction was completed, water was added in the mixture. The organic layer was extracted with chloroform and dried with anhydrous sodium sulfate. Subsequently, the solvent was distilled off under reduced pressure. The residue was purified by column chromatography (gel used in chromatography: BW300 (produced by Fuji Silysia Chemical Ltd.), developing solvent: chloroform), recrystallized 3 times using a mixture solvent of toluene and ethanol, and then washed with methanol. Thus, 485 mg (yield 27%) of Compound 1-4 was prepared.

Synthesis of Intermediate 1-5

The following compounds were dissolved in a mixed solution of 40 ml of toluene, 20 ml of ethanol, and 20 ml of a 2-normal aqueous sodium carbonate solution.

Compound 1-4: 0.485 g (1.84 mmol)

Compound B1-2: 0.269 g (2.21 mmol)

In the resulting reaction solution, 106 mg (0.092 mmol) of tetrakis(triphenylphosphine)palladium(0) was added while the reaction solution was stirred in a nitrogen atmosphere at a room temperature. The reaction solution was heated to 85 degrees Celsius and then stirred for 7 hours. After the reaction was completed, water was added in the reaction solution. Then, the organic layer was extracted with toluene and dried with anhydrous sodium sulfate. Subsequently, the solvent was distilled off under reduced pressure. The residue was purified by column chromatography (gel used in chromatography: BW300 (produced by Fuji Silysia Chemical Ltd.), developing solvent: hot toluene) and recrystallized using toluene. Thus, 365 mg (yield 65%) of Compound 1-5 was prepared.

The structure of Compound 1-5 was determined by $^1$H-NMR (400 MHz, CDCl$_3$). Sigma (ppm): 8.88-8.84 (d, 1H), 8.78-8.76 (d, 1H), 8.75-8.71 (t, 2H), 8.54-8.53 (d, 1H), 8.25-8.22 (d, 1H), 8.10-8.08 (d, 1H), 8.05-8.03 (d, 1H), 7.78-7.69 (m, 4H), 7.60-7.51 (m, 3H)

Synthesis of Intermediate 1-6

In 12 ml of 2-ethoxyethanol and 3 ml of water, 300 mg (0.982 mmol) of Compound 1-5 and 157 mg (0.447 mmol) of iridium(III) chloride hydrate were dissolved. The resulting solution was heated to 100 degrees Celsius in a nitrogen atmosphere and stirred for 7 hours. After the reaction was completed, water was added in the solution. The precipitated solid was filtered off, washed with water, ethanol, and toluene, and then dried. Thus, 300 mg (yield 73%) of Compound 1-6 was prepared.

Synthesis of Example Compound KK-01

In 5 ml of 2-ethoxyethanol, 200 mg (0.12 mmol) of Compound 1-6, 2.0 g (20.2 mmol) of acetylacetone, and 500 mg (4.72 mmol) of sodium carbonate were dissolved. The resulting solution was heated to 95 degrees Celsius in a nitrogen atmosphere and then stirred for 7 hours. After the reaction was completed, water was added in the solution. The precipitated solid was filtered off, washed with water and ethanol, and then dried. The residue was purified by column chromatography (gel used in chromatography: BW200 (produced by Fuji Silysia Chemical Ltd.), developing solvent: hot chlorobenzene). Thus, 190 mg (yield 88%) of Example Compound KK-01 was prepared. Example Compound KK-01 was then purified by sublimation at 10$^{-4}$ Pa and 390 degrees Celsius to form 5 mg of a sublimate of Example Compound KK-01.

The structure of Example Compound KK-01 was determined by $^1$H-NMR (400 MHz, CDCl$_3$).

Sigma (ppm): 9.14-9.11 (d, 2H), 8.92-8.90 (d, 2H), 8.86-8.84 (d, 2H), 8.73-8.69 (m, 4H), 8.41-8.39 (d, 2H), 8.29-8.27 (d, 2H), 8.13-8.11 (d, 2H), 8.08-8.06 (d, 2H), 7.82-7.79 (t, 2H), 7.76-7.72 (t, 2H), 6.97-6.93 (t, 2H), 6.71-6.67 (t, 2H), 6.46-6.44 (d, 2H), 5.26 (s, 1H), 1.81 (s, 3H)

M+ of Example Compound KK-01 was confirmed to be 900.22 by matrix assisted laser desorption/ionization-time of flight mass spectrometry (MALDI-TOF MS).

Example 2

Synthesis of Example Compound KK-03

[Chem.45]

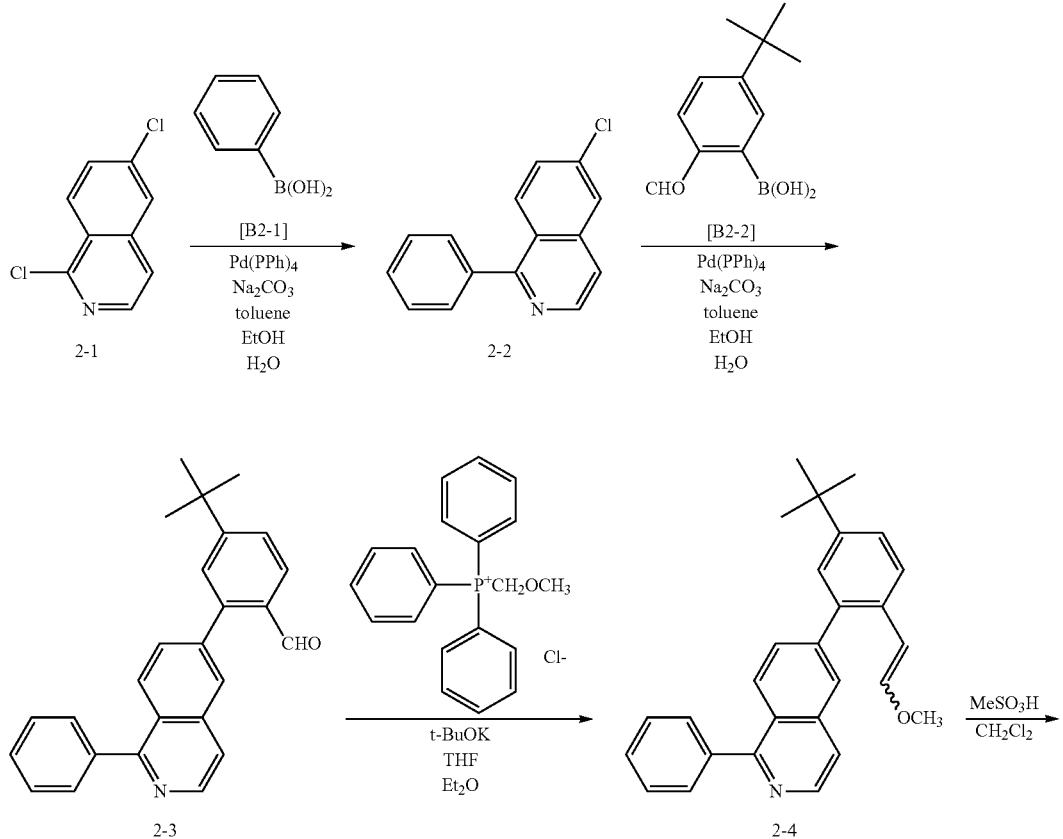

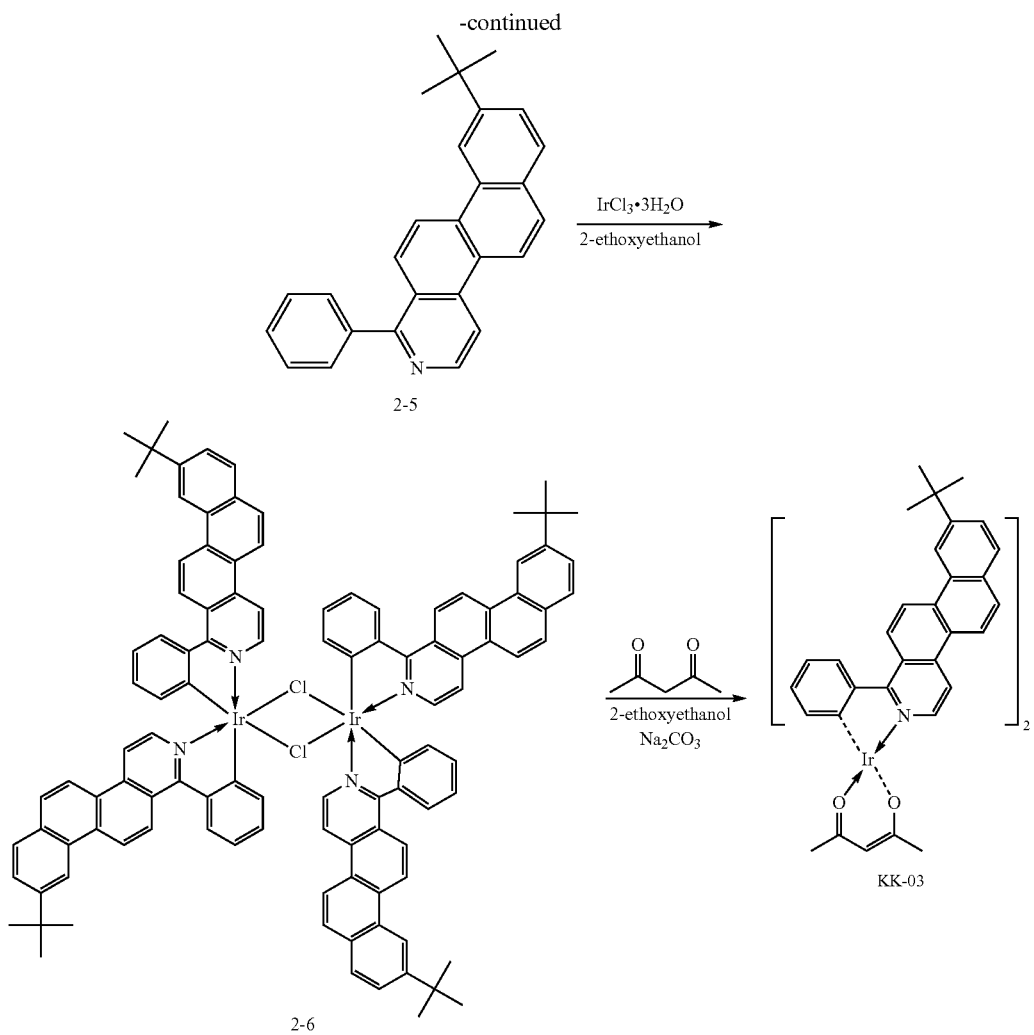

Synthesis of Intermediate 2-2

The following compounds were dissolved in a mixed solution of 200 ml of toluene, 100 ml of ethanol, and 100 ml of a 2-normal aqueous sodium carbonate solution.

Compound 2-1: 8.0 g (40.4 mmol)
Compound B2-1: 5.91 g (48.5 mmol)

In the resulting reaction solution, 2.33 g (2.02 mmol) of tetrakis(triphenylphosphine)palladium(0) was added while the reaction solution was stirred in a nitrogen atmosphere at a room temperature. The reaction solution was heated to 60 degrees Celsius and then stirred for 7 hours. After the reaction was completed, water was added in the reaction solution. The organic layer was extracted with toluene and dried with anhydrous sodium sulfate. Subsequently, the solvent was distilled off under reduced pressure. The residue was purified by column chromatography (gel used in chromatography: BW300 (produced by Fuji Silysia Chemical Ltd.), developing solvent: ethyl acetate/heptane=1/2) and washed with methanol. Thus, 5.89 g (yield 61%) of Compound 2-2 was prepared.

Synthesis of Compound B2-2

In 160 ml of anhydrous THF, 8.64 ml (68 mmol) of N,N,N'-trimethylethylenediamine was dissolved. The resulting solution was stirred for 30 minutes at −40 degrees Celsius. Into the solution, 40 ml (64 mmol) of n-butyllithium (1.6 M hexane solution) was added dropwise. The resulting solution was stirred for 30 minutes at −40 degrees Celsius. Into the solution, 10 ml (60 mmol) of 4-tert-butylbenzaldehyde was further added dropwise. The resulting solution was stirred for 30 minutes at −40 degrees Celsius. Into the solution, 112 ml (180 mmol) of n-butyllithium (1.6 M hexane solution) was further added dropwise. The resulting solution was stirred for 30 minutes at −40 degrees Celsius and further stirred for 10 hours while the solution was gradually heated to a room temperature. The reaction solution was again cooled to −40 degrees Celsius, and 40 ml (360 mmol) of trimethyl borate was added dropwise. The resulting solution was stirred for 30 minutes at −40 degrees Celsius and further stirred for 20 hours while the solution was gradually heated to a room temperature. The resulting reaction solution was added in 400 ml of 2-normal hydrochloric acid. The resulting mixture was stirred for 30 minutes at a room temperature. Water was added in the reaction solution, and the organic layer was extracted with chloroform and dried with anhydrous sodium sulfate. Subsequently, the solvent was distilled off under reduced pressure. The residue was purified by column chromatography (gel used in chromatography: BW300 (produced by Fuji Silysia Chemical Ltd.), developing solvent: ethyl acetate/heptane=1/2) and washed with heptane. Thus, 2.45 g (yield 20%) of Compound B2-2 was prepared.

Synthesis of Intermediate 2-3

In 350 ml of anhydrous toluene and 1 ml of water, 2.0 g (8.34 mmol) of Compound 2-2, 1.89 g (9.18 mmol) of Compound B2-2, 0.24 g (0.417 mmol) of bis(dibenzylideneacetone)palladium(0), 0.34 g (0.834 mmol) of 2-dicyclohexylphosphino-2',6'-dimethoxybiphenyl, and 3.54 g (16.7 mmol) of potassium phosphate were added. The resulting mixture was stirred for 6 hours at 130 degrees Celsius. After the reaction was completed, water was added in the mixture. The organic layer was extracted with toluene and dried with anhydrous sodium sulfate. Subsequently, the solvent was distilled off under reduced pressure. The residue was purified by column chromatography (gel used in chromatography: BW300 (produced by Fuji Silysia Chemical Ltd.), developing solvent: ethyl acetate/heptane=1/2). Thus, 1.98 g (yield 65%) of Compound 2-3 was prepared.

Synthesis of Intermediate 2-4

In 25 ml of anhydrous ether, 4.64 g (13.5 mmol) of (methoxymethyl)triphenylphosphonium chloride and 13.5 ml (13.5 mmol) of potassium tert-butoxide (1 M THF solution) were added. The resulting mixture was stirred for 30 minutes at a room temperature to form a suspension. Into the suspension, 1.98 g (5.42 mmol) of Compound 2-3 dissolved in 50 ml of anhydrous THF was added dropwise. The resulting mixture was stirred for 16 hours at a room temperature. After the reaction was completed, water was added in the mixture. The organic layer was extracted with toluene and dried with anhydrous sodium sulfate. Subsequently, the solvent was distilled off under reduced pressure. The residue was purified by column chromatography (gel used in chromatography: BW300 (produced by Fuji Silysia Chemical Ltd.), developing solvent: ethyl acetate/heptane=1/2). Thus, 2.0 g (yield 94%) of Compound 2-4 was prepared.

Synthesis of Intermediate 2-5

Into 2.0 g (5.08 mmol) of Compound 2-4 dissolved in 40 ml of anhydrous dichloromethane, 4 ml of methanesulfonic acid was added dropwise. The resulting mixture was stirred for 18 hours at a room temperature. After the reaction was completed, water was added in the mixture. The organic layer was extracted with chloroform and dried with anhydrous sodium sulfate. Subsequently, the solvent was distilled off under reduced pressure. The residue was purified by column chromatography (gel used in chromatography: BW300 (produced by Fuji Silysia Chemical Ltd.), developing solvent: ethyl acetate/heptane=1/2). Thus, 1.5 g (yield 82%) of Compound 2-5 was prepared.

The structure of Compound 2-5 was determined by $^1$H-NMR (400 MHz, CDCl$_3$).

Sigma (ppm): 8.85-8.83 (d, 1H), 8.79-8.77 (d, 1H), 8.74 (s, 1H), 8.68-8.66 (d, 1H), 8.54-8.52 (d, 1H), 8.06-8.04 (d, 1H), 7.99-7.97 (d, 1H), 7.81-7.76 (m, 3H), 7.60-7.51 (m, 3H), 1.52 (s, 9H)

Synthesis of Intermediate 2-6

In 20 ml of 2-ethoxyethanol and 5 ml of water, 650 mg (1.80 mmol) of Compound 2-5 and 288 mg (0.817 mmol) of iridium(III) chloride hydrate were dissolved. The resulting solution was heated to 100 degrees Celsius in a nitrogen atmosphere and stirred for 8 hours. After the reaction was completed, water was added in the solution. The precipitated solid was filtered off, washed with water and ethanol, and then dried. Thus, 620 mg (yield 73%) of Compound 2-6 was prepared.

Synthesis of Example Compound KK-03

In 7 ml of 2-ethoxyethanol, 300 mg (0.16 mmol) of Compound 2-6, 2.0 g (20.2 mmol) of acetylacetone, and 600 mg (5.66 mmol) of sodium carbonate were dissolved. The resulting solution was heated to 95 degrees Celsius in a nitrogen atmosphere and stirred for 8 hours. After the reaction was completed, water was added in the solution. The precipitated solid was filtered off, washed with water and ethanol, and then dried. The residue was purified by column chromatography (gel used in chromatography: BW200 (produced by Fuji Silysia Chemical Ltd.), developing solvent: chloroform). Thus, 180 mg (yield 56%) of Example Compound KK-03 was prepared. Example Compound KK-03 was then purified by sublimation at $10^{-4}$ Pa and 375 degrees Celsius to form 4 mg of a sublimate of Example Compound KK-03.

The structure of Example Compound KK-03 was determined by $^1$H-NMR (400 MHz, CDCl$_3$).

Sigma (ppm): 9.13-9.11 (d, 2H), 8.96-8.94 (d, 2H), 8.81 (s, 2H), 8.72-8.70 (d, 2H), 8.66-8.64 (d, 2H), 8.40-8.38 (d, 2H), 8.29-8.27 (d, 2H), 8.09-8.07 (d, 2H), 8.02-8.00 (d, 2H), 7.84-7.82 (d, 2H), 6.96-6.92 (t, 2H), 6.71-6.68 (t, 2H), 6.47-6.45 (d, 2H), 5.26 (s, 1H), 1.81 (s, 3H), 1.56 (s, 9H)

M+ of Example Compound KK-03 was confirmed to be 1012.32 by matrix assisted laser desorption/ionization-time of flight mass spectrometry (MALDI-TOF MS).

Example 3

Synthesis of Example Compound KK-02

[Chem.46]

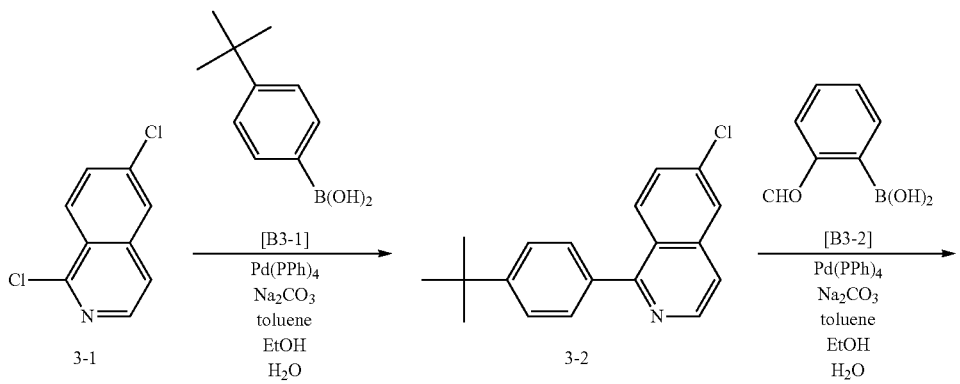

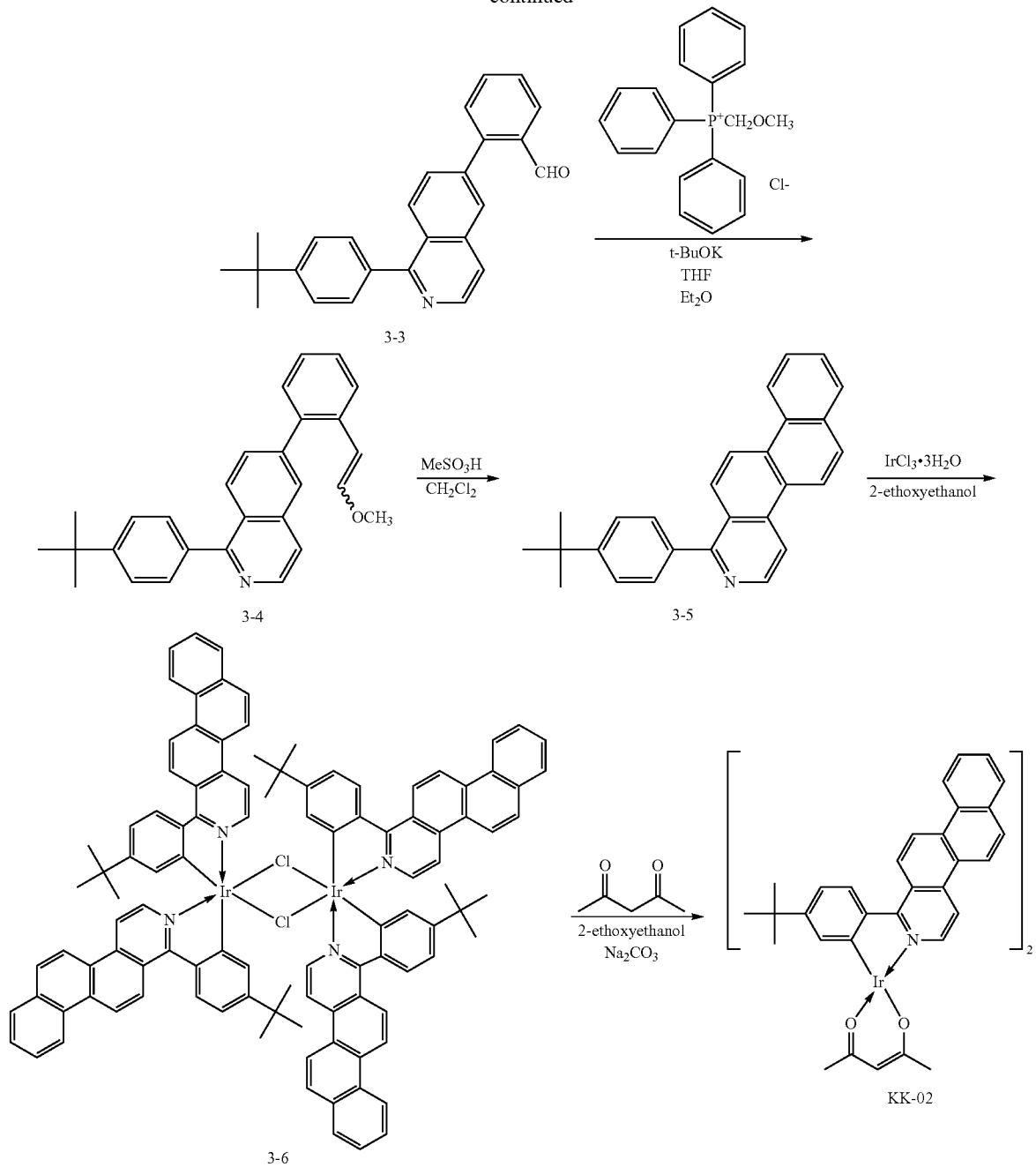

Synthesis of Intermediate 3-2

The following compounds were dissolved in a mixed solution of 100 ml of toluene, 50 ml of ethanol, and 50 ml of a 2-normal aqueous sodium carbonate solution.

Compound 3-1: 4.0 g (20.2 mmol)
Compound B3-1: 3.96 g (22.2 mmol)

In the resulting reaction solution, 1.17 g (1.01 mmol) of tetrakis(triphenylphosphine)palladium(0) was added while the reaction solution was stirred in a nitrogen atmosphere at a room temperature. The reaction solution was heated to 60 degrees Celsius and then stirred for 6 hours. After the reaction was completed, water was added in the reaction solution. The organic layer was extracted with toluene and dried with anhydrous sodium sulfate. Subsequently, the solvent was distilled off under reduced pressure. The residue was partially purified by column chromatography (gel used in chromatography: BW300 (produced by Fuji Silysia Chemical Ltd.), developing solvent: ethyl acetate/heptane=1/3) and washed with methanol. Thus, 5.98 g (yield 100%) of a crude product of Compound 3-2 was prepared.

Synthesis of Intermediate 3-3

In 300 ml of anhydrous toluene and 1 ml of water, 5.98 g (20.2 mmol) of the crude product of Compound 3-2, 3.63 g (24.2 mmol) of Compound B3-2, 0.58 g (1.01 mmol) of bis(dibenzylideneacetone)palladium(0), 0.88 g (2.13 mmol) of 2-dicyclohexylphosphino-2',6'-dimethoxybiphenyl, and 8.58 g (40.4 mmol) of potassium phosphate were added. The mixture was stirred for 5 hours at 130 degrees Celsius. After the reaction was completed, water was added in the mixture. The organic layer was extracted with toluene and dried with anhydrous sodium sulfate. Subsequently, the solvent was distilled off under reduced pressure. The residue was purified by column chromatography (gel used in chromatography: BW300 (produced by Fuji Silysia Chemical Ltd.), developing solvent: ethyl acetate/heptane=1/3). Thus, 5.0 g (yield 68%) of Compound 3-3 was prepared.

Synthesis of Intermediate 3-4

In 60 ml of anhydrous ether, 11.7 g (34.2 mmol) of (methoxymethyl)triphenylphosphonium chloride and 34.2 ml (34.2 mmol) of potassium tert-butoxide (1 M THF solution) were added. The resulting mixture was stirred for 30 minutes at a room temperature to form a suspension. Into the suspension, 5.0 g (13.7 mmol) of Compound 3-3 dissolved in 120 ml of anhydrous THF was added dropwise. The resulting mixture was stirred for 16 hours at a room temperature. After the reaction was completed, water was added in the mixture. The organic layer was extracted with toluene and dried with anhydrous sodium sulfate. Subsequently, the solvent was distilled off under reduced pressure. The residue was purified by column chromatography (gel used in chromatography: BW300 (produced by Fuji Silysia Chemical Ltd.), developing solvent: ethyl acetate/heptane=1/2). Thus, 5.15 g (yield 96%) of Compound 3-4 was prepared.

Synthesis of Intermediate 3-5

Methanesulfonic acid (4 ml) was diluted with 30 ml of anhydrous dichloromethane. The diluted solution was stirred for 5 minutes at a room temperature. Into the solution, 2.1 g (2.96 mmol) of Compound 3-4 dissolved in 20 ml of anhydrous dichloromethane was added dropwise. The resulting mixture was stirred for 17 hours at a room temperature. After the reaction was completed, water was added in the mixture. The organic layer was extracted with chloroform and dried with anhydrous sodium sulfate. Subsequently, the solvent was distilled off under reduced pressure. The residue was purified by column chromatography (gel used in chromatography: BW300 (produced by Fuji Silysia Chemical Ltd.), developing solvent: chloroform). Thus, 1.07 g (yield 55%) of Compound 3-5 was prepared.

The structure of Compound 3-5 was determined by $^1$H-NMR (400 MHz, CDCl$_3$).

Sigma (ppm): 8.84-8.83 (d, 1H), 8.79-8.77 (d, 1H), 8.75-8.71 (m, 2H), 8.52-8.51 (d, 1H), 8.32-8.30 (d, 1H), 8.09-8.07 (d, 1H), 8.05-8.03 (d, 1H), 7.75-7.69 (m, 4H), 7.60-7.58 (m, 2H), 1.43 (s, 9H)

Synthesis of Intermediate 3-6

In 20 ml of 2-ethoxyethanol and 5 ml of water, 650 mg (1.80 mmol) of Compound 3-5 and 288 mg (0.817 mmol) of iridium(III) chloride hydrate were dissolved. The resulting solution was heated to 100 degrees Celsius in a nitrogen atmosphere and then stirred for 8 hours. After the reaction was completed, water was added in the solution. The precipitated solid was filtered off, washed with water and ethanol, and then dried. Thus, 710 mg (yield 83%) of Compound 3-6 was prepared.

Synthesis of Example Compound KK-02

In 8 ml of 2-ethoxyethanol, 350 mg (0.18 mmol) of Compound 3-6, 2.0 g (20.2 mmol) of acetylacetone, and 650 mg (6.13 mmol) of sodium carbonate were dissolved. The resulting solution was heated to 95 degrees Celsius in a nitrogen atmosphere and stirred for 8 hours. After the reaction was completed, water was added in the solution. The precipitated solid was filtered off, washed with water and ethanol, and then dried. The residue was purified by column chromatography (gel used in chromatography: BW200 (produced by Fuji Silysia Chemical Ltd.), developing solvent: hot chlorobenzene). Thus, 140 mg (yield 67%) of Example Compound KK-02 was prepared. Example Compound KK-02 was then purified by sublimation at $10^{-4}$ Pa and 335 degrees Celsius to form 4 mg of a sublimate of Example Compound KK-02.

M+ of Example Compound KK-02 was confirmed to be 1012.87 by matrix assisted laser desorption/ionization-time of flight mass spectrometry (MALDI-TOF MS).

Example 4

Synthesis of Example Compound KK-04

[Chem.47]

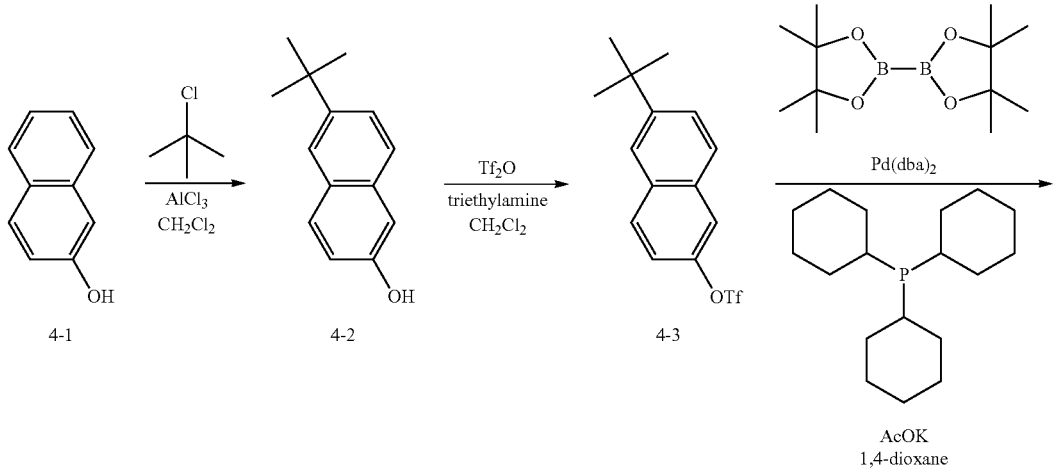

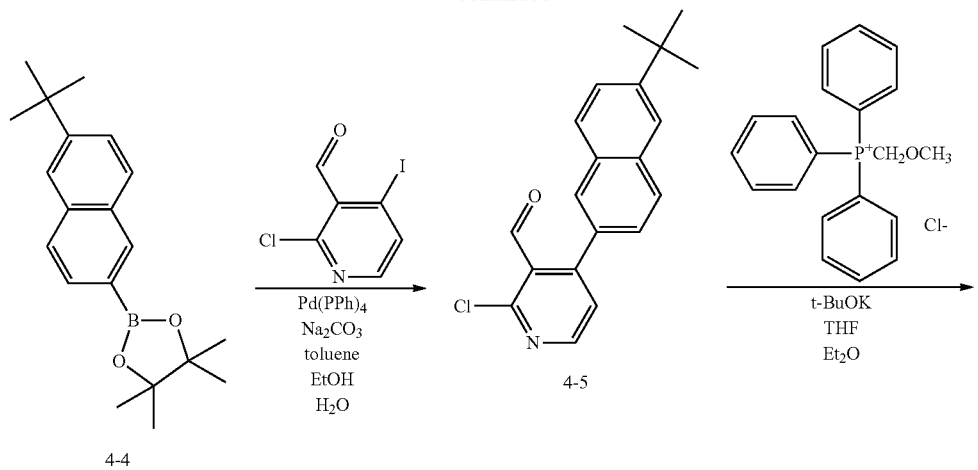
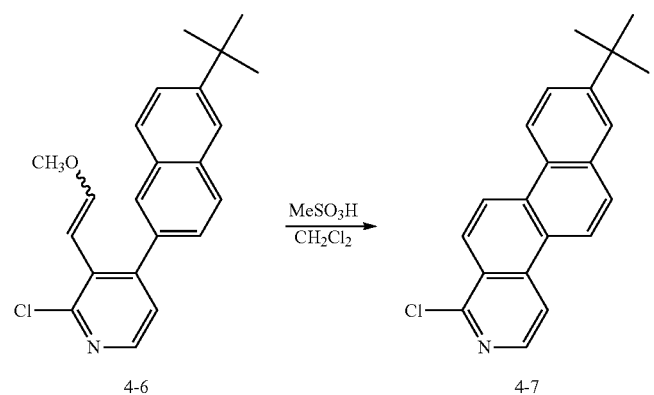
[Chem.48]
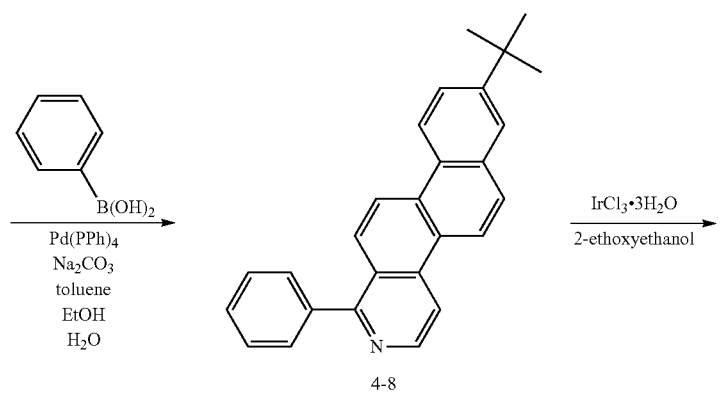

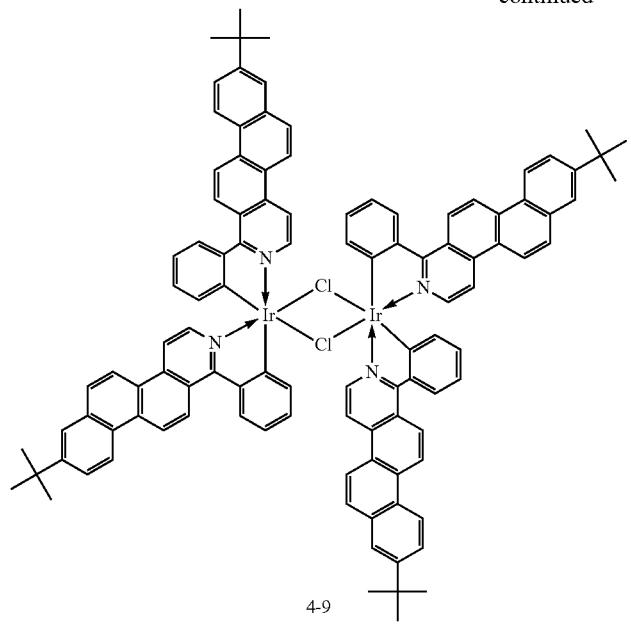

4-9

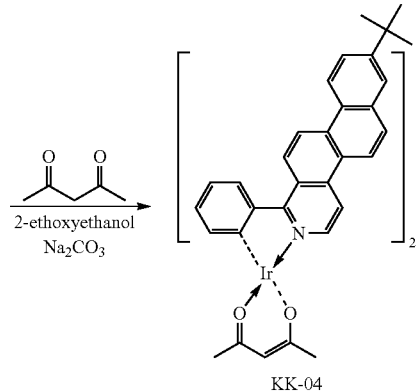

KK-04

Synthesis of Intermediate 4-2

In 150 ml of anhydrous dichloromethane, 34.9 g (242 mmol) of 2-naphthol, 47.3 g (510 mmol) of 2-chloro-2-methylpropane, and 2.45 g (18.4 mmol) of aluminium chloride were added in a nitrogen atmosphere. The resulting mixture was stirred for 6 hours at 40 degrees Celsius. After the reaction was completed, the mixture was cooled to a room temperature, and the solvent was distilled off under reduced pressure. In the resulting solution, 300 ml of 5% aqueous sodium hydroxide solution was added. The resulting mixture was stirred for 2 hours at 80 degrees Celsius and then filtered to separate a crystal. The crystal was then dissolved in 500 ml of chloroform, and 50 ml of hydrochloric acid was added dropwise into the solution. The resulting mixture was stirred for 1 hour at a room temperature. Then, water was added in the mixture. The organic layer was extracted with chloroform and dried with anhydrous sodium sulfate. Subsequently, the solvent was distilled off under reduced pressure. The residue was purified by column chromatography (gel used in chromatography: BW300 (produced by Fuji Silysia Chemical Ltd.), developing solvent: ethyl acetate/chloroform=1/1). Thus, 5.9 g (yield 12%) of Compound 4-2 was prepared.

Synthesis of Intermediate 4-3

In 100 ml of anhydrous dichloromethane, 5.7 g (28.5 mmol) of Compound 4-2 and 82 ml (58.7 mmol) of triethylamine were added in a nitrogen atmosphere. The resulting mixture was stirred for 30 minutes at 0 degree Celsius. Then, 5.7 ml (33.6 mmol) of trifluoromethane anhydride was slowly added dropwise into the mixture. The resulting mixture was stirred for 2 hours at 0 degree Celsius. After the reaction was completed, 150 ml of hydrochloric acid was added in the mixture. The organic layer was extracted with chloroform and dried with anhydrous sodium sulfate. Subsequently, the solvent was distilled off under reduced pressure. The residue was purified by column chromatography (gel used in chromatography: BW300 (produced by Fuji Silysia Chemical Ltd.), developing solvent: heptane/chloroform=2/1). Thus, 8.6 g (yield 90%) of Compound 4-3 was prepared.

Synthesis of Intermediate 4-4

In 200 ml of 1,4-dioxane, 10.0 g (30.1 mmol) of Compound 4-3, 11.5 g (45.1 mmol) of bis(pinacolato)diboron, 0.87 g (1.50 mmol) of bis(dibenzylideneacetone)palladium (0), 0.84 g (3.01 mmol) of tricyclohexylphosphine, and 8.86 g (90.3 mmol) of potassium acetate were added. The mixture was stirred for 4 hours at 100 degrees Celsius. After the reaction was completed, water was added in the mixture. The organic layer was extracted with toluene and dried with anhydrous sodium sulfate. Subsequently, the solvent was distilled off under reduced pressure. The residue was purified by column chromatography (gel used in chromatography: BW300 (produced by Fuji Silysia Chemical Ltd.), developing solvent: toluene/heptane=2/1). Thus, 7.33 g (yield 78%) of Compound 4-4 was prepared.

Synthesis of Intermediate 4-5

The following compounds were dissolved in a mixed solution of 200 ml of toluene, 100 ml of ethanol, and 100 ml of a 2-normal aqueous sodium carbonate solution.

Compound 1-1: 3.83 g (14.3 mmol)
Compound 4-4: 4.0 g (12.9 mmol)

While the resulting reaction solution was stirred at a room temperature in a nitrogen atmosphere, 0.83 g (0.72 mmol) of tetrakis(triphenylphosphine)palladium(0) was added in the reacting solution. The reaction solution was heated to 60 degrees Celsius and then stirred for 7 hours. After the reaction was completed, water was added to the reaction solution. The organic layer was extracted with toluene and dried with anhydrous sodium sulfate. Subsequently, the solvent was distilled off under reduced pressure. The residue was purified by column chromatography (gel used in chromatography: BW300 (produced by Fuji Silysia Chemical Ltd.), developing solvent: ethyl acetate/heptane=1/2) and washed with methanol. Thus, 1.6 g (yield 38%) of Compound 4-5 was prepared.

Synthesis of Intermediate 4-6

In 25 ml of anhydrous ether, 4.23 g (12.4 mmol) of (methoxymethyl)triphenylphosphonium chloride and 12.4 ml (12.4 mmol) of potassium tert-butoxide (1 M THF solution) were added. The resulting mixture was stirred for 30 minutes at a room temperature to form a suspension. Into the suspension, 1.6 g (4.94 mmol) of Compound 4-5 dissolved in 40 ml of anhydrous THF was added dropwise. The resulting mixture was stirred for 10 hours at a room temperature. After the reaction was completed, water was added in the mixture. The organic layer was extracted with toluene and dried with anhydrous sodium sulfate. Subsequently, the solvent was distilled off under reduced pressure. The residue was purified by column chromatography (gel used in chromatography: BW300 (produced by Fuji Silysia Chemical Ltd.), developing solvent: ethyl acetate/heptane=1/3). Thus, 1.5 g (yield 86%) of Compound 4-6 was prepared.

Synthesis of Intermediate 4-7

Methanesulfonic acid (4 ml) was diluted with 20 ml of anhydrous dichloromethane. The diluted solution was stirred for 5 minutes at a room temperature. Into the mixture, 1.5 g (4.69 mmol) of Compound 4-6 dissolved in 20 ml of anhydrous dichloromethane was added dropwise. The resulting mixture was stirred for 17 hours at a room temperature. After the reaction was completed, water was added in the mixture. The organic layer was extracted with chloroform and dried with anhydrous sodium sulfate. Subsequently, the solvent was distilled off under reduced pressure. The residue was purified by column chromatography (gel used in chromatography: BW300 (produced by Fuji Silysia Chemical Ltd.), developing solvent: chloroform) and recrystallized 2 times using toluene. Thus, 600 mg (yield 40%) of Compound 4-7 was prepared.

Synthesis of Intermediate 4-8

The following compounds were dissolved in a mixed solution of 60 ml of toluene, 30 ml of ethanol, and 30 ml of a 2-normal aqueous sodium carbonate solution.

Compound 4-7: 600 mg (1.88 mmol)
Compound B2-1: 274 mg (2.25 mmol)

While the resulting reaction solution was stirred at a room temperature in a nitrogen atmosphere, 108 mg (0.094 mmol) of tetrakis(triphenylphosphine)palladium(0) was added in the reacting solution. The reaction solution was heated to 85 degrees Celsius and then stirred for 7 hours. After the reaction was completed, water was added to the reaction solution. The organic layer was extracted with toluene and dried with anhydrous sodium sulfate. Subsequently, the solvent was distilled off under reduced pressure. The residue was purified by column chromatography (gel used in chromatography: BW300 (produced by Fuji Silysia Chemical Ltd.), developing solvent: chloroform) and washed with ethanol. Thus, 540 mg (yield 80%) of Compound 4-8 was prepared.

The structure of Compound 4-8 was determined by $^1$H-NMR (400 MHz, CDCl$_3$).

Sigma (ppm): 8.84-8.83 (d, 1H), 8.72-8.68 (m, 3H), 8.53-8.52 (d, 1H), 8.22-8.20 (d, 1H), 8.08-8.05 (d, 1H), 7.98 (s, 1H), 7.84-7.82 (d, 1H), 7.78-7.76 (m, 2H), 7.60-7.52 (m, 3H), 1.49 (s, 9H)

Synthesis of Intermediate 4-9

In 20 ml of 2-ethoxyethanol and 5 ml of water, 500 mg (1.38 mmol) of Compound 4-8 and 222 mg (0.63 mmol) of iridium(III) chloride hydrate were dissolved. The resulting solution was heated to 100 degrees Celsius in a nitrogen atmosphere and then stirred for 7 hours. After the reaction was completed, water was added in the solution. The precipitated solid was filtered off, washed with water and ethanol, and then dried. Thus, 550 mg (yield 84%) of Compound 4-9 was prepared.

Synthesis of Example Compound KK-04

In 5 ml of 2-ethoxyethanol, 250 mg (0.13 mmol) of Compound 4-8, 2.0 g (20.2 mmol) of acetylacetone, and 500 mg (4.72 mmol) of sodium carbonate were dissolved. The resulting solution was heated to 95 degrees Celsius in a nitrogen atmosphere and then stirred for 7 hours. After the reaction was completed, water was added in the solution. The precipitated solid was filtered off, washed with water and ethanol, and then dried. The residue was purified by column chromatography (gel used in chromatography: BW200 (produced by Fuji Silysia Chemical Ltd.), developing solvent: chloroform). Thus, 160 mg (yield 60%) of Example Compound KK-04 was prepared. Example Compound KK-04 was then purified by sublimation at $10^{-4}$ Pa and 390 degrees Celsius to form 10 mg of a sublimate of Example Compound KK-04.

The structure of Example Compound KK-04 was determined by $^1$H-NMR (400 MHz, CDCl$_3$).

Sigma (ppm): 9.11-9.09 (d, 2H), 8.88-8.86 (d, 2H), 8.78-8.76 (d, 2H), 8.71-8.70 (d, 2H), 8.68-8.66 (d, 2H), 8.39-8.37 (d, 2H), 8.29-8.27 (d, 2H), 8.10-8.08 (d, 2H), 8.00 (s, 2H), 7.89-7.87 (d, 2H), 6.96-6.93 (t, 2H), 6.71-6.67 (t, 2H), 6.47-6.45 (d, 2H), 5.26 (s, 1H), 1.81 (s, 3H), 1.52 (s, 9H)

M+ of Example Compound KK-04 was confirmed to be 1012.29 by matrix assisted laser desorption/ionization-time of flight mass spectrometry (MALDI-TOF MS).

Example 5

Synthesis of Example Compound KK-28

[Chem.49]

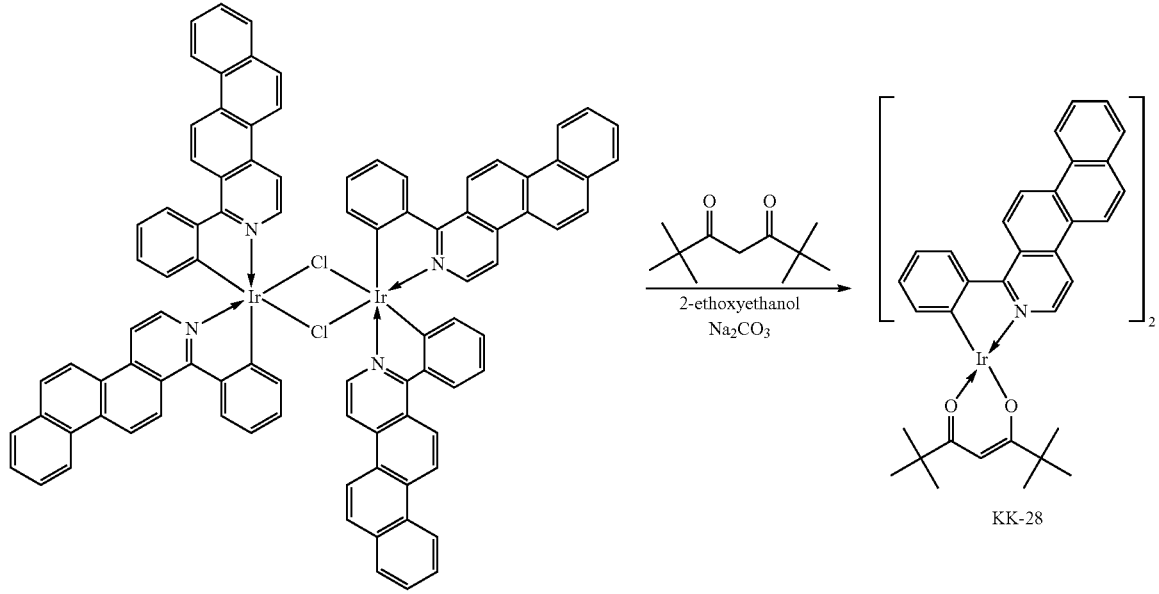

KK-28

In 5 ml of 2-ethoxyethanol, 100 mg (0.060 mmol) of Compound 1-6, 3.0 g (16.3 mmol) of dipivaloylmethane, and 200 mg (1.89 mmol) of sodium carbonate were dissolved. The resulting solution was heated to 95 degrees Celsius in a nitrogen atmosphere and then stirred for 7 hours. After the reaction was completed, water was added in the solution. The precipitated solid was filtered off, washed with water and ethanol, and then dried. The residue was purified by column chromatography (gel used in chromatography: BW200 (produced by Fuji Silysia Chemical Ltd.), developing solvent: hot chlorobenzene). Thus, 56 mg (yield 48%) of Example Compound KK-28 was prepared. Example Compound KK-28 was then purified by sublimation at $10^{-4}$ Pa and 385 degrees Celsius to form 7 mg of a sublimate of Example Compound KK-28.

The structure of Example Compound KK-28 was determined by $^1$H-NMR (400 MHz, CDCl$_3$).

Sigma (ppm): 9.16-9.14 (d, 2H), 8.91-8.88 (d, 2H), 8.86-8.84 (d, 2H), 8.71-8.69 (d, 2H), 8.61-8.60 (d, 2H), 8.32-8.28 (m, 4H), 8.11-8.09 (d, 2H), 8.07-8.05 (d, 2H), 7.82-7.78 (t, 2H), 7.75-7.71 (t, 2H), 6.98-6.95 (t, 2H), 6.71-6.68 (t, 2H), 6.60-6.59 (d, 2H), 5.46 (s, 1H), 0.85 (s, 18H)

M+ of Example Compound KK-28 was confirmed to be 984.35 by matrix assisted laser desorption/ionization-time of flight mass spectrometry (MALDI-TOF MS).

Example 6

Synthesis of Example Compound KK-31

BW200 (produced by Fuji Silysia Chemical Ltd.), developing solvent: chloroform). Thus, 175 mg (yield 61%) of Example Compound KK-31 was prepared. Example Compound KK-31 was then purified by sublimation at $10^{-4}$ Pa and 390 degrees Celsius to form 15 mg of a sublimate of Example Compound KK-31.

The structure of Example Compound KK-31 was determined by $^1$H-NMR (400 MHz, CDCl$_3$).

Sigma (ppm): 9.13-9.11 (d, 2H), 8.87-8.84 (d, 2H), 8.78-8.76 (d, 2H), 8.68-8.65 (d, 2H), 8.60-8.58 (d, 2H), 8.30-8.28 (m, 4H), 8.08-8.06 (d, 2H), 7.99 (s, 2H), 7.89-7.86 (d, 2H), 6.97-6.94 (t, 2H), 6.71-6.67 (t, 2H), 6.61-6.59 (d, 2H), 5.45 (s, 1H), 1.51 (s, 18H), 0.84 (s, 18H)

M+ of Example Compound KK-31 was confirmed to be 1096.53 by matrix assisted laser desorption/ionization-time of flight mass spectrometry (MALDI-TOF MS).

Example 7

Synthesis of Example Compound KK-29

Example Compound KK-29 was prepared as in Example 3, except that dipivaloylmethane was used instead of acetylacetone. M+ of Example Compound KK-29 was confirmed to be 1096.10 by matrix assisted laser desorption/ionization-time of flight mass spectrometry (MALDI-TOF MS).

[Chem.50]

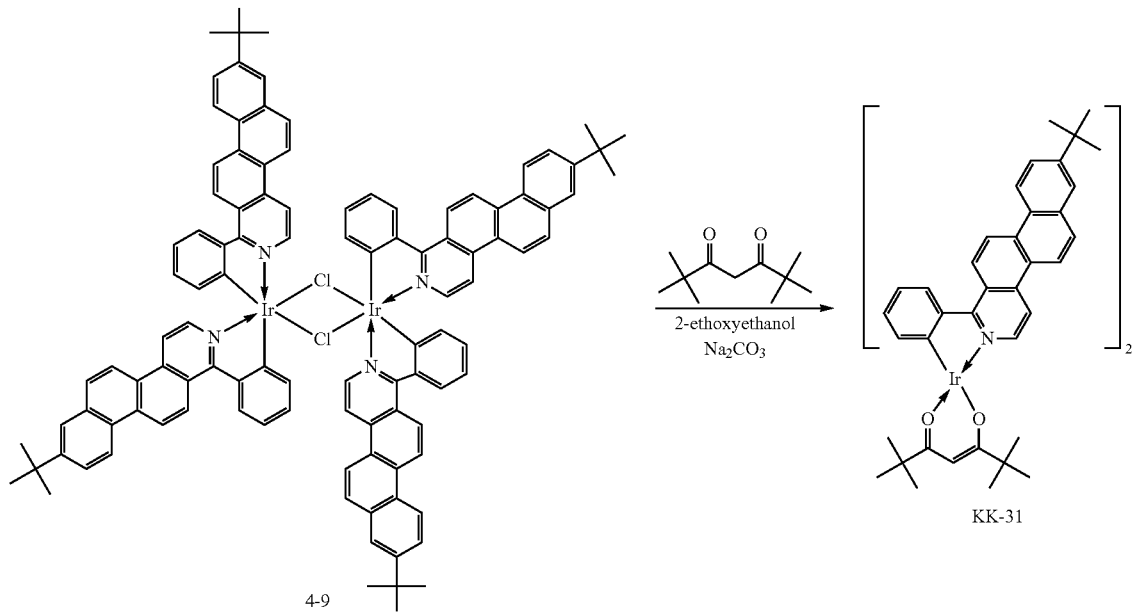

In 12 ml of 2-ethoxyethanol, 250 mg (0.13 mmol) of Compound 4-9, 3.0 g (16.3 mmol) of dipivaloylmethane, and 500 mg (4.72 mmol) of sodium carbonate were dissolved. The resulting solution was heated to 95 degrees Celsius in a nitrogen atmosphere and then stirred for 7 hours. After the reaction was completed, water was added in the solution. The precipitated solid was filtered off, washed with water and ethanol, and then dried. The residue was purified by column chromatography (gel used in chromatography:

Example 8

Synthesis of Example Compound KK-30

Example Compound KK-30 was prepared as in Example 2, except that dipivaloylmethane was used instead of acetylacetone. M+ of Example Compound KK-30 was confirmed to be 1096.85 by matrix assisted laser desorption/ionization-time of flight mass spectrometry (MALDI-TOF MS).

Example 9

Synthesis of Example Compound KK-35

Example Compound KK-35 was prepared as in Example 1, except that Compound B1-A below was used instead of Compound B1-1 and dipivaloylmethane was used instead of acetylacetone. M+ of Example Compound KK-35 was confirmed to be 1012.55 by matrix assisted laser desorption/ ionization-time ionization-time of flight mass spectrometry (MALDI-TOF MS).

[Chem. 51]

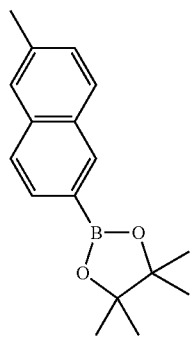

B1-A

Example 10

Synthesis of Example Compound KK-36

Example Compound KK-36 was prepared as in Example 2, except that Compound B2-A below was used instead of Compound B2-1 and dipivaloylmethane was used instead of acetylacetone. M+ of Example Compound KK-36 was confined to be 1012.49 by matrix assisted laser desorption/ ionization-time of flight mass spectrometry (MALDI-TOF MS).

[Chem. 52]

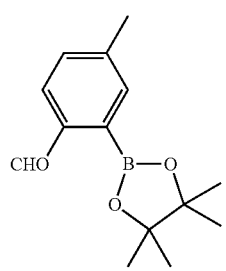

B2-A

Comparative Example 1

Synthesis of Compound E2

[Chem.53]

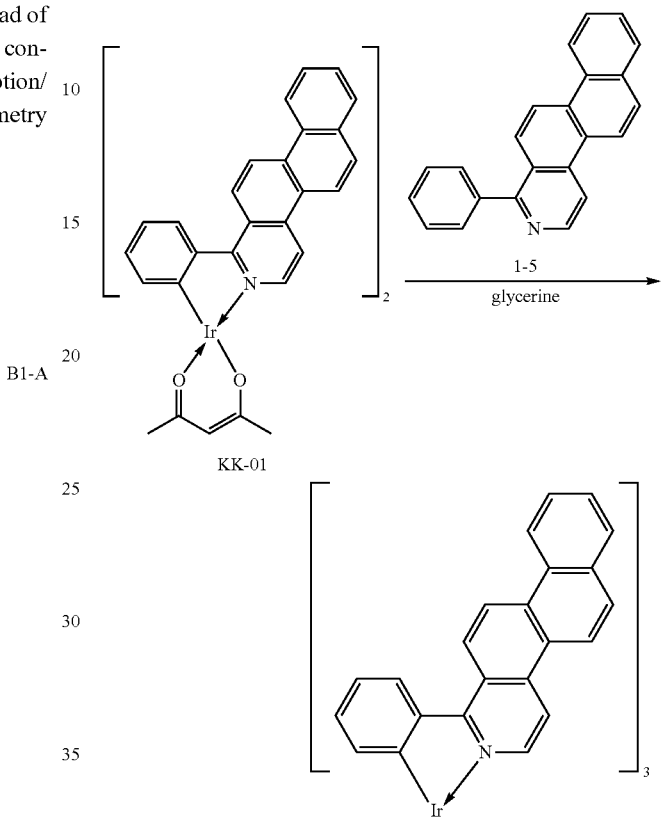

Glycerine (4 ml) was degassed with nitrogen for 30 minutes while being stirred at 80 degrees Celsius. In degassed glycerine, 100 mg (0.11 mmol) of Example Compound KK-01 and 1.5 g (4.91 mmol) of Compound 1-5 were added. The resulting mixture was heated to 220 degrees Celsius in a nitrogen atmosphere and then stirred for 12 hours. After the reaction was completed, water was added in the reaction solution. The precipitated solid was filtered off and washed with hot chlorobenzene. Thus, 10 mg (yield 8%) of Compound E2 was prepared. M+ of Compound E2 was confirmed to be 1105.52 by matrix assisted laser desorption/ ionization-time of flight mass spectrometry (MALDI-TOF MS). Compound E2 was then purified by sublimation at $10^{-4}$ Pa and 395 degrees Celsius. However, Compound E2 was decomposed by heat, and a sublimate of Compound E2 could not be formed.

Comparative Example 2

Synthesis of Compound A30

Compound A30 was synthesized in accordance with International Publication No. 2009-060995.

Comparative Example 3

Comparison of Example Compounds and Comparative Compounds in terms of emission wavelength in the form of a solution: A comparison between Example Compounds KK-01, KK-02, KK-03, KK-04, KK-28, and KK-31 and Comparative Compounds E2 and A30 was made in terms of emission wavelength in the form of a solution.

Each compound was dissolved in toluene to prepare a 1×10$^{-5}$ mol/l toluene solution and subjected to photoluminescence measurement. The spectrum emitted from the toluene solution at a room temperature was measured using F-4500 produced by Hitachi, Ltd. at an excitation wavelength of 480 nm. Table 2 shows the results. Because Comparative Compound E2 had a significantly low solubility, its photoluminescence could not be measured.

TABLE 2

| Compound | Lambda max (nm) |
|---|---|
| KK-01 | 613 |
| KK-02 | 614 |
| KK-03 | 613 |
| KK-04 | 612 |
| KK-28 | 616 |
| KK-31 | 614 |
| E2 | N/A |
| A30 | 601 | the results. Because Comparative Compound E2 had a significantly low solubility, its quantum yield could not be measured. In Table 3, the quantum yield is shown as a relative ratio to the quantum yield observed in the solution of Compound A30.

TABLE 3

| Compound | Relative ratio to A30 |
|---|---|
| KK-01 | 0.9 |
| KK-02 | 0.9 |
| KK-03 | 1.0 |
| KK-04 | 1.0 |
| KK-28 | 1.0 |
| KK-31 | 1.0 |
| E2 | N/A |
| A30 | 1.0 |

Example 11

Synthesis of Example Compound H-103

[Chem.54]

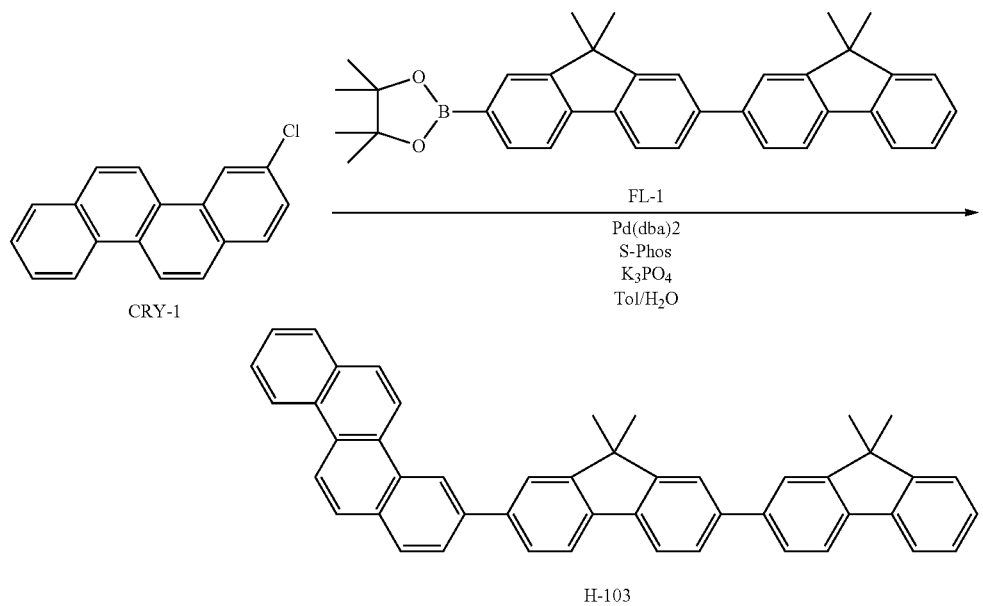

Comparative Example 4

Comparison of Example Compounds and Comparative Compounds in terms of quantum yield in the form of a solution: A comparison between Example Compounds KK-01, KK-02, KK-03, KK-04, KK-28, and KK-31 and Comparative Compounds E2 and A30 was made in terms of quantum yield in the form of a solution.

For each compound, an absolute quantum yield at a room temperature in the form of a solution was measured using Absolute PL Quantum Yield Measurement System (C9920-02) produced by Hamamatsu Photonics K.K. Table 3 shows The following reagents and a solvent were charged in a 100-ml eggplant flask.
3-Chlorochrysene (CRY-1): 525 mg (2.00 mmol)
Boronic acid compound (FL-1): 1,017 mg (2.00 mmol)
Palladium(II) acetate: 18 mg (80 micromoles)
Dicyclohexyl(2',6'-dimethoxybiphenyl-2-yl)phosphine: 80 mg (194 micromoles)
Potassium phosphate: 1.06 g (5.00 mmol)
Toluene: 50 ml
The resulting reaction solution was heated to reflux for 8 hours while being stirred. After the reaction was completed, water was added in the reaction solution in order to separate phases. The residue was purified by silica gel column chromatography (developing solvent: heptane/toluene=4/1) and recrystallized using a mixture solvent of toluene and ethanol. The resulting crystal was vacuum-dried at 150 degrees Celsius and then purified by sublimation. Thus, 830 mg (yield 68%) of Example Compound H-103 was prepared. The purity of Example Compound H-103 determined by high-performance liquid chromatography (HPLC) was 99% or more. The results of identification of Example Compound H-103 are shown below.

MALDI-TOF-MS (matrix assisted laser desorption/ionization-time of flight mass spectrometry) with Autoflex LRF produced by Bruker Corporation Measured value=612.88
Calculated value=612.28

Example 12

Synthesis of Example Compound D-102

[Chem.55]

Potassium phosphate: 1.06 g (5.00 mmol)
Toluene: 50 ml

The resulting reaction solution was heated to reflux for 8 hours while being stirred. After the reaction was completed, water was added in the reaction solution in order to separate phases. The residue was purified by silica gel column chromatography (developing solvent: heptane/toluene=4/1) and then recrystallized using a mixture solvent of toluene and ethanol. The resulting crystal was vacuum-dried at 150 degrees Celsius and then purified by sublimation. Thus, 337 mg (yield 58%) of Example Compound D-102 was prepared. The purity of Example Compound D-102 determined by high-performance liquid chromatography (HPLC) was 99% or more. The results of identification of Example Compound D-102 are shown below.

MALDI-TOF-MS (matrix assisted laser desorption/ionization-time of flight mass spectrometry) with Autoflex LRF produced by Bruker Corporation

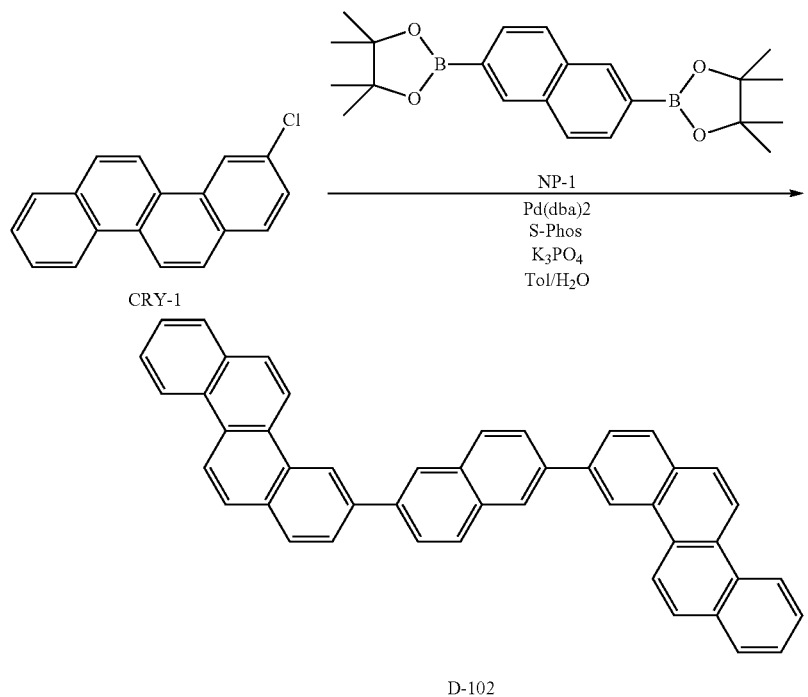

The following reagents and a solvent were charged in a 100-ml eggplant flask.

3-Chlorochrysene (CRY-1): 578 mg (2.2 mmol)

Boronic acid compound (NP-1): 380 mg (1.0 mmol)

Palladium(II) acetate: 18 mg (80 micromoles)

Dicyclohexyl(2',6'-dimethoxybiphenyl-2-yl)phosphine: 80 mg (194 micromoles)

Measured value=580.43
Calculated value=580.22

Example 13

Synthesis of Example Compound F-101

Example Compound F-101 was prepared as in Example 11, except that 3-chlorophenanthrene was used instead of 3-chlorochrysene and Compound FL-2 below was used instead of Compound FL-1.

[Chem. 56]

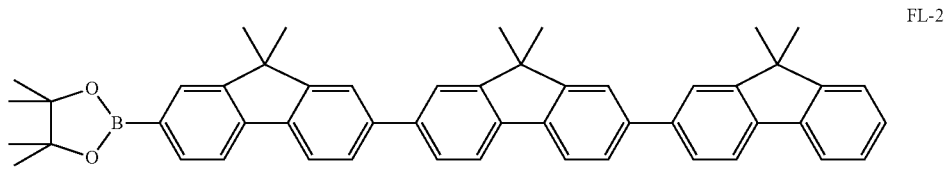

The results of identification of Example Compound F-101 are shown below.
MALDI-TOF-MS (matrix assisted laser desorption/ionization-time of flight mass spectrometry) with Autoflex LRF produced by Bruker Corporation
Measured value=754.39
Calculated value=755.00

Example 14

Synthesis of Example Compound H-102
Example Compound H-102 was prepared as in Example 11, except that 3-chlorophenanthrene was used instead of 3-chlorochrysene. The results of identification of Example Compound H-102 are shown below.
MALDI-TOF-MS (matrix assisted laser desorption/ionization-time of flight mass spectrometry) with Autoflex LRF produced by Bruker Corporation
Measured value=562.21
Calculated value=562.74

Example 15

Synthesis of Example Compound L-104
Example Compound L-104 was prepared as in Example 11, except that Compound NPTRP-1 below was used instead of Compound FL-1.

[Chem. 57]

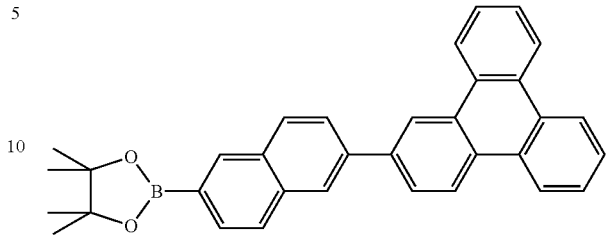

NPTRP-1

The results of identification of Example Compound L-104 are shown below.
MALDI-TOF-MS (matrix assisted laser desorption/ionization-time of flight mass spectrometry) with Autoflex LRF produced by Bruker Corporation
Measured value=580.13
Calculated value=580.22

Example 16

Synthesis of Example Compound L-105

[Chem.58]

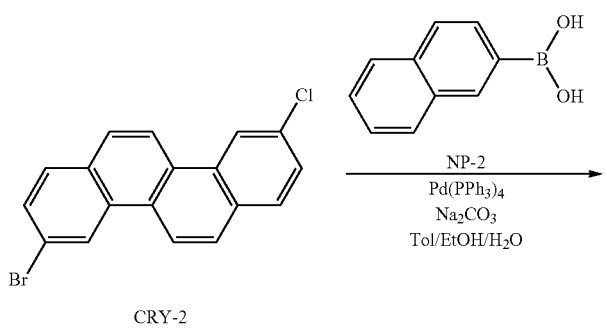

CRY-2

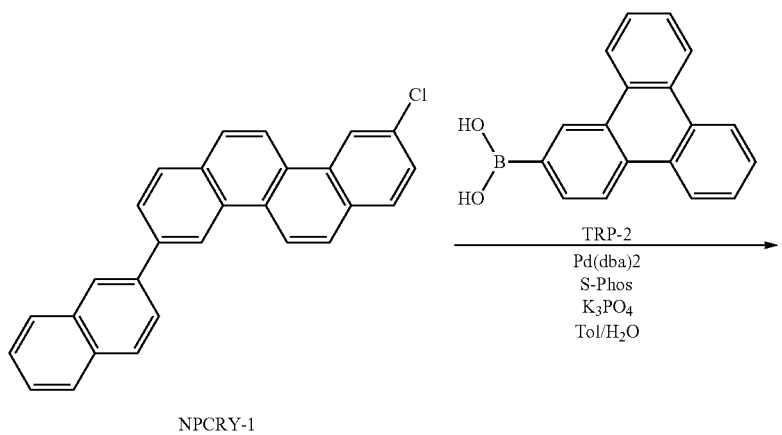

NPCRY-1

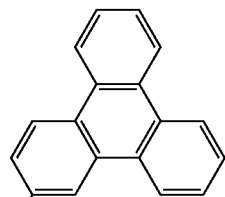

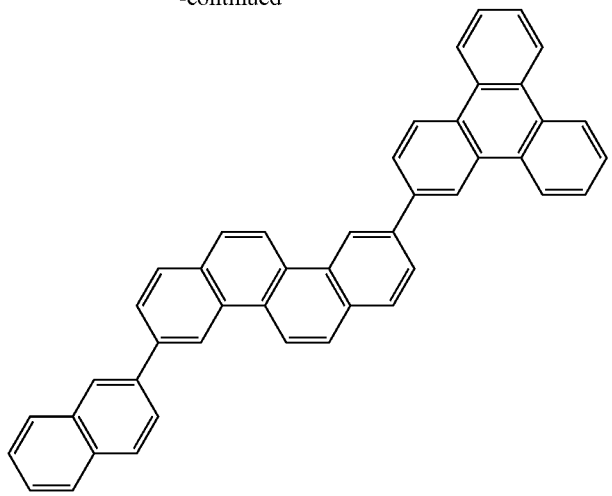

L-105

(1) Synthesis of Compound NPCRY-1

The following reagents and solvents were charged in a 100-ml three-necked flask.
Compound CRY-2: 1.23 g (3.0 mmol)
Compound NP-2: 0.53 g (3.1 mmol)
Tetrakis(triphenylphosphine)palladium(0): 0.1 g (0.08 mmol)
Toluene: 10 ml
Ethanol: 5 ml
Aqueous sodium carbonate solution (10 wt %): 5 ml The reaction solution was heated to reflux for 5 hours while being stirred in a nitrogen atmosphere. After the reaction was completed, the resulting reaction solution was washed with water, dried with sodium sulfate, and then concentrated to prepare a crude product. The crude product was then purified by silica gel column chromatography (developing solvent: toluene/heptane=2/1). Thus, 0.99 g (yield 85%) of Compound NPCRY-1 was prepared.

(2) Synthesis of Example Compound L-105

The following reagents and a solvent were charged in a 100-ml eggplant flask.
Intermediate NPCRY-1: 389 mg (1.0 mmol)
Boronic acid compound TRP-2: 272 mg (1.0 mmol)
Palladium(II) acetate: 18 mg (80 micromoles)
Dicyclohexyl(2',6'-dimethoxybiphenyl-2-yl)phosphine: 80 mg (194 micromoles)
Potassium phosphate: 0.53 g (2.5 mmol)
Toluene: 10 ml The resulting reaction solution was heated to reflux for 8 hours while being stirred. After the reaction was completed, water was added in the reaction solution in order to separate phases. The residue was purified by silica gel column chromatography (developing solvent: heptane/toluene=4/1) and recrystallized using a mixture solvent of toluene and ethanol. The resulting crystal was vacuum-dried at 150 degrees Celsius and then purified by sublimation. Thus, 458 mg (yield 79%) of Example Compound L-105 was prepared. The purity of Example Compound L-105 determined by HPLC was 99% or more. The results of identification of Example Compound L-105 are shown below.

MALDI-TOF-MS (matrix assisted laser desorption/ionization-time of flight mass spectrometry) with Autoflex LRF produced by Bruker Corporation
Measured value=580.01
Calculated value=580.22

Example 17

Synthesis of Example Compound J-105

[Chem.59]

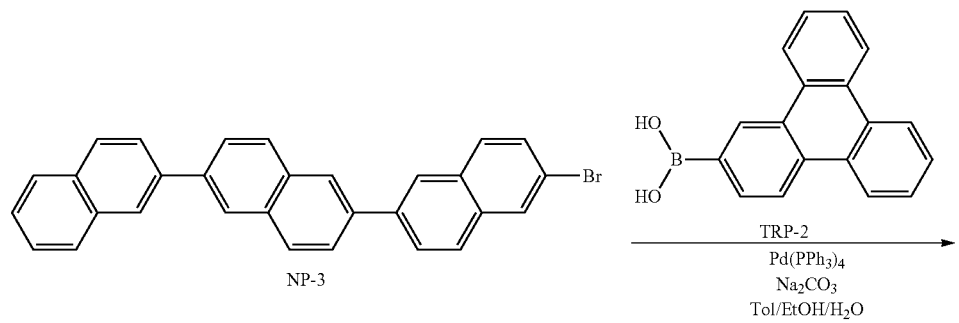

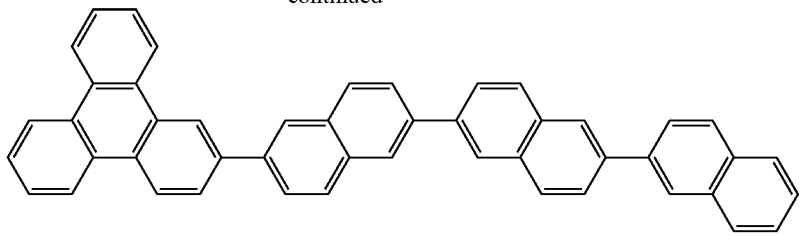

J-105

Example Compound J-105 was prepared as in Example 16, except that Compound NP-3 was used instead of Compound CRY-2 and Compound TRP-2 was used instead of Compound NP-2. The results of identification of Example Compound J-105 are shown below.

MALDI-TOF-MS (matrix assisted laser desorption/ionization-time of flight mass spectrometry) with Autoflex LRF produced by Bruker Corporation
Measured value=606.88
Calculated value=606.23

Example 18

In Example 18, an organic EL device including an anode, a hole-injection layer, a hole-transportation layer, a light-emitting layer, a hole-exciton-blocking layer, an electron-transportation layer, and a cathode, which is described above as the fifth example of a multilayered organic light-emitting device, was prepared. An indium tin oxide (ITO) film having a thickness of 100 nm was deposited on a glass substrate by sputtering and then patterned by photolithography. On the ITO substrate, the following organic layers and electrode layers were sequentially formed by vacuum deposition by resistive heating in a vacuum chamber at $10^{-5}$ Pa. The areas of electrodes facing each other were set to 3 mm². Subsequently, the resulting organic light-emitting device was sealed with a glass cap having a hygroscopic material in an inert atmosphere.

Hole-injection layer (50 nm): Compound HT-1
Hole-transportation layer (10 nm): Compound HT-8
Light-emitting layer (30 nm) Host: Compound H-103, Guest: Example Compound
KK-31 (4 wt %)
Exciton-blocking layer (10 nm): Compound ET-4
Electron-transportation layer (50 nm): Compound ET-2
Metal electrode layer 1 (0.5 nm): LiF
Metal electrode layer 2 (100 nm): Al The characteristics of the prepared EL device were determined as follows. The current-voltage characteristics were determined using an ammeter "2700" produced by Keithley Instruments Inc. The emission brightness was determined using BM7-Fast produced by TOPCON CORPORATION.

Example 19

An organic EL device was prepared as in Example 18, except that the host material and the light-emitting material of the light-emitting layer were changed to Compound B-105 and Example Compound KK-03, respectively.

Example 20

An organic EL device was prepared as in Example 18, except that the host material and the light-emitting material of the light-emitting layer were changed to Compound D-102 and Example Compound KK-02, respectively.

Example 21

An organic EL device was prepared as in Example 18, except that the host material and the light-emitting material of the light-emitting layer were changed to Compound F-101 and Example Compound KK-04, respectively.

Example 22

An organic EL device was prepared as in Example 18, except that the host material and the light-emitting material of the light-emitting layer were changed to Compound H-102 and Example Compound KK-01, respectively.

Example 23

An organic EL device was prepared as in Example 18, except that the host material of the light-emitting layer was changed to Compound J-105.

Example 24

An organic EL device was prepared as in Example 18, except that the host material of the light-emitting layer was changed to Compound K-104.

Example 25

An organic EL device was prepared as in Example 18, except that the host material and the light-emitting material of the light-emitting layer were changed to Compound L-104 and Example Compound KK-30, respectively.

Example 26

An organic EL device was prepared as in Example 18, except that the host material of the light-emitting layer was changed to Compound L-105.

Example 27

An organic EL device was prepared as in Example 18, except that the light-emitting material of the light-emitting layer was changed to Example Compound KK-35.

Example 28

An organic EL device was prepared as in Example 18, except that the light-emitting material of the light-emitting layer was changed to Example Compound KK-28 and the light-emitting layer further included Compound M-103 (20 wt %) as a third component. The weight fraction of the third component is calculated by dividing the weight of the third component by the total weight of the host material, the light-emitting material, and the third component.

Example 29

An organic EL device was prepared as in Example 18, except that the host material and the light-emitting material of the light-emitting layer were changed to Compound L-104 and Example Compound KK-30, respectively, and the light-emitting layer further included Compound M-105 (20 wt %) as a third component. The weight fraction of the third component is calculated by dividing the weight of the third component by the total weight of the host material, the light-emitting material, and the third component.

Example 30

An organic EL device was prepared as in Example 18, except that the host material and the light-emitting material of the light-emitting layer were changed to Compound L-104 and Example Compound KK-36, respectively, and the light-emitting layer further included Compound N-105 (20 wt %) as a third component. The weight fraction of the third component is calculated by dividing the weight of the third component by the total weight of the host material, the light-emitting material, and the third component.

Example 31

An organic EL device was prepared as in Example 18, except that the host material of the light-emitting layer was changed to Compound L-105 and the light-emitting layer further included Compound 0-101 (20 wt %) as a third component. The weight fraction of the third component is calculated by dividing the weight of the third component by the total weight of the host material, the light-emitting material, and the third component.

Comparative Example 5

An organic EL device was prepared as in Example 19, except that the host material of the light-emitting layer was changed to 2,2':6',2":6",2'''-quaternaphthalene (NP4).

Table 4 shows the luminous efficiencies of the organic EL devices prepared in Examples 18 to 31 and Comparative Example 5 when 10 mA/cm² was applied and the brightness half-times of the organic EL devices when 100 mA/cm² was applied.

TABLE 4

| | Host material | Light-emitting material | Third component | Luminous efficiency (cd/A) | Brightness half-time (h) |
|---|---|---|---|---|---|
| Example 18 | H-103 | KK-31 | | 26 | 300 |
| Example 19 | B-105 | KK-03 | | 22 | 350 |
| Example 20 | D-102 | KK-02 | | 21 | 350 |
| Example 21 | F-101 | KK-04 | | 29 | 250 |

TABLE 4-continued

| | Host material | Light-emitting material | Third component | Luminous efficiency (cd/A) | Brightness half-time (h) |
|---|---|---|---|---|---|
| Example 22 | H-102 | KK-01 | | 32 | 200 |
| Example 23 | J-105 | KK-31 | | 21 | 700 |
| Example 24 | K-104 | KK-31 | | 23 | 400 |
| Example 25 | L-104 | KK-30 | | 22 | 750 |
| Example 26 | L-105 | KK-31 | | 25 | 450 |
| Example 27 | H-103 | KK-35 | | 27 | 300 |
| Example 28 | H-103 | KK-28 | M-103 | 32 | 350 |
| Example 29 | L-104 | KK-30 | M-105 | 28 | 750 |
| Example 30 | L-104 | KK-36 | N-105 | 26 | 400 |
| Example 31 | L-105 | KK-31 | O-101 | 27 | 800 |
| Comparative Example 5 | NP4 | KK-03 | | 19 | 60 |

In Examples 18 to 27, the luminous efficiency and the brightness half-time of the organic EL device were increased compared with those observed in Comparative Example 5. This is presumably because the host material according to the present invention is composed of a hydrocarbon only and has a nonlinear molecular structure.

In Examples 28 to 31, the luminous efficiency and the brightness half-time of the organic EL device were further increased since the organic EL device included the third material in addition to the host material and the light-emitting material. This is presumably because formation of the radical state of the light-emitting material having a naphtho[2,1-f]isoquinoline skeleton was avoided.

Example 32

In Example 32, a top-emission-type organic EL device was prepared.

An Al film was deposited on a transparent substrate that was a glass substrate by sputtering. Then, an 80-nm indium zinc oxide (IZO) film serving as a transparent electrode was deposited on the substrate by sputtering. Subsequently, a pixel-separation film was patterned. Thus, a substrate including electrodes having an area of 3 mm² was prepared. On the IZO substrate, the following organic layers were deposited by vacuum deposition by resistive heating in a vacuum chamber at $10^{-5}$ Pa. A transparent electrode layer was deposited by sputtering.

The prepared organic light-emitting device was sealed with a glass cap having a hygroscopic material in an inert atmosphere.

Hole-injection layer (50 nm): Compound HT-1
Hole-transportation layer (10 nm): Compound HT-8
Light-emitting layer (30 nm) Host: Compound L-105, Guest: Example Compound KK-31 (5 wt %), Third component: Compound M-103 (20 wt %)

The weight fraction of the third component is calculated by dividing the weight of the third component by the total weight of the host material, the light-emitting material, and the third component.

Exciton-blocking layer (10 nm): Compound ET-3
Electron-injection layer (50 nm): Codeposition of Compound ET-2 and cesium carbonate (3 wt %)
Transparent electrode layer (30 nm): IZO
The luminous efficiency of the prepared organic EL device determined as in Example 1 was 41 cd/A.

As described above, the organic compound according to the present invention may be used as a host material suitable for a light-emitting material having a high efficiency. When such a host material is used for producing an organic light-emitting device, an organic light-emitting device having good luminescence properties may be produced.

As describes with reference to embodiments and Examples, according to the present invention, a novel iridium complex that has an emission wavelength suitable for an organic light-emitting device and a high luminous efficiency and that is easy to handle may be produced. Furthermore, an organic light-emitting device including the novel iridium complex which has a high efficiency and improved drive durability may also be produced.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2013-009524, filed Jan. 22, 2013, which is hereby incorporated by reference herein in its entirety.

The invention claimed is:

1. An organic light-emitting device comprising an anode, a cathode, and a light-emitting layer interposed between the anode and the cathode, the light-emitting layer including a guest molecule and a host molecule, wherein the guest molecule is an iridium complex represented by Formula [1], $$IrL_mL'_n \qquad [1]$$

where Ir represents iridium; L and L' each represent a different bidentate ligand, at least one of L and L' including an alkyl group; m is 2; and n is 1, wherein $IrL_m$ is represented by Formula [2],

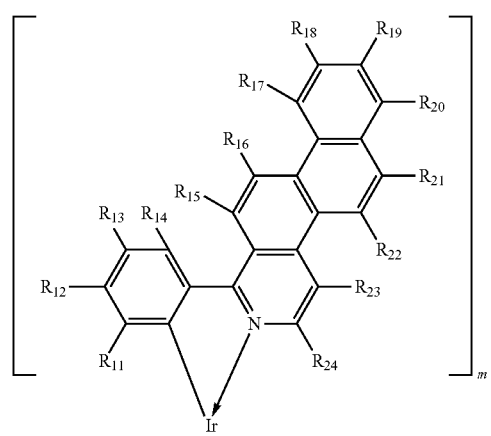

[2]

where $R_{11}$ to $R_{14}$ are each independently selected from a hydrogen atom, a fluorine atom, a substituted or unsubstituted alkyl group, an alkoxy group, a substituted amino group, a substituted or unsubstituted aryl group, and a substituted or unsubstituted heterocyclic group; and $R_{15}$ to $R_{24}$ are each independently selected from a hydrogen atom, a fluorine atom, a substituted or unsubstituted alkyl group, an alkoxy group, and a substituted amino group, wherein $L'_n$ is a monovalent bidentate ligand, wherein the host molecule is a hydrocarbon constituted by only one or more carbon atoms and one or more hydrogen atoms, wherein the hydrocarbon is represented by Formula [7], $$Ar7\text{-}(Ar8)_p\text{-}(Ar9)_q\text{-}Ar10 \qquad [7]$$

where p and q are each independently 0 or 1; p+q is greater than or equal to 1 and is less than or equal to 2;

Ar10 is represented by any one of the following structural formulae

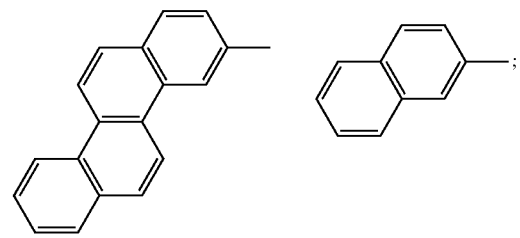

Ar8 and Ar9 are each independently represented by any one of the following structural formulae

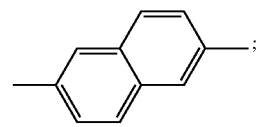

and

Ar7 is represented by any one of the following structural formulae

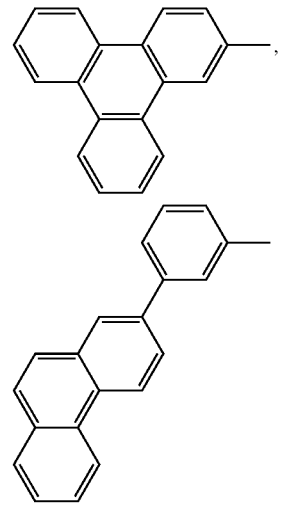

-continued

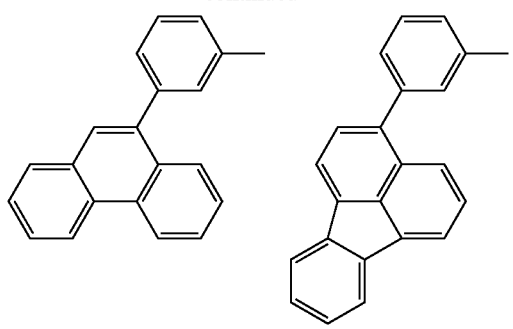

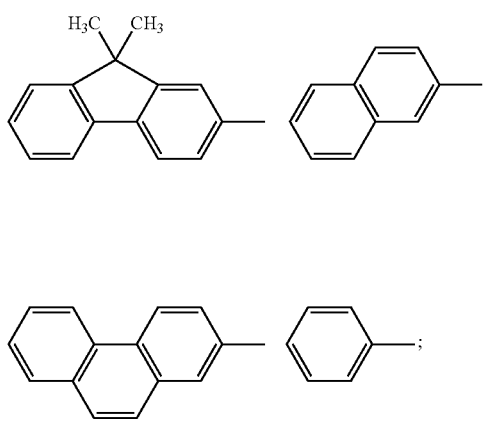

wherein Ar7 and Ar10 are different from each other.

2. The organic light-emitting device according to claim 1, wherein IrL'$_n$ is represented by any one of Formulae [3] to [5],

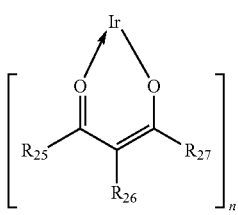

[3]

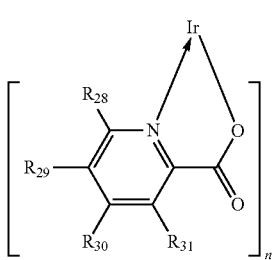

[4]

-continued

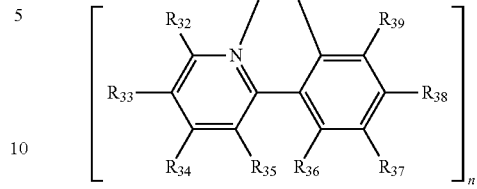

[5]

where $R_{25}$ to $R_{39}$ are each independently selected from a hydrogen atom, an alkyl group, an alkoxy group, a substituted amino group, a substituted or unsubstituted aryl group, and a substituted or unsubstituted heterocyclic group.

3. The organic light-emitting device according to claim 2, wherein:

in Formula [2], $R_{11}$ to $R_{24}$ are each independently selected from a hydrogen atom, a fluorine atom, and an alkyl group having a carbon number of 1 to 10; and in Formulae [3] to [5], $R_{25}$ to $R_{39}$ are each independently selected from a hydrogen atom and an alkyl group having a carbon number of 1 to 10, at least one of $R_{11}$ to $R_{39}$ being an alkyl group having a carbon number of 1 to 10.

4. The organic light-emitting device according to claim 3, wherein:

in Formula [2], $R_{11}$ to $R_{24}$ are each independently selected from a hydrogen atom, a methyl group, and a tertiary butyl group; and in Formulae [3] to [5], $R_{25}$ to $R_{39}$ are each independently selected from a hydrogen atom, a methyl group, and a tertiary butyl group, at least one of $R_{11}$ to $R_{39}$ being a methyl group or a tertiary butyl group.

5. The organic light-emitting device according to claim 4, wherein IrL'$_n$ is represented by Formula [3].

6. The organic light-emitting device according to claim 1, wherein all carbon-carbon bonds of the hydrocarbon represented by Formula [7] are formed by sp$^2$ hybridized orbitals.

7. The organic light-emitting device according to claim 1, wherein the light-emitting layer further includes another organic compound.

8. The organic light-emitting device according to claim 7, wherein a HOMO level of the other organic compound is higher than a HOMO level of the hydrocarbon.

9. The organic light-emitting device according to claim 7, wherein a LUMO level of the other organic compound is higher than a LUMO level of the hydrocarbon.

10. A display apparatus comprising a plurality of pixels, the plurality of pixels each including:

the organic light-emitting device according to claim 1; and an active device connected to the organic light-emitting device.

11. The display apparatus according to claim 10, wherein the active device includes an electrode including a transparent oxide semiconductor.

12. The display apparatus according to claim 10 including a color filter.

13. An electrophotographic image-forming apparatus comprising an exposure light source that emits light to form a latent image on a photosensitive drum,
the exposure light source including a plurality of light-emitting portions arranged in one direction,
the plurality of light-emitting portions each including the organic light-emitting device according to claim 1 and an active device connected to the organic light-emitting device.

14. An organic light-emitting device comprising an anode, a cathode, and a light-emitting layer interposed between the anode and the cathode, the light-emitting layer including a guest molecule and a host molecule,
wherein the guest molecule is an iridium complex represented by Formula [1],

  [1]

where Ir represents iridium; L and L' each represent a different bidentate ligand, at least one of L and L' including an alkyl group; m is 2; and n is 1, wherein $IrL_m$ is represented by Formula [2],

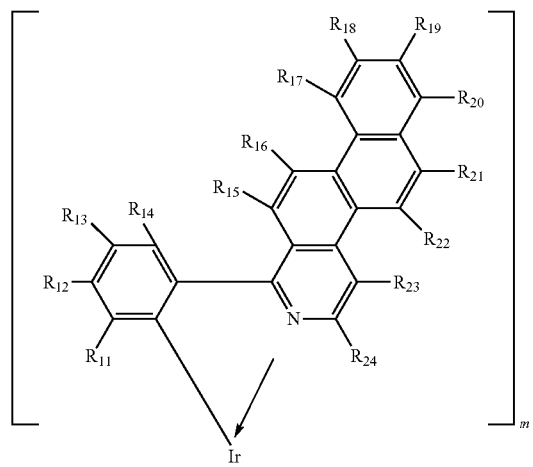

where $R_{11}$ to $R_{14}$ are each independently selected from a hydrogen atom, a fluorine atom, a substituted or unsubstituted alkyl group, an alkoxy group, a substituted amino group, a substituted or unsubstituted aryl group, and a substituted or unsubstituted heterocyclic group; and $R_{15}$ to $R_{24}$ are each independently selected from a hydrogen atom, a fluorine atom, a substituted or unsubstituted alkyl group, an alkoxy group, and a substituted amino group,
wherein $L'_n$ is a monovalent bidentate ligand,
wherein the host molecule is selected from the following structure

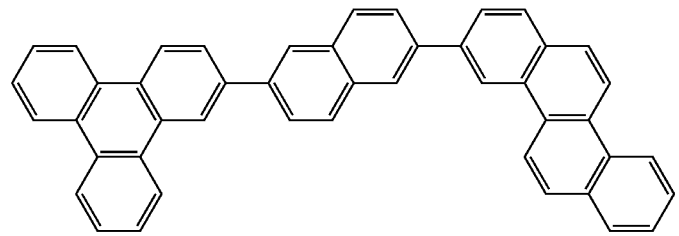

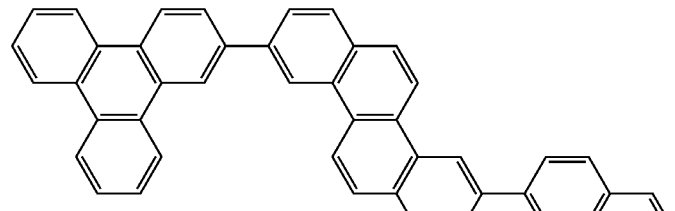

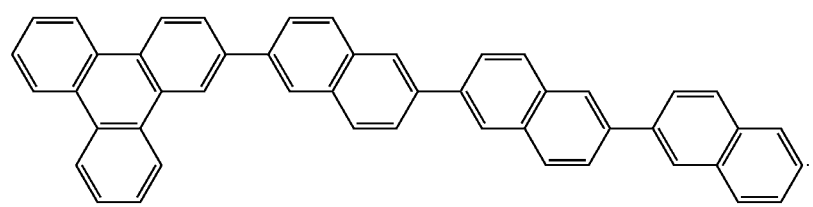

* * * * *